(12) United States Patent
Tamai et al.

(10) Patent No.: US 6,605,936 B1
(45) Date of Patent: Aug. 12, 2003

(54) CURRENT DETECTING APPARATUS AND CURRENT DETECTING METHOD

(75) Inventors: Yasuhiro Tamai, Shizuoka-ken (JP); Yoshinori Ikuta, Shizuoka-ken (JP); Takashi Gohara, Shizuoka-ken (JP); Mitsuaki Morimoto, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 398 days.

(21) Appl. No.: 09/662,896

(22) Filed: Sep. 15, 2000

(30) Foreign Application Priority Data

Sep. 17, 1999 (JP) .......................................... 11-264552

(51) Int. Cl.[7] .............................................. G01R 19/00
(52) U.S. Cl. ................................................ 324/117 R
(58) Field of Search ........................ 324/117 R, 117 H, 324/76.78, 207.2, 244, 247; 340/664

(56) References Cited

U.S. PATENT DOCUMENTS 4,539,520 A * 9/1985 McBride ................. 324/117 H

FOREIGN PATENT DOCUMENTS

JP 63-63974 3/1988 ........... G01R/15/02

OTHER PUBLICATIONS

Donald G. Fink, Editor–in–Chief, Standard Handbook for Electrical Engineers, 10th Edition, McGraw–Hill Book Company, 1969, p. 2–48.*
Sutton Designs, Inc., Three Phase, www.suttondesigns.com, original date unknown.*

* cited by examiner

*Primary Examiner*—N. Le
*Assistant Examiner*—John Teresinski
(74) *Attorney, Agent, or Firm*—Finnegan, Henderson, Farabow, Garrett & Dunner, L.L.P.

(57) ABSTRACT

This invention provides a current detecting apparatus including three conductors disposed radially from a branch point such that they are branched, three hall devices disposed between conductors adjacent of the three conductors, and an operation processing circuit for detecting a current flowing through each of the three conductors based on an operation output obtained by a predetermined operation based on electric signals from the respective hall devices.

18 Claims, 19 Drawing Sheets

FIG. 6

WITHOUT DISTURBANCE

| NO. | SETTING CURRENT | | MEASURING CURRENT | | HALL DEVICE OUTPUT | | | | | | $3*I_1$ $=S_2-S_3$ | | $3*I_2$ $=S_1-S_2$ | | $3*I_3$ $=S_1-S_3$ | |
|---|---|---|---|---|---|---|---|---|---|---|---|---|---|---|---|---|
| | LOAD1 (A) | LOAD2 (A) | (mV) | $I_3$ (A) | $S_1$ (mV) | | $S_2$ (mV) | | $S_3$ (mV) | | (mV) | (A) | (mV) | (A) | (mV) | (A) |
| 1 | 0 | 0 | −0.02 | −0.20 | 2,463 | 0 | 2,468 | 0 | 2,467 | 0 | 0 | 0 | 0 | 0 | 0 | 0 |
| 2 | 10 | 10 | 1.98 | 19.8 | 2,447 | −16 | 2,469 | 1 | 2,486 | 19 | −18 | 11 | −17 | 10 | −35 | 21 |
| 3 | 20 | 20 | 4.00 | 40.00 | 2,430 | −33 | 2,471 | 3 | 2,506 | 39 | −36 | 21 | −36 | 21 | −72 | 42 |
| 4 | 30 | 30 | 6.00 | 60.00 | 2,413 | −50 | 2,471 | 3 | 2,526 | 59 | −56 | 33 | −53 | 31 | −109 | 64 |
| 5 | 30 | 0 | 2.99 | 29.90 | 2,447 | −16 | 2,451 | −17 | 2,504 | 37 | −54 | 32 | 1 | −1 | −53 | 31 |
| 6 | 20 | 10 | 3.00 | 30.00 | 2,441 | −22 | 2,465 | −3 | 2,498 | 31 | −34 | 20 | −19 | 11 | −53 | 31 |
| 7 | 10 | 20 | 3.00 | 30.00 | 2,435 | −28 | 2,476 | 8 | 2,492 | 25 | −17 | 10 | −36 | 21 | −53 | 31 |
| 8 | 0 | 30 | 2.99 | 29.90 | 2,429 | −34 | 2,489 | 21 | 2,486 | 19 | 2 | −1 | −55 | 32 | −53 | 31 |
| 9 | 10 | 5 | 1.50 | 15.00 | 2,452 | −11 | 2,466 | −2 | 2,482 | 15 | −17 | 10 | −9 | 5 | −26 | 15 |
| 10 | 20 | 10 | 3.00 | 30.00 | 2,441 | −22 | 2,463 | −5 | 2,499 | 32 | −37 | 22 | −17 | 10 | −54 | 32 |
| 11 | 30 | 15 | 4.50 | 45.00 | 2,430 | −33 | 2,461 | −7 | 2,515 | 48 | −55 | 32 | −26 | 15 | −81 | 48 |
| 12 | 0 | 0 | −0.01 | −0.10 | 2,463 | 0 | 2,471 | 3 | 2,465 | −2 | 5 | −3 | −3 | 2 | 2 | −1 |

FIG. 7

WITH DISTURBANCE

| NO. | SETTING CURRENT | | MEASURING CURRENT $I_3$ | | HALL DEVICE OUTPUT | | | $3*I_1$ $=S_2-S_3$ | | $3*I_2$ $=S_1-S_2$ | | $3*I_3$ $=S_1-S_3$ | |
|---|---|---|---|---|---|---|---|---|---|---|---|---|---|
| | LOAD1 (A) | LOAD2 (A) | (mV) | (A) | $S_1$ (mV) | $S_2$ (mV) | $S_3$ (mV) | (mV) | (A) | (mV) | (A) | (mV) | (A) |
| 1 | 0 | 0 | -0.01 | -0.10 | 2,455 | 2,460 | 2,455 | 0 | 0 | 0 | 0 | 0 | 0 |
| 2 | 10 | 10 | 2.00 | 20.00 | 2,437 | 2,461 | 2,476 | -18 | 1 | 21 | 12 | -19 | 11 | -39 | 23 |
| 3 | 20 | 20 | 4.00 | 40.00 | 2,420 | 2,461 | 2,495 | -35 | 1 | 40 | 23 | -36 | 21 | -75 | 44 |
| 4 | 30 | 30 | 6.00 | 60.00 | 2,403 | 2,462 | 2,516 | -52 | 2 | 61 | 35 | -54 | 32 | -113 | 67 |
| 5 | 30 | 0 | 2.99 | 29.90 | 2,436 | 2,440 | 2,494 | -19 | -20 | 39 | 35 | 1 | -1 | -58 | 34 |
| 6 | 20 | 10 | 3.00 | 30.00 | 2,434 | 2,456 | 2,491 | -21 | -4 | 36 | 24 | -17 | 10 | -57 | 34 |
| 7 | 10 | 20 | 3.00 | 30.00 | 2,428 | 2,468 | 2,482 | -27 | 8 | 27 | 11 | -35 | 21 | -54 | 32 |
| 8 | 0 | 30 | 2.99 | 29.90 | 2,422 | 2,483 | 2,476 | -33 | 23 | 21 | -1 | -56 | 33 | -54 | 32 |
| 9 | 10 | 5 | 1.50 | 15.00 | 2,445 | 2,459 | 2,472 | -10 | -1 | 17 | 11 | -9 | 5 | -27 | 16 |
| 10 | 20 | 10 | 3.00 | 30.00 | 2,433 | 2,456 | 2,489 | -22 | -4 | 34 | 22 | -18 | 11 | -56 | 33 |
| 11 | 30 | 15 | 4.50 | 45.00 | 2,422 | 2,454 | 2,505 | -33 | -6 | 50 | 33 | -27 | 16 | -83 | 49 |
| 12 | 0 | 0 | -0.01 | -0.10 | 2,456 | 2,460 | 2,475 | 1 | 0 | 2 | 1 | 1 | -1 | -1 | -1 |

I₁ OUTPUT WITHOUT DISTURBANCE

I₁ OUTPUT WITH DISTURBANCE

CURRENT DETECTING APPARATUS AND CURRENT DETECTING METHOD

BACKGROUND OF THE INVENTION

1. Field of the Invention

The present invention relates to a current detecting apparatus for detecting a current flowing through an electric circuit loaded on an apparatus such as automobile and a current detecting method, and more particularly to technology for improving detection accuracy for a current flowing through each branch conductor.

2. Description of The Related Art

Recently, with prevailing of, for example, electric car, hybrid car and the like, the necessity of a current detecting apparatus for, for example, charge/discharge control has been intensified. As such a current detecting apparatus, a current detecting apparatus which is installed in an electric connecting box for distributing currents from a power supply and detecting a current flowing through a conductor incorporated in the electric connecting box using an electromagnetic transducer has been well known. However, the current detecting apparatus using the electromagnetic transducer has such a problem that because a plurality of conductors are incorporated in the electric connecting box, an accurate current detection is impossible due to an interference of magnetic flux generated by a current flowing through other conductor than the conductor in which a detection object current flows.

To solve such a problem, a current detecting apparatus for electric wire has been disclosed in, for example, Japanese Patent Application Laid-Open No. 63-63974. In this current detecting apparatus as shown in FIG. 1, a conductor B in which the detection object current $I_1$ flows is disposed substantially at right angle to other conductor A and further, a magnetic core $1a$ through which the conductor B passes is disposed substantially at the right angle to that conductor B. With this structure, magnetic fields $H_2$ and $H_3$ generated by current $I_2$ flowing through other conductor A are canceled in a magnetic core $1a$ and only a magnetic field $H_1$ generated by a current $I_1$ flowing through a conductor B passes through the magnetic core $1a$. Thus, the electromagnetic transducer $1b$ placed in a gap of the magnetic core $1a$ does not receive an interference from other conductor B, the current $I_1$ flowing through the conductor B can be detected accurately.

However, because this conventional current detecting apparatus for electric wire employs the magnetic core, there are such problems that its weight and occupied volume cannot be reduced beyond each predetermined level and production cost is high. Particularly, if a plurality of conductors through the detection object current flows are arranged in parallel, the same number of the magnetic cores are necessary, so that the weight and occupied volume increase depending on the number of the conductors and further the production cost is increased.

On the other hand, for example, in automotive current connecting box, not only a plurality of conductors are arranged in parallel in some case, but also a conductor is branched to a plurality of conductors in the electric connecting box, so that it comes that those plural conductors are disposed in parallel in other case.

SUMMARY OF THE INVENTION

An object of the present invention is to provide a current detecting apparatus capable of detecting a current flowing through each conductor even if a plurality of the conductors are disposed together, by positively using a condition including branch conductors provided in an electric connecting box, the current detecting apparatus being capable of being reduced in its size and weight at a low cost. Another object of the present invention is to provide a current detecting method capable of detecting a current flowing through each conductor at a high sensitivity even if a plurality of the conductors are disposed together.

To achieve the above object, according to a first aspect of the present invention, there is provided a current detecting apparatus comprising: n (n: integer satisfying $n \geq 3$) conductors disposed so as to be branched radially from a branch point; m (m: integer satisfying $m \geq 2$) electromagnetic transducers disposed between adjacent conductors of the n conductors; and an operation processing circuit for detecting a current flowing through each of the n conductors based on an operating output obtained from a predetermined operation based on an electric signal from each of the m electromagnetic transducers.

According to the first aspect of the present invention, the electromagnetic transducers are disposed on both sides of each of the n conductors. A current flowing through each conductor is detected by carrying out a predetermined operation on an electric signal from the two electromagnetic transducers. In this case, each of the two electromagnetic transducers receives a magnetic flux produced by a difference between a current before branching and a current after branching. Thus, even if the current which is a detection object is constant, the magnetic flux is converted electromagnetically. As a result, a current flowing through each conductor can be detected with a high sensitivity even if it is small.

Because no magnetism collecting core is used in the first aspect (in principal, it is not necessary to use the magnetism collecting core), the size, weight and production cost of the current detecting apparatus can be reduced. Particularly, this effect is remarkable in detecting a current in each branch route.

According to a second aspect of the invention, there is provided a current detecting apparatus according to the first aspect wherein the n conductors are disposed on a flat plane including the branch point and the m electromagnetic transducers are disposed such that a magnetism sensitive surface of each thereof exists on the flat plane.

According to the second aspect, because n conductors and m electromagnetic transducers are disposed on the same plane, magnetic flux generated by current flow through each conductor enters a magnetism sensitive surface of each electromagnetic transducer. As a result, in the operation processing circuit, an electric signal from each electromagnetic transducer does not have to be corrected, so that operation on the operation processing circuit is simplified.

According to the third aspect, there is provided a current detecting apparatus according to the second aspect wherein the n is "3" while the three conductors are disposed every 120° from the branch point on the flat plane in three directions; the m is "3" while the three electromagnetic transducers are disposed at the same distance from adjacent conductors and at the same distance from the branch point; and the operation processing circuit detects a current flowing through the conductor by obtaining a difference of electric signal between the two electromagnetic transducers sandwiching each conductor.

According to the third aspect, a current flowing through each conductor is detected by obtaining a difference of electric signal from two electromagnetic transducers sandwiching the conductor. In this case, one electromagnetic transducer receives a magnetic flux in a predetermined direction generated by a current before branching and a current after branching, while the other electromagnetic transducer receives a magnetic flux in an opposite direction generated by the current before branching and the current after the branching. Thus, even if the detecting object current is constant, it comes that a magnetic flux three times a magnetic flux generated by a current if there is no branch is converted electromagnetically. As a result, even if the current flowing through each conductor is small, it can be detected at a high sensitivity.

Further, even if there is a disturbing magnetic flux near this current detecting apparatus, it is canceled by obtaining a difference of electric signal from the two electromagnetic transducers. As a result, even if other conductors are provided together, an influence from them is not received. Thus, a current flowing through each conductor can be detected at a high sensitivity. Further, currents flowing through three conductors can be detected at a high sensitivity using three electromagnetic transducers. Therefore, this current detecting apparatus can be produced at a lower cost as compared to a current detecting apparatus for detecting a current flowing through a conductor with two electromagnetic transducers.

According to a fourth aspect of the present invention, there is provided a current detecting apparatus according to the second aspect where the n is "3" while the three conductors are disposed in three directions from the branch point on the flat plane such that an angle between the first conductor and the second conductor is 90°, an angle between the second conductor and the third conductor is 90° and an angle between the third conductor and the first conductor is 180°; the m is "4" while the first electromagnetic transducer is disposed at the same distance from the first conductor and the second conductor and at the same distance from the branch point, the second electromagnetic transducer is disposed at the same distance from the second conductor and the third conductor and at the same distance from the branch point, the third electromagnetic transducer is disposed symmetrically with the second electromagnetic transducer with respect to the third conductor and at the same distance from the branch point, and the fourth electromagnetic transducer is disposed symmetrically with the first electromagnetic transducer with respect to the first conductor and at the same distance from the branch point; the operation processing circuit detects a current flowing through the conductor by obtaining a difference of electric signal between the four electromagnetic transducers sandwiching each conductor.

According to this fourth aspect, a current flowing through each conductor is detected by obtaining a difference of electric signal from the electromagnetic transducers which sandwich each conductor. In this case, a current flowing through each of the first conductor, second conductor and third conductor can be detected at a high sensitivity.

Further, because the disturbing magnetic flux existing near the current detecting apparatus can be canceled, the current flowing through each conductor can be detected at a high accuracy. Further, because currents flowing three conductors can be detected at a high sensitivity using only four electromagnetic transducers, this current detecting apparatus can be produced at a lower cost than a current detecting apparatus for detecting a current flowing through a conductor using two electromagnetic transducers.

According to a fifth aspect of the present invention, there is provided a current detecting apparatus according to the second aspect wherein the n is "4" while the four conductors are disposed every 90° from the branch point on the flat plane in four direction; the m is "4" while the four electromagnetic transducers are disposed at the same distance from adjacent two conductors and at the same distance from the branch point; and the operation processing circuit detects a current flowing through the conductor by obtaining a difference of electric signal among the four electromagnetic transducers sandwiching each conductor.

According to the fifth aspect of the present invention, a current flowing through each conductor can be detected at a high sensitivity by obtaining a difference of electric signal from four electromagnetic transducers which sandwich each conductor.

Because the disturbing magnetic flux existing near the current detecting apparatus is canceled, a current flowing through each conductor can be detected at a high accuracy. Further, because currents flowing through the four conductors can be detected at a high sensitivity using only four electromagnetic transducers, the current detecting apparatus can be produced at a lower cost than a current detecting apparatus for detecting a current flowing through a conductor using two electromagnetic transducers.

According to a sixth aspect of the present invention, there is provided a current detecting apparatus according to the first aspect wherein the n conductors are disposed on three-dimensional axes perpendicular to each other with the branch point as a home position and the m electromagnetic transducers are disposed such that magnetism sensitive surfaces thereof exist on a flat plane including two axes of the three axes.

According to this sixth aspect, the n conductors are disposed the three-dimensional axes perpendicular to each other with the branch point as a home position and m electromagnetic transducers are disposed such that the magnetism sensitive surfaces thereof exist on the same plane including two axes of the three axes. Thus, the magnetic flux generated by current flow into each conductor existing on the same plane enters the magnetism sensitive surface of each electromagnetic transducer vertically. As a result, an electric signal from each electromagnetic transducer becomes accurate in the operation processing circuit, so that operation in the operation processing circuit is simplified.

According to a seventh aspect of the present invention, there is provided a current detecting apparatus according to the sixth aspect wherein the n is "3" while the three conductors are disposed in three directions of the three axes; the m is "3" while the first electromagnetic transducer is disposed at the same distance from the first conductor and the second conductor existing on the flat plane and at the same distance from the branch point, the second electromagnetic transducer is disposed symmetrically with the first electromagnetic transducer with respect to the second conductor and at the same distance from the branch point and the third electromagnetic transducer is disposed symmetrically with the first electromagnetic transducer with respect to the first conductor and at the same distance from the branch point; and the operation processing circuit detects a current flowing through each conductor of the first-third conductor by obtaining a difference of electric signal between three electromagnetic transducers sandwiching each of the first conductor and the second conductor existing on the flat plane.

According to the seventh aspect, a current flowing through the first-third conductors is detected by obtaining a difference of electric signal from the three electromagnetic transducers which sandwich each conductor of the first conductor and the second conductor existing on the flat plane.

Further, even if the disturbing magnetic flux exists near this current detecting apparatus, it is canceled by obtaining a difference of electric signal from the three electromagnetic transducers. As a result, even if other conductors are provided together, an influence therefrom is not received. Thus, a current flowing through each conductor can be detected. Further, currents flowing through the three conductors can be detected at a high sensitivity using only three electromagnetic transducers. Thus, this current detecting apparatus can be produced at a lower cost than a current detecting apparatus for detecting a current flowing through a conductor using two electromagnetic transducers.

According to an eighth aspect of the present invention, there is provided a current detecting apparatus according to the sixth aspect wherein the n is "4" while the four conductors are disposed on the three axes and a negative direction axis of one of the three axes; the m is "4" while the first-fourth electromagnetic transducers are disposed on a flat plane including two axes of the three axes and the negative direction axes; the first electromagnetic transducer and the second electromagnetic transducer are disposed at the same distance from the first conductor which is one of the first-third conductors existing on the flat plane and at the same distance from the branch point, the third electromagnetic transducer is disposed symmetrically with the second electromagnetic transducer with respect to the second conductor and at the same distance from the branch point, and the fourth electromagnetic transducer is disposed symmetrically with the third electromagnetic transducer with respect to the third conductor and at the same distance from the branch point; and the operation processing circuit detects a current flowing through each conductor of the first-fourth conductors by obtaining a difference of electric signal between the four electromagnetic transducers sandwiching each conductor of the first-third conductors existing on the flat plane.

According to the eighth aspect, a current flowing through each of the first-fourth conductors is detected by obtaining a difference of electric signal from the four electromagnetic transducers which sandwich each conductor of the first-third conductors existing on the flat plane.

Further, the disturbing magnetic flux existing near this current detecting apparatus is canceled in the same way as the seventh aspect. Thus, a current flowing through each conductor can be detected. Further, currents flowing through the four conductors can be detected at a high sensitivity using only four electromagnetic transducers. Thus, this current detecting apparatus can be produced at a lower cost than a current detecting apparatus for detecting a current flowing through a conductor using two electromagnetic transducers.

According to a ninth aspect of the present invention, there is provided a current detecting apparatus according to the third-eighth aspect wherein the m electromagnetic transducers are disposed such that the magnetism sensitive surfaces thereof are directed in the same direction.

According to this ninth aspect, because the m electromagnetic transducers are disposed such that the respective magnetism sensitive surfaces are directed in the same direction, the electric signal from each of the electromagnetic transducer can be handled easily in the operation processing circuit, so that operation in the operation processing circuit is facilitated.

According to a tenth aspect of the present invention, there is provided a current detecting method comprising: disposing n (n: integer satisfying n≧3) conductors so as to be branched radially from a branch point; disposing m (m: integer satisfying m≧2) electromagnetic transducers between adjacent conductors of the n conductors; and detecting a current flowing through each of the n conductors based on an operating output obtained from a predetermined operation based on an electric signal from each of the m electromagnetic transducers. According to the tenth aspect, the same operation and effect as the first aspect are exerted.

According to an eleventh aspect of the present invention, the n conductors are disposed on a flat plane including the branch point and the m electromagnetic transducers are disposed such that a magnetism sensitive surface of each thereof exists on the flat plane. According to the eleventh aspect, the same operation and effect as the second aspect are exerted.

According to a twelfth aspect of the present invention, there is provided a current detecting method comprising: while the n is "3", disposing the three conductors every 120° from the branch point on the flat plane in three directions; while the m is "3", disposing the three electromagnetic transducers at the same distance from adjacent conductors and at the same distance from the branch point; and detecting a current flowing through the conductor by obtaining a difference of electric signal between the two electromagnetic transducers sandwiching each conductor. According to the twelfth aspect, the same operation and effect as the third aspect are exerted.

According to a thirteenth aspect of the present invention, there is provided a current detecting method according to the eleventh aspect comprising: while the n is "3", disposing the three conductors in three directions from the branch point on the flat plane such that an angle between the first conductor and the second conductor is 90°, an angle between the second conductor and the third conductor is 90° and an angle between the third conductor and the first conductor is 180°; while the m is "4", disposing the first electromagnetic transducer at the same distance from the first conductor and the second conductor and at the same distance from the branch point, disposing the second electromagnetic transducer at the same distance from the second conductor and the third conductor and at the same distance from the branch point, disposing the third electromagnetic transducer symmetrically with the second electromagnetic transducer with respect to the third conductor and at the same distance from the branch point, and disposing the fourth electromagnetic transducer symmetrically with the first electromagnetic transducer with respect to the first conductor and at the same distance from the branch point; and detecting a current flowing through the conductor by obtaining a difference of electric signal between the four electromagnetic transducers sandwiching each conductor. According to this thirteenth aspect, the same operation and effect as the fourth aspect are exerted.

According to a fourteenth aspect of the present invention, there is provided a current detecting method according to the eleventh aspect wherein the n is "4" while the four conductors are disposed every 90° from the branch point on the flat plane in four direction; the m is "4" while the four electromagnetic transducers are disposed at the same distance from adjacent two conductors and at the same distance from the branch point; and a current flowing through the conductor is detected by obtaining a difference of electric signal among the four electromagnetic transducers sandwiching each conductor. According to the fourteenth aspect, the same operation and effect as the fifth aspect are exerted.

According to a fifteenth aspect of the present invention, there is provided a current detecting method wherein the n conductors are disposed on three-dimensional axes perpendicular to each other with the branch point as a home position and the m electromagnetic transducers are disposed such that magnetism sensitive surfaces thereof exist on a flat plane including two axes of the three axes. According to this fifteenth aspect, the same operation and effect as the sixth aspect are exerted.

According to a sixteenth aspect of the present invention, there is provided a current detecting method wherein the n is "3" while the three conductors are disposed in three directions of the three axes; the m is "3" while the first electromagnetic transducer is disposed at the same distance from the first conductor and the second conductor existing on the flat plane and at the same distance from the branch point, the second electromagnetic transducer is disposed symmetrically with the first electromagnetic transducer with respect to the second conductor and at the same distance from the branch point and the third electromagnetic transducer is disposed symmetrically with the first electromagnetic transducer with respect to the first conductor and at the same distance from the branch point; and a current flowing through each conductor of the first-third conductor is detected by obtaining a difference of electric signal between three electromagnetic transducers sandwiching each of the first conductor and the second conductor existing on the flat plane. According to this sixteenth aspect, the same operation and effect as the seventh aspect are exerted.

According to a seventeenth aspect of the present invention, there is provided a current detecting method wherein the n is "4" while the four conductors are disposed on the three axes and a negative direction axis of one of the three axes; the m is "4" while the first-fourth electromagnetic transducers are disposed on a flat plane including two axes of the three axes and the negative direction axes; the first electromagnetic transducer and the second electromagnetic transducer are disposed at the same distance from the first conductor which is one of the first-third conductors existing on the flat plane and at the same distance from the branch point, the third electromagnetic transducer is disposed symmetrically with the second electromagnetic transducer with respect to the second conductor and at the same distance from the branch point, and the fourth electromagnetic transducer is disposed symmetrically with the third electromagnetic transducer with respect to the third conductor and at the same distance from the branch point; and a current flowing through each conductor of the first-fourth conductors is detected by obtaining a difference of electric signal between the four electromagnetic transducers sandwiching each conductor of the first-third conductors existing on the flat plane. According to the seventeenth aspect, the same operation and effect as the eighth aspect are exerted.

According to an eighteenth aspect of the present invention, there is provided a current detecting method wherein the m electromagnetic transducers are disposed such that the magnetism sensitive surfaces thereof are directed in the same direction.

BRIEF DESCRIPTION OF THE DRAWINGS

FIG. 6 is a diagram showing a measurement result and computation result in a condition that no disturbing magnetic flux exists in the experimental circuit shown in FIG. 5;

FIG. 7 is a diagram showing a measurement result and computation result in a condition that disturbing magnetic flux exists in the experimental circuit shown in FIG. 5;

DESCRIPTION OF THE PREFERRED EMBODIMENTS

Figure 1:
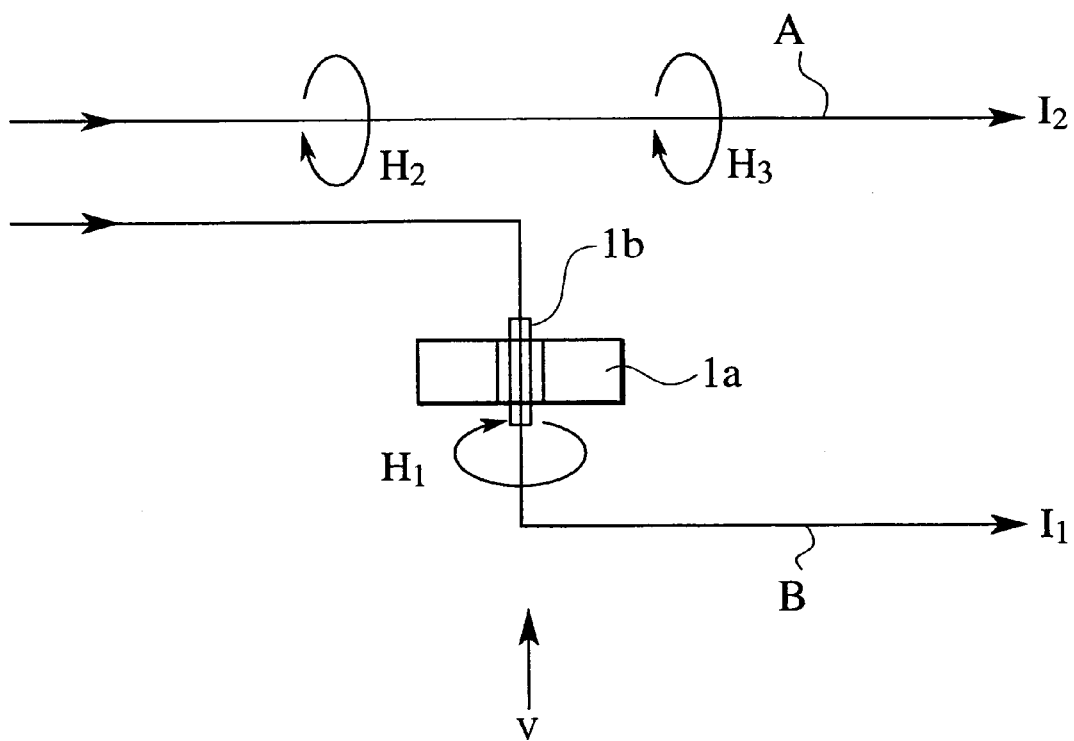
FIG. 1 is a diagram for explaining an example of a conventional current detecting apparatus.

The current detecting apparatus and current detecting method according to an embodiment of the present invention will be described with reference to the accompanying drawings. Like reference numerals are attached to the same components in respective embodiments for description thereof.

First Embodiment

Figure 2:
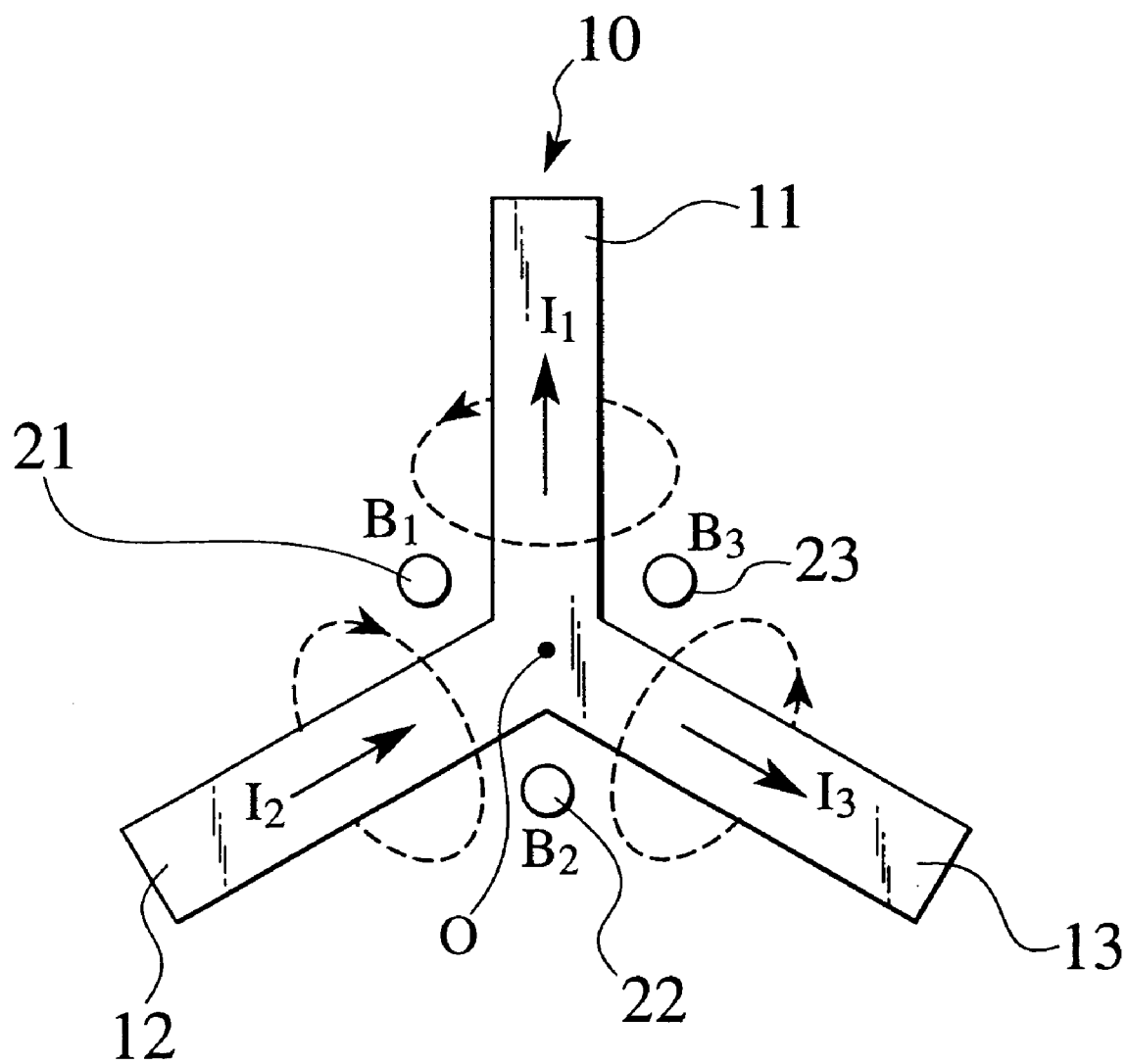
FIG. 2 is a plan view showing a structure of a sensor portion of a current detecting apparatus according to a first embodiment of the present invention.

The first embodiment is an example in which n of the present invention is "3" and m is "3". FIG. 2 is a plan view showing a structure of the current detecting apparatus according to the first embodiment of the present invention. This sensor portion is comprised of a conductor 10, a first hall device 21, a second hall device 22 and a third hall device 23. Usually, these components are incorporated in an electric connecting box. In the first embodiment, no magnetism collecting core is used.

The conductor 10 is comprised of the first conductor 11, second conductor 12 and third conductor 13 disposed in three directions from a branch point O every 120° as shown in FIG. 2. The first conductor 11, second conductor 12 and third conductor 13 correspond to n conductors of the present invention. Ends of the respective conductors are connected at the branch point O.

In the meantime, the conductor 10 may be composed by connecting ends of the three separate conductors, namely, the first conductor 11, second conductor 12 and third conductor 13 at the branch point O and instead by forming integrally the first conductor 11, second conductor 12 and third conductor 13. Further, it is also permissible to compose this conductor 10 by forming a wiring pattern having three branch routes including the first conductor 11, second conductor 12 and third conductor 13 on a substrate.

The first hall device 21, second hall device 22 and third hall device 23 correspond to m electromagnetic transducers of the present invention. Each hall device generates a voltage (hall voltage) signal corresponding to a density of magnetic flux entering its magnetism sensitive surface (magnetic flux detecting surface). A predetermined current is supplied to each hall device through a lead (not shown) and the voltage signal generated in each hall device is fetched out through a lead (not shown).

Positions where the respective hall devices are disposed are determined as follows. That is, the first hall device 21 is disposed between the first conductor 11 and the second conductor 12 and at the same distance from these conductors. The second hall device 22 is disposed between the second conductor 12 and the third conductor 13 and at the same distance from these conductors. The third hall device 23 is disposed between the third conductor 13 and the first conductor 11 and at the same distance from these conductors. The respective hall devices are disposed at the same distance from the branch point and near the branch point. The magnetism sensitive surfaces of the respective hall devices substantially coincide with the plane including the branch point O and are disposed such that they are directed in the same direction.

Next, an operation of the sensor portion of the current detecting apparatus according to the first embodiment of the present invention having such a structure will be described.

Assume that the magnetism sensitive surface of each hall device is directed from a paper face toward yourself. Further assume that a current $I_1$ flows from the branch point O to its end in the first conductor 11, a current $I_2$ flows from the end to the branch point O in the second conductor 12 and a third current $I_3$ flows from the branch point O to the end in the third conductor $I_3$. The direction of current flow mentioned here is just an example and it is not limited to the above described one but any direction. Because the respective hall devices are disposed near each other and the magnetism sensitive surfaces of the respective hall devices are directed to the same direction, it is assumed that the respective magnetism sensitive surfaces receive disturbing magnetic flux n equally.

If magnetic flux entering a magnetism sensitive surface of each of hall devices disposed on both sides of a conductor i when a current Ii flows to the conductor i (i=1, 2, 3) is Ii and magnetic flux going out of the magnetism sensitive surface is $f(I_i)$, total magnetic flux $B_1$ received by a magnetism sensitive plane of the first hall device 21 is "$B_1=-f(I_1)-f(I_2)+n$". Total magnetic flux $B_2$ received by the magnetism sensitive surface of the second hall device 22 is "$B_2=f(I_2)+f(I_3)+n$". Total magnetic flux $B_3$ received by the magnetism sensitive surface of the third hall device 23 is "$B_3=-f(I_3)+f(I_1)+n$".

Now, if "$B_2-B_1$" is calculated, it comes that "$B_2-B_1=f(I_2)+f(I_3) +n-\{-f(I_1)-f(I_2)+n\}=f(I_1)+2*f(I_2)+f(I_3)$". Because "$I_1+I_3=I_2$" for the reason of Kirchhoff formula, "$B_2-B_1=3*f(I_2)$" is obtained.

This "$B_2-B_1=3*f(I_2)$" is understood as follows. That is, if a current $I_2$ flows through the second conductor 12, the magnetism sensitive surface of the first hall device 21 and the magnetism sensitive surface of the second hall device 22 receive magnetic flux of the same size and in opposite direction. If branch currents $I_1$ and $I_3$ flow to the first conductor 11 and third conductor 13, the magnetism sensitive surface of the first hall device 21 and the magnetism sensitive surface of the second hall device 22 receive magnetic flux corresponding to the size of each branch current and in opposite direction to each other.

Thus, if subtraction is carried out between magnetic flux received by the magnetism sensing plane of the first hall device 21 and magnetic flux received by the magnetism sensitive surface of the second hall device 22, this is the same as when magnetic flux which is three times a magnetic flux generated when the current $I_2$ flows through the second conductor 12. Further, because the subtraction is carried out, disturbing magnetic flux n received by the magnetism sensitive surface of the first hall device 21 and the disturbing magnetic flux n received by the magnetism sensitive plane of the second hall device 22 kill each other.

Next, if "$B_3-B_1$" is calculated, it comes that "$B_3-B_1=-f(I_3)+f(I_1)+n-\{-f(I_1)-f(I_2)+n\}=2*f(I_1)+f(I_2)-f(I_3)$". Because "$f(I_1)=f(I_2)-f(I_3)$" is established for the reason of Kirchhoff formula, "$B_3-B_1=3*f(I_1)$" is obtained.

Further, if "$B_2-B_3$" is calculated, it comes that "$B_2-B_3=f(I_2)+f(I_3)+n-\{-f(I_3)+f(I_1)+n\}=2*f(I_3)+f(I_2)+f(I_1)$". Because "$f(I_3)=f(I_2)-f(I_1)$" is established for the reason of Kirchhoff formula, "$B_2-B_3=3*f(I_3)$" is obtained.

When the current $I_2$ flowing through the second conductor 12, current $I_1$ flowing through the first conductor 11 and current $I_3$ flowing through the third conductor 12 are detected, each result of computation of "$B_2-B_1$", "$B_3-B_1$" and "$B_2-B_3$" becomes equal to generating of a magnetic flux which is three times a magnetic flux generated when a current flows through each conductor. Further, because the disturbing magnetic flux can be canceled, a current can be detected highly accurately. Further, because all the hall devices are disposed near the branch point O, error factors such as temperature drift are canceled also.

Figure 3:
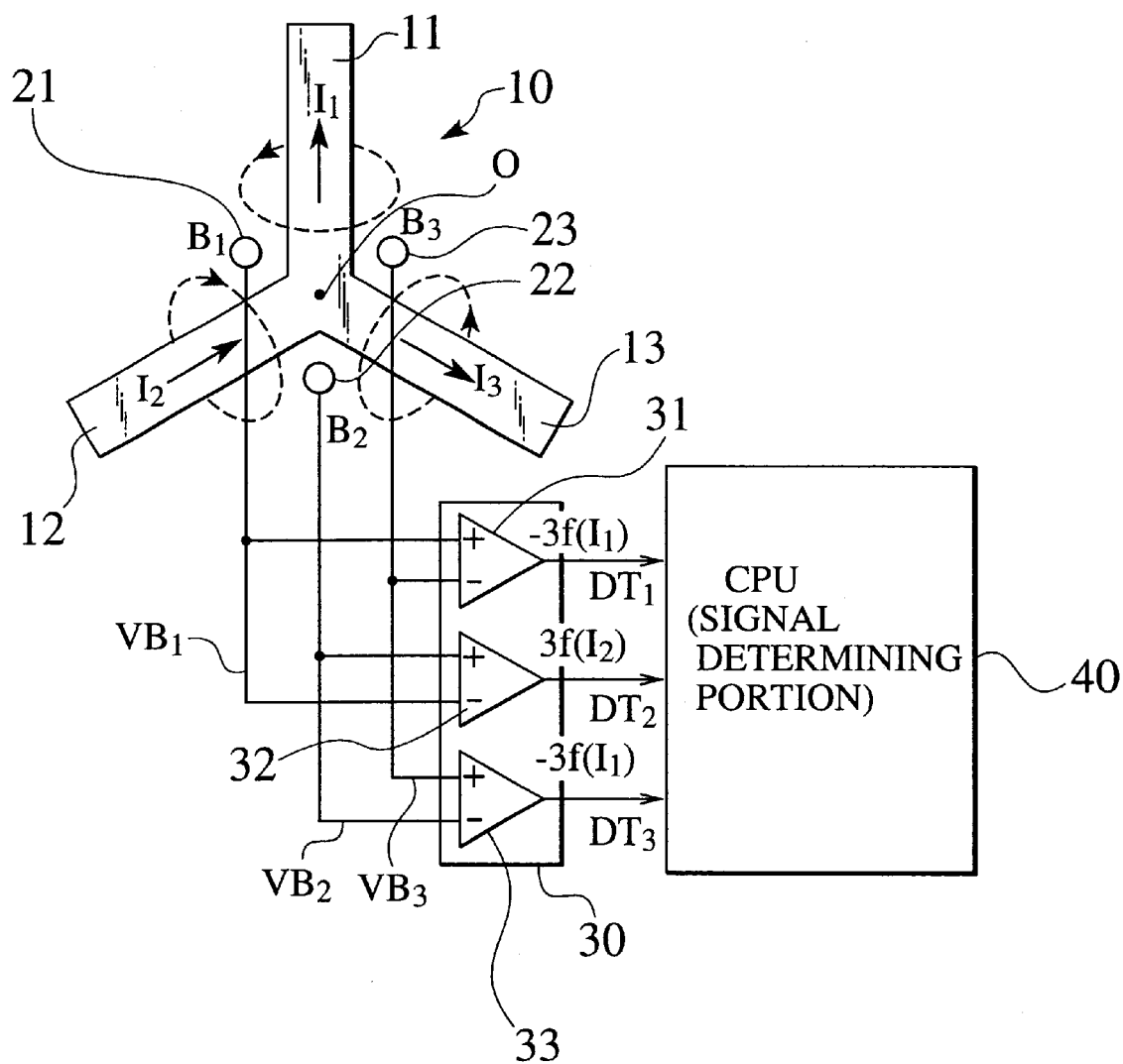
FIG. 3 is a block diagram showing a structure of the current detecting apparatus including a sensor portion shown in FIG. 2.

FIG. 3 is a block diagram showing the structure of the current detecting apparatus containing the above described sensor portion. In this current detecting apparatus, the sensor portion is comprised of the conductor 10, first hall device 21, second hall device 22 and third hall device 23 and further, an operation processing circuit 30 is added thereto. The operation processing circuit 30 is comprised of first operation amplifier 31, second operation amplifier 32 and third operation amplifier 33. An output from the operation processing circuit 30 is supplied to, for example, a central processing unit (hereinafter referred to as CPU40).

The first operation amplifier 31 carries out operation equivalent to "$-(B_3-B_1)$". A noninverting input terminal (+) of this first operation amplifier 31 is connected to the first hall device 21 and a noninverting input terminal (−) is connected to the third hall device 23 and an output terminal is connected to the CPU 40. Thus, the first operation amplifier 31 subtracts a voltage signal $VB_3$ corresponding to the magnetic flux $B_3$ from a voltage signal $VB_1$ corresponding to the magnetic flux $B_1$ and supplies that result of subtraction to the CPU 40 as a first detection signal $DT_1$ indicating the magnitude of the current $I_1$. Because this first detection signal $DT_1$ is similar to a signal obtained by electromagnetically converting a magnetic flux $3*f(I_1)$ which is three times a magnetic flux $f(I_1)$ generated by only the current $I_1$, the current $I_1$ flowing through the first conductor 11 can be detected at a high sensitivity. In an example shown in FIG. 3, the first detection signal $DT_1$ is obtained as a negative value.

The second operation amplifier 32 carries out operation corresponding to "$B_2-B_1$". The noninverting input terminal (+) of this second operation amplifier 32 is connected to the second hall device 22, the noninverting input terminal (−) is connected to the first hall device 21 and the an output terminal is connected to the CPU 40. Therefore, the second operation amplifier 32 subtracts the voltage signal $VB_1$ corresponding to the magnetic flux $B_1$ from the voltage signal $VB_2$ corresponding to the magnetic flux $B_2$. The subtraction result is supplied to the CPU 40 as the second detection signal $DT_2$ indicating the magnitude of the current $I_2$. Because this second detection signal $DT_2$ is similar to a signal obtained by electromagnetically converting a magnetic flux $3*f(I_2)$ which is three times a magnetic flux $f(I_2)$ generated by only the current $I_2$, the current $I_2$ flowing through the second conductor 12 can be detected at a high sensitivity. Meanwhile, in an example shown in FIG. 3, the second detection signal $DT_2$ is obtained as a positive value.

The third operation amplifier 33 carries out operation corresponding to "$B_2-B_3$". An noninverting input terminal (+) of this third operation amplifier 33 is connected to the third hall device 32, a noninverting input terminal (−) is connected to the second hall device 22 and an output terminal is connected to the CPU 40. Therefore, the third operation amplifier 33 subtracts a voltage signal $VB_3$ corresponding to the magnetic flux $B_3$ from a voltage signal $VB_2$ corresponding to the magnetic flux $B_2$. Its subtraction result is supplied to the CPU 40 as the third detection signal $DT_3$ indicating the magnitude of the current $I_3$. Because this third detection signal $DT_3$ is similar to a signal obtained by electromagnetically converting a magnetic flux $3*f(I_3)$ which is three times a magnetic flux $f(I_3)$ generated by only the current $I_3$, the current $I_3$ flowing through the third conductor 13 can be detected at a high sensitivity. Meanwhile, in an example shown in FIG. 3, the third detection signal $DT_3$ is obtained as a positive value.

The CPU 40 receives the first detection signal $DT_1$ from the first operation amplifier 31, the second detection signal $DT_2$ from the second operation amplifier 32 and the third detection signal $DT_3$ from the third operation amplifier 33, and determines the magnitudes of currents flowing through the first conductor 11, second conductor 12 and third conductor 13 and if necessary, drives a current circuit breaker or the like.

Next, an example of a structure of an electric circuit when the above described current detecting apparatus is applied to automobile will be described with reference to FIG. 4. This electric circuit is composed of the above described current detecting apparatus (sensor portion and operation processing circuit 30), control circuit 40, generator 41, battery 42 stator 43 and load 44. Then, the first conductor 11 of the current detecting apparatus is connected to the battery 42, the second conductor 12 is connected to the generator 41 and the third conductor 13 is connected to the load 44. A stator 43 controls conduction/shut-down between the battery 42 and the first conductor 11.

The control circuit 40 is comprised of the CPU 40 as indicated in FIG. 3. This control circuit 40 judges a current condition of the electric circuit according to the first detection signal $DT_1$, second detection signal $DT_2$ and third detection signal $DT_3$ from the operation processing circuit 30 and drives the generator 41 as required.

The generator 41 generates power corresponding to a control signal from the control circuit 40. A current generated by this generator 41 is supplied to the battery 42 and load 44 through the second conductor 12. The battery 42 supplies a discharging current to the load 44 so as to drive the load 44 and at the same time, is supplied with a charging current from the generator 41 so that it is charged. The load 44 comprises, for example, head lamp, wiper and the like.

By evaluating the first detection signal $DT_1$, second detection signal $DT_2$ and third detection signal $DT_3$ from the operation processing circuit 30 totally, the electric circuit of automobile having such a structure is capable of instructing an optimal power generation amount to the generator 41 corresponding to an operation condition of the load 44 and a charging condition of the battery 42.

Next, to verify that the operation principle of the current detecting apparatus having such a structure is right and investigate a detection characteristic thereof, the inventor of the present invention carried out the following experiment. That result is shown below.

Figure 5:
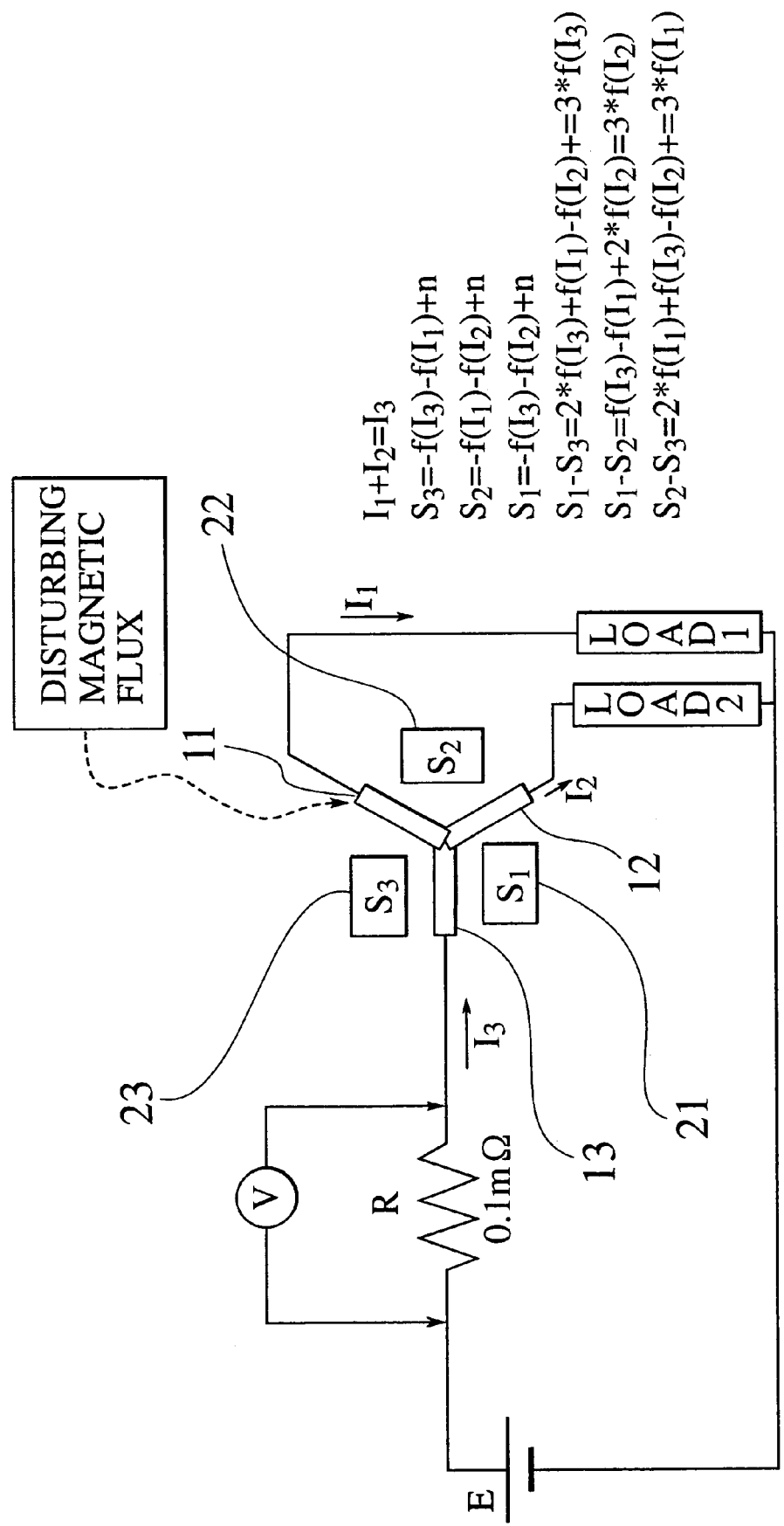
FIG. 5 is a diagram showing a structure of an experimental circuit used in experiment for verifying an operation principle and detecting characteristic of the current detecting apparatus according to the first embodiment of the present invention.

FIG. 5 shows a circuit used for this experiment. In this experimental circuit, a current from the power supply E is inputted to the third conductor 13 of the sensor portion through a resistor R. Then, the current $I_3$ inputted to this third conductor 13 is divided to the current $I_1$ flowing through the first conductor 11 and the current $I_2$ flowing through the second conductor 12. The current $I_1$ flowing through the first conductor 11 returns to the power supply E through the load LOAD1 and the current $I_2$ flowing through the second conductor 12 returns to the power supply E through the load LOAD2.

As the loads LOAD1 and LOAD2, loads capable of setting a flowing current was used. While changing current flowing through the loads LOAD1 and LOAD2, a current flowing through the third conductor 13 and voltage at that time, and respective output voltages at the first hall device $S_1$, second hall device $S_2$ and third hall device $S_3$ were measured. Then, a difference between an output of the second hall device $S_2$ and output of the third hall device $S_3$, "$S_2$-$S_3$", a difference between an output of the first hall device $S_1$ and output of the second hall device $S_2$, "$S_1$-$S_2$" and a difference between an output of the first hall device $S_1$ and third hall device $S_3$, "$S_1$-$S_3$" are obtained by calculation. Further, a disturbing magnetic field n was generated by bringing a magnet near the sensor portion. The magnetism sensing plane of each hall device upon experiment was inverted with respect to the magnetism sensitive surface of the hall device shown in FIGS. 2, 3.

FIG. 6 shows a result of measurement carried out without the disturbing magnetic flux and a result of computation. FIG. 7 is a diagram showing a result of measurement carried out with the disturbing magnetic flux applied and a result of computation.

Figure 8A:
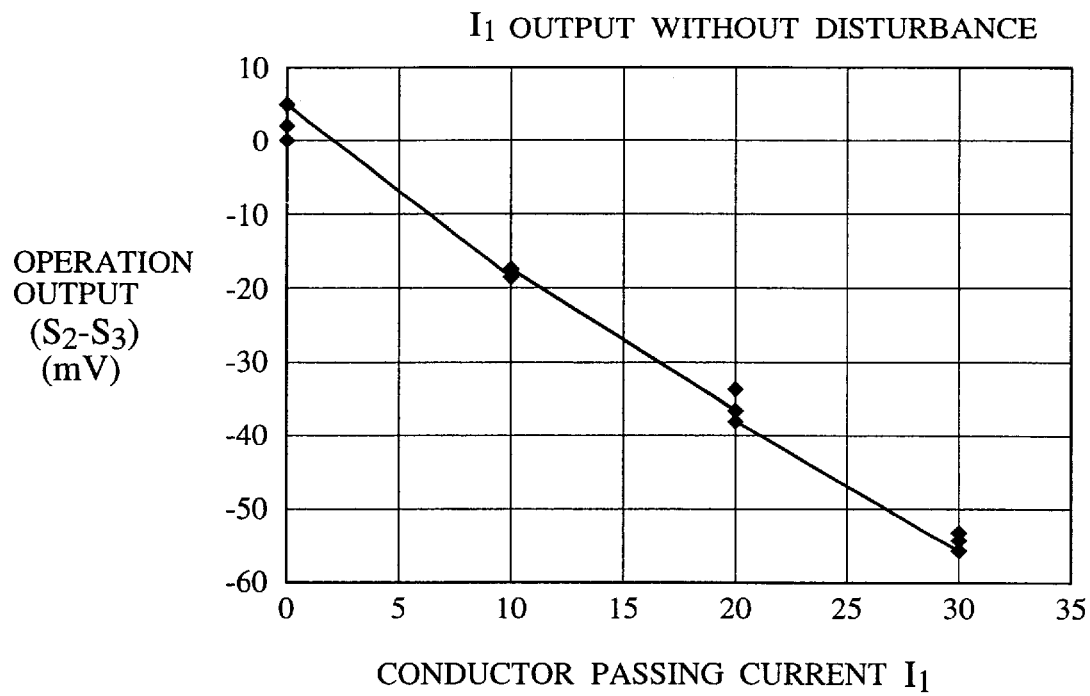
FIG. 8 is a diagram showing a relation between the current $I_1$ flowing through a first conductor obtained by the experimental circuit shown in FIG. 5 and "$S_2-S_3$" obtained by computation.
Figure 8B:
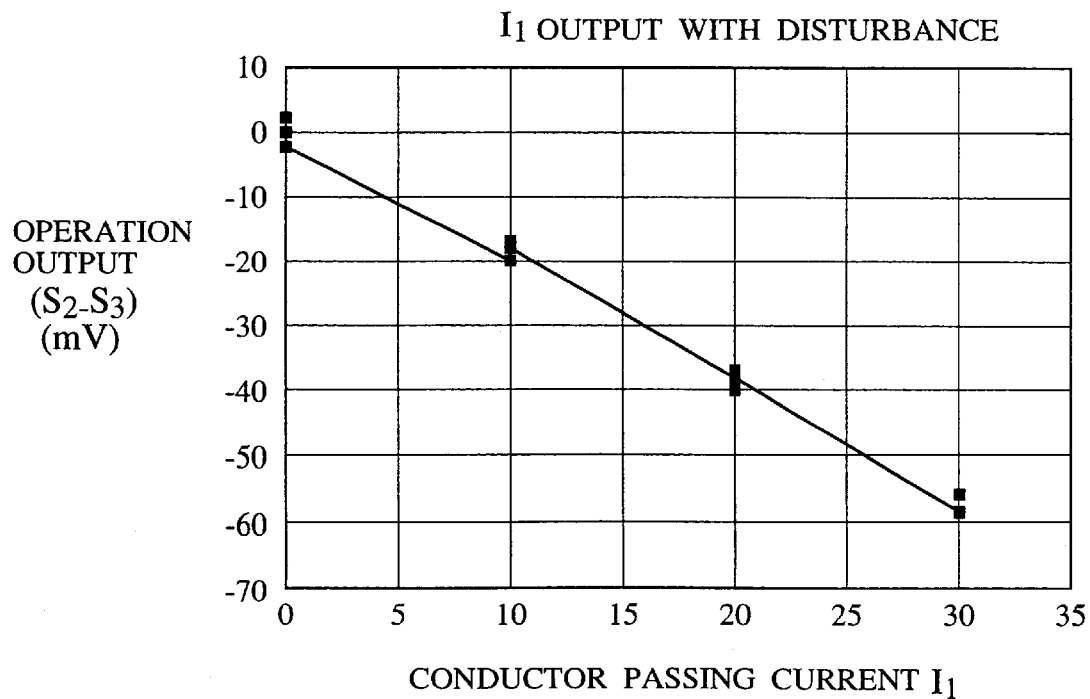
Figure 9A:
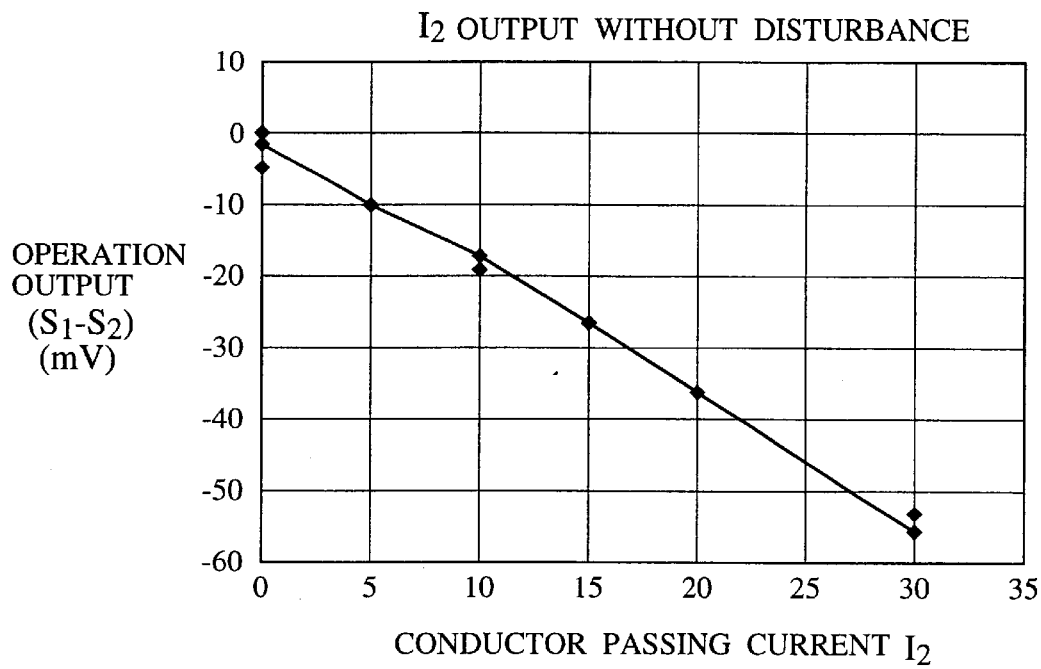
FIG. 9 is a diagram showing a relation between the current $I_2$ flowing through a second conductor obtained by the experimental circuit shown in FIG. 5 and "$S_1-S_2$" obtained by computation.
Figure 9B:
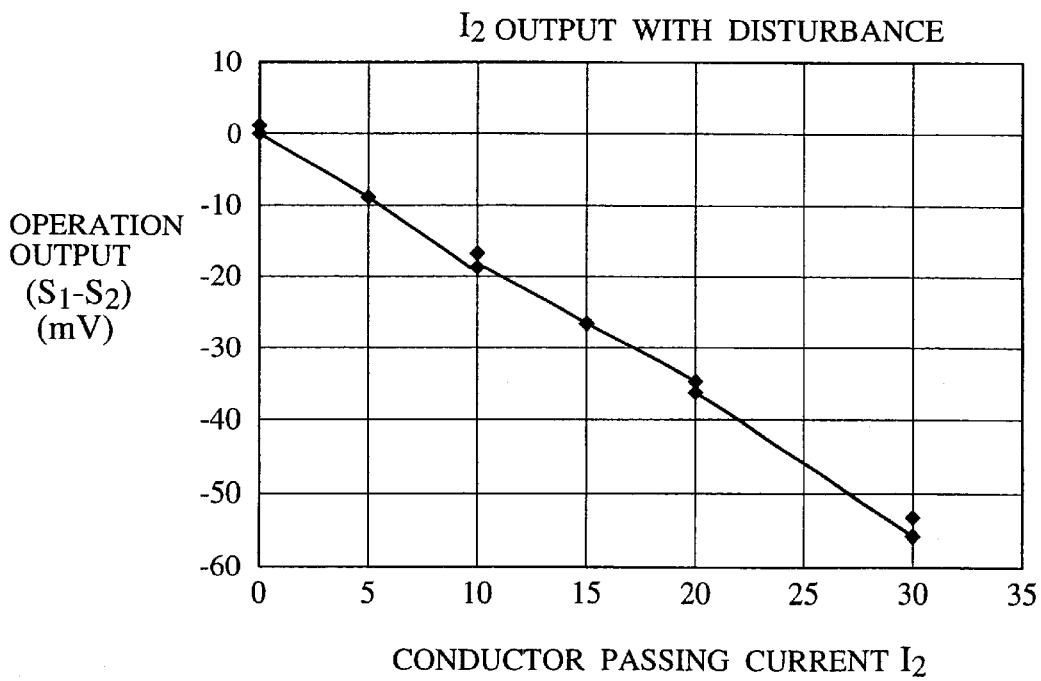
Figure 10A:
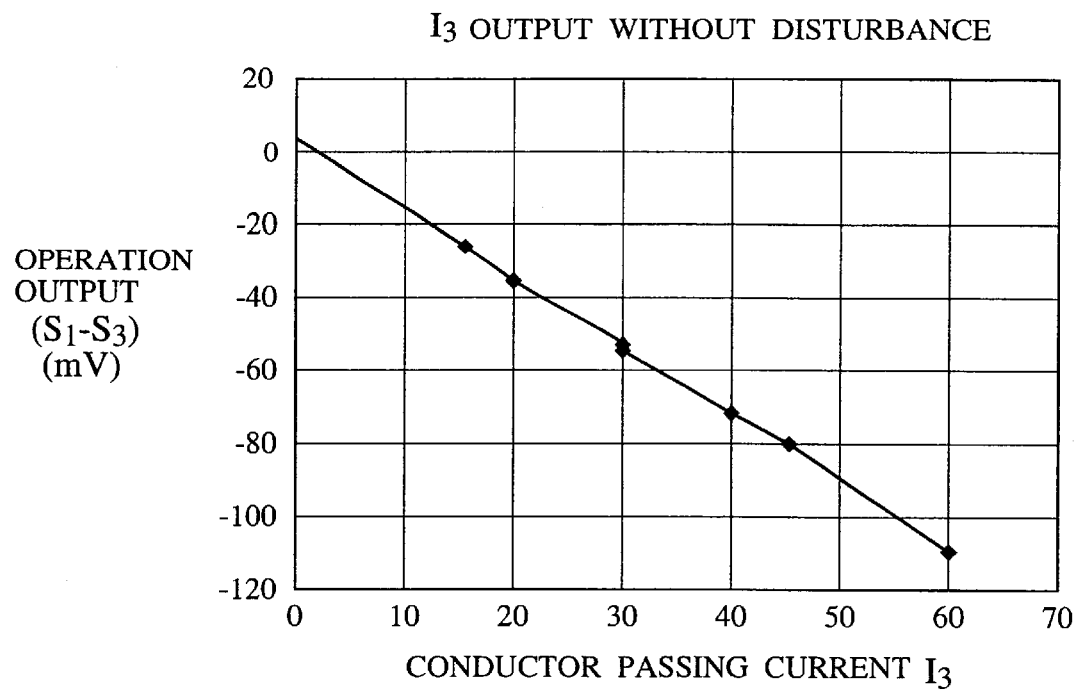
FIG. 10 is a diagram showing a relation between the current $I_3$ flowing through a third conductor obtained by the experimental circuit shown in FIG. 5 and "$S_1-S_3$" obtained by computation.
Figure 10B:
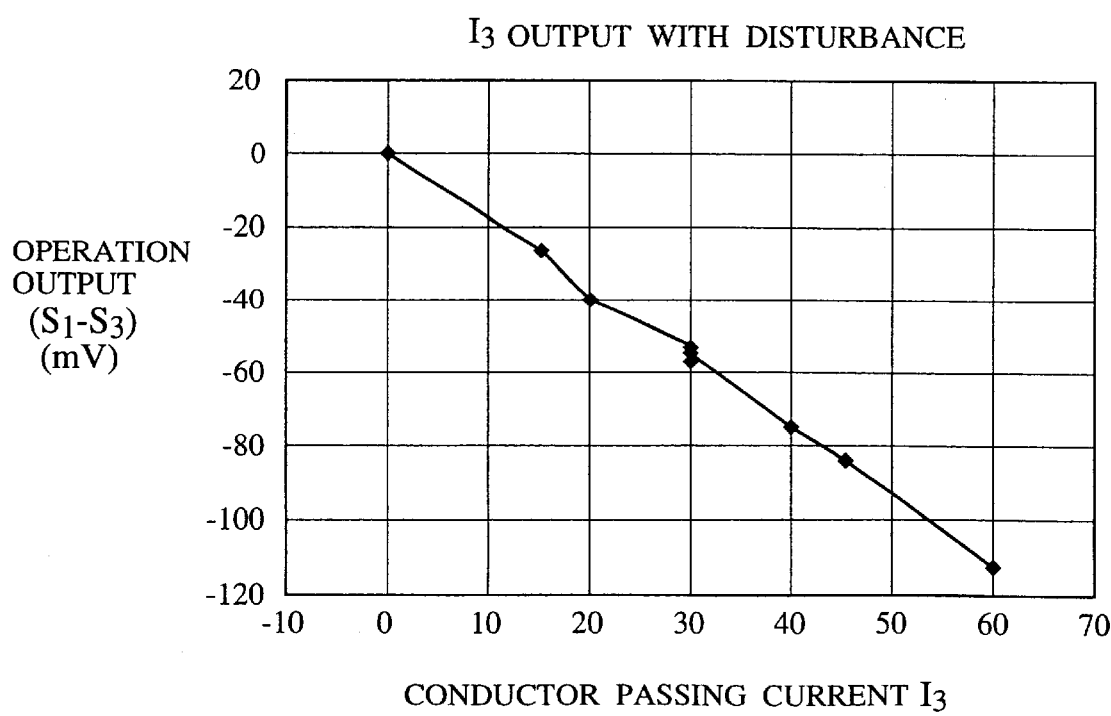

FIG. 8 shows a relation between the current $I_1$ flowing through the first conductor 11 and "$S_2$-$S_3$" obtained by computation. FIG. 8A shows a case where the disturbing magnetic flux n does not exist and FIG. 8B shows a case where the disturbing magnetic flux n exists. FIG. 9 shows a relation between the current $I_2$ flowing through the second conductor 12 and "$S_1$-$S_2$" obtained by computation. FIG. 12A shows a case where the disturbing magnetic flux n does not exist and FIG. 12B indicates a case where the disturbing magnetic flux n exists. FIG. 10 shows a relation between the current $I_3$ flowing through the second conductor 13 and "$S_1$-$S_3$" obtained by computation. FIG. 13A shows a case where the disturbing magnetic flux n does not exist and FIG. 13B indicates a case where the disturbing magnetic flux n exists.

As for an output of each hall device, if referring to FIG. 6, an output signal $S_1$ from the first hall device 21 is 16 mA under current $I_1$(LOAD1)=30 A and current $I_2$(LOAD2)=0 A in case of No. 5 and an output signal S3 form the third hall device 23 is 19 mA under current $I_2$(LOAD2)=30 A and current $I_1$(LOAD1)=0 A in case of No. 8. As a result, when the disturbing magnetic field n does not exist, it is evident that current detection capacity of a hall device when supplied power is not divided is 16–19 mA for every 30 A.

Looking at a result of computation when 30 A flowed as the current $I_1$, computation signal $S_2$-$S_3$ is −56 mA under current $I_1$(LOAD1)=30 A and current $I_2$(LOAD2)=30 A in case of No. 4 and computation signal $S_2$-$S_3$ is −54 mV under current $I_1$(LOAD1)=30 A and current $I_2$(LOAD2)=0 A in case of No. 5 and computation signal $S_2$-$S_3$ is −54 mV under current $I_1$(LOAD1)=30 A and current $I_2$(LOAD2)=15 A in case of No. 11. Consequently, it was confirmed that the computation result was a signal of about three times case of a hall device.

Further, when the disturbing magnetic field n existed, as shown in FIG. 7, substantially the same result as when the disturbing magnetic field did not exist was obtained. As a result, the computation signal does not contain an influence of the disturbing magnetic field n so that the disturbing magnetic field n is canceled.

In case of No. 5, output signal $S_1$ from the first hall device 21 is −19 mV under current $I_1$(LOAD1)=30 A and current $I_1$(LOAD2)=0 A. In case of No. 8, output signal $S_3$ from the third hall device 23 is 21 mV under current $I_2$(LOAD2)=30 A and current $I_1$(LOAD1)=0 A. In case of No. 4, computation signal $S_2$-$S_3$ is −59 mV under current $I_1$(LOAD1)=30 A and current $I_2$(LOAD2)=30 A. In case of No. 5, computation signal $S_2$-$S_3$ is −59 mV under current $I_1$(LOAD1)=30 A and current $I_2$(LOAD2)=0 A. In case of No. 11, computation signal $S_2$-$S_3$ is −56 mV under current $I_1$(LOAD1)=30 A and current $I_2$(LOAD2)=15 A. Consequently, it was confirmed that when the disturbing magnetic field n existed, the computation result was a signal of about three times case of a hall device.

As described above, in the current detecting apparatus according to the first embodiment, using three conductors disposed in Y shape and three hall devices, currents flowing through the respective conductors are detected each by obtaining a difference of voltage between two hall devices which sandwich the conductor. Thus, as a current flowing through each conductor, three times output can be obtained without being affected by the disturbing magnetic field, so that a highly accurate measurement of current is possible.

Figure 4:
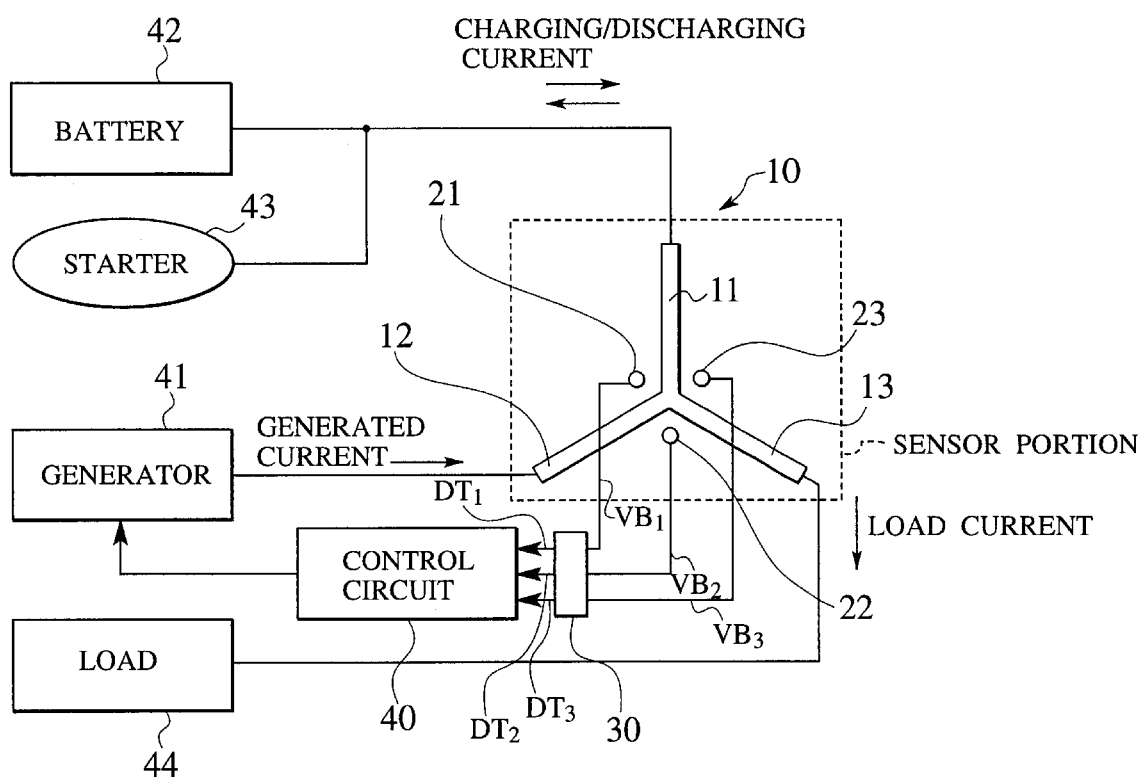
FIG. 4 is a structure diagram of an electric circuit in case where the current detecting apparatus of the first embodiment of the present invention is applied to automobile.

If as shown in FIG. 4, the current detecting apparatus of the first embodiment is applied for a branch point to the battery, generator and load in automobile, this is available for charge/discharge control.

Further, because the current detecting apparatus according to the first embodiment does not use the magnetic core, the weight and occupied volume can be reduced as compared to a case where the magnetic core is attached to each conductor thereby totally three magnetic cores being attached, and further, production cost can be reduced largely. Further, frequency characteristic is improved and there is no magnetic saturation.

Second Embodiment

Figure 11:
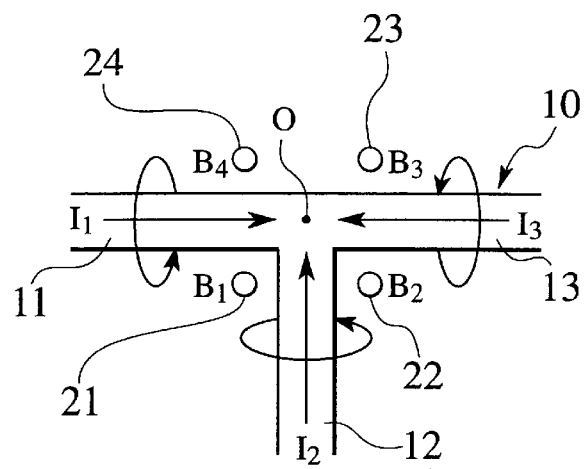
FIG. 11 is a plan view showing a structure of a sensor portion of the current detecting apparatus according to the second embodiment of the present invention.

The second embodiment is an example in which n of the present invention is "3" and m is "4". FIG. 11 is a plan view showing a structure of the current detecting apparatus according to the second embodiment of the present invention. This sensor portion is comprised of a conductor 10, a first hall device 21, a second hall device 22, a third hall device 23 and fourth hall device 24. Usually, these components are incorporated in an electric connecting box. In the second embodiment, no magnetism collecting core is used.

As shown in FIG. 11, the conductor 10 is comprised of a first conductor 11 having an end thereof at the branch point O contained in a flat plane, a second conductor 12 disposed at 90° in counterclockwise direction from the first conductor 11 having an end at the branch point O and a third conductor 13 disposed at 90° in counterclockwise direction from the second conductor 12 having an end at the branch point O. That is, the first conductor 11, second conductor 12 and third conductor 13 are disposed in T shape on the flat plane including the branch point O. The first conductor 11, second conductor 12 and third conductor 13 correspond to n conductors in the present invention. An end of each of these conductors is connected to the branch point O.

In the meantime, the conductor 10 may be composed by connecting ends of the three separate conductors, namely, the first conductor 11, second conductor 12 and third conductor 13 at the branch point O and instead by forming integrally the first conductor 11, second conductor 12 and third conductor 13. Further, it is also permissible to compose this conductor 10 by forming a wiring pattern having three branch routes including the first conductor 11, second conductor 12 and third conductor 13 on a substrate.

A first hall device 21, second hall device 22, third hall device 23 and fourth hall device 24 correspond to m electromagnetic transducers of the present invention. Each hall device generates a voltage (hall voltage) signal corresponding to a density of magnetic flux entering its magnetism sensitive surface. A predetermined current is supplied to each hall device through a lead (not shown) and the voltage signal generated in each hall device is fetched out through a lead (not shown).

Positions where the respective hall devices are disposed are determined as follows. That is, the first hall device 21 is disposed between the first conductor 11 and the second conductor 12 and at the same distance from these conductors. The second hall device 22 is disposed between the second conductor 12 and the third conductor 13 and at the same distance from these conductors. The third hall device 23 is disposed at a position symmetrical to the second hall device 12 with respect to the third conductor 13 as a symmetrical line. The fourth hall device 24 is disposed at a position symmetrical to the first hall device 11 with respect to the first conductor 11 as a symmetrical line. The respective hall devices are disposed at the same distance from the branch point and near the branch point. The magnetism sensitive surfaces of the respective hall devices substantially coincide with the flat plane including the branch point O and are disposed such that they are directed in the same direction.

Next, an operation of the current detecting apparatus according to the second embodiment of the present invention having such a structure will be described.

Assume that the magnetism sensitive surface of each hall device is directed from a paper face toward yourself. Further assume that a current $I_1$ flows from the branch point O to its end in the first conductor 11, a current $I_2$ flows from the end to the branch point O in the second conductor 12 and a third current $I_3$ flows from the branch point O to the end in the third conductor $I_3$. The direction of current flow mentioned here is just an example and it is not limited to the above described one but any direction. Because the respective hall devices are disposed near each other and the magnetism sensitive surfaces of the respective hall devices are directed to the same direction, it is assumed that the respective magnetism sensitive surfaces receive disturbing magnetic flux n equally.

If magnetic flux entering a magnetism sensitive surface of each of hall devices disposed on both sides of a conductor i when a current Ii flows to the conductor i (i=1, 2, 3) is $f(I_i)$ and magnetic flux going out of the magnetism sensitive surface is $f(I_i)$, total magnetic flux $B_1$ received by a magnetism sensitive plane of the first hall device 21 is "$B_1=f(I_1)-f(I_2)+n$". Total magnetic flux $B_2$ received by the magnetism sensitive surface of the second hall device 22 is "$B_2=f(I_2)-f(I_3)+n$. Total magnetic flux received $B_3$ by the magnetism sensitive surface of the third hall device 23 is "$B_3=f(I_3)+n$. Total magnetic flux $B_4$ received by the magnetism sensitive surface of the fourth hall device 24 is "$B_4=-f(I_1)+n$".

Now, if "$B_2-B_1$" is calculated, it comes that "$B_2-B_1=f(I_2)-f(I_3)+n-\{f(I_1)-f(I_2)+n\}=2*f(I_2)-f(I_3)-f(I_1)$". Because "$I_1+I_3=I_2$"for the reason of Kirchhoff formula, "$B_2-B_1=3*f(I_2)$" is obtained.

Next, if "$B_3-B_2$" is calculated, it comes that "$B_3-B_2=f(I_3)+n-\{f(I_2)-f(I_3)+n\}=2*f(I_3)-f(I_2)$". Because "$f(I_1)+f(I_3)=-f(I_2)$" is established for the reason of Kirchhoff formula, "$B_3-B_2=3*f(I_3)+f(I_1)$" is obtained.

Further, if "$B_1-B_4$" is calculated, it comes that "$B_1-B_4=f(I_1)-f(I_2)+n-\{-f(I_1)+n\}=2*f(I_1)-f(I_2)$". Because "$f(I_1)+f(I_3)=-f(I_2)$" is established for the reason of Kirchhoff formula, "$B_1-B_4=3*f(I_1)+f(I_3)$ is obtained.

Next, using the above described computation result, "$3*(B_1-B_4)-(B_3-B_2)$" is calculated, "$3*(B_1-B_4)-(B_3-B_2)=3*\{3*f(I_1)+f(I_3)\}-\{3*f(I_3)+f(I_1)\}=8*f(I_1)$" is obtained.

Further, if "$3*(B_3-B_2)-(B_1-B_4)$" is calculated, "$3*(B_3-B_2)-(B_1-B_4)=3*\{3*f(I_3)+f(I_1)\}-\{3*f(I_1)+f(I_3)\}=8*f(I_3)$" is obtained.

When the current $I_2$ flowing through the second conductor 12, current $I_1$ flowing through the first conductor 11 and current $I_3$ flowing through the third conductor are detected, results of computation of "$B_2-B_1$", "$3*(B_1-B_4)-(B_3-B_2)$" and "$3*(B_3-B_2)-(B_1-B_4)$" becomes equal to generating of a magnetic flux three times, eight times and eight times relative to a magnetic flux generated when a current flows through each conductor. Further, because the disturbing magnetic flux can be canceled, a current can be detected highly accurately. Further, because all the hall devices are disposed near the branch point O, error factors such as temperature drift are canceled also.

Figure 12:
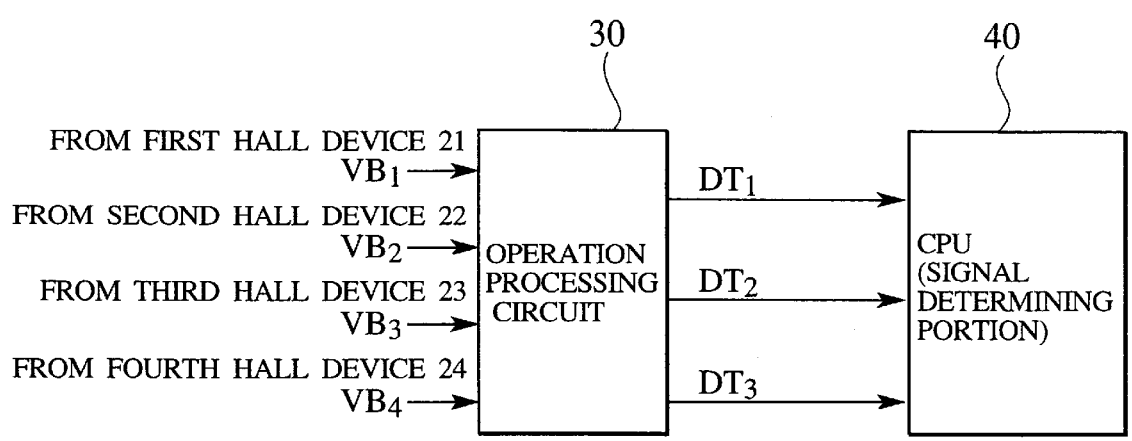
FIG. 12 is a block diagram showing a structure of a computation control circuit in the current detecting apparatus shown in FIG. 11.

FIG. 12 is a block diagram showing a structure of the operation processing circuit 30 of this current detecting apparatus. An output of this operation processing circuit 30 is supplied to the CPU 40, for example.

The operation processing circuit 30 receives inputs of the voltage signal $VB_1$ supplied from the first hall device 21 corresponding to the magnetic flux $B_1$, voltage signal $VB_2$ supplied from the second hall device 22 corresponding to the magnetic flux $B_2$, voltage signal $VB_3$ supplied from the third hall device 23 corresponding to the magnetic flux $B_3$ and voltage signal $VB_4$ supplied from the fourth hall device 24 corresponding to the magnetic flux $B_4$.

This operation processing circuit 30 is comprised of, for example, a plurality of operation amplifiers. Then, these operation amplifiers carry out computation similar to "$3*(B_1-B_4)-(B_3-B_2)$" and supply its computation result to the CPU 40 as a first detection signal $DT_1$ indicating the magnitude of the current $I_1$. Because this first detection signal $DT_1$ is similar to a signal obtained by electromagnetically converting a magnetic flux $8*f(I_1)$ eight times relative to a magnetic flux $f(I_1)$ generated by only the current $I_1$ the current $I_1$ flowing through the first conductor 11 can be detected.

An operation amplifier contained in the operation processing circuit 30 carries out computation corresponding to "$B_2-B_1$" and supplies its computation result to the CPU 40 as the second detection signal $DT_2$ indicating the magnitude of the current $I_2$. Because this second detection signal $DT_2$ is similar to a signal obtained by electrogmagnetically converting a magnetic flux $3*f(I_2)$ which is three times a magnetic flux $f(I_2)$ generated by only the current $I_2$, the current $I_2$ flowing through the second conductor 12 can be detected at a high sensitivity.

Further, the operation amplifier contained in the operation processing circuit 30 carries out computation corresponding to "$3*(B_3-B_2)-(B_1-B_4)$" and supplies its computation result to the CPU 40 as the third detection signal $DT_3$ indicating the magnitude of the current $I_3$. Because this third detection signal $DT_3$ corresponds to a signal obtained by electromagnetically converting a magnetic flux $8*f(I_3)$ which is eight times a magnetic flux $f(I_3)$ generated by only the current $I_3$, the current $I_3$ flowing through the third conductor 13 can be detected at a high sensitivity.

The CPU 40 receives the first detection signal $DT_1$, the second detection signal $DT_2$ and the third detection signal $DT_3$ from the operation processing circuit 30, and determines the magnitudes of currents flowing through the first conductor 11, second conductor 12 and third conductor 13 and if necessary, drives a current circuit breaker or the like.

As described above, in the current detecting apparatus according to the second embodiment, using three conductors disposed in T shape and four hall devices, currents flowing through the respective conductors are detected each by obtaining a difference of voltage between two hall devices which sandwich the conductor. Thus, as a current flowing through each conductor, eight times, three times and eight times outputs can be obtained without being affected by the disturbing magnetic field, so that a highly accurate, high sensitivity measurement of current is possible.

Further, because the current detecting apparatus according to the second embodiment does not use the magnetic core, the weight and occupied volume can be reduced as compared to a case where the magnetic core is attached to each conductor thereby totally three magnetic cores being attached, and further, production cost can be reduced largely. Further, frequency characteristic is improved and there is no magnetic saturation.

Third Embodiment

Figure 13:
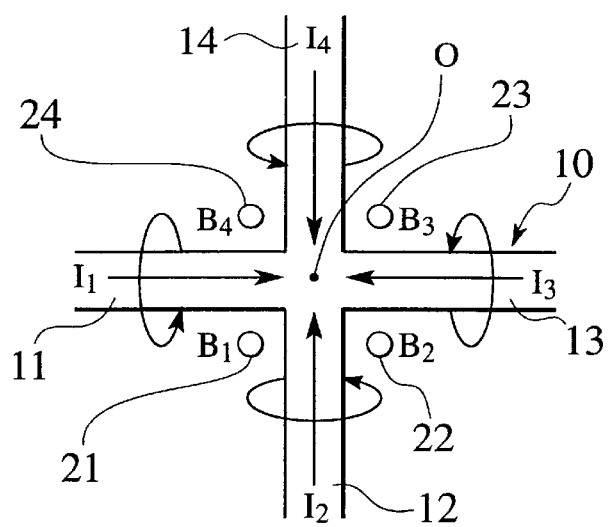
FIG. 13 is a plan view showing a structure of the sensor portion of the current detecting apparatus according to a third embodiment of the present invention.

The third embodiment is an example in which n of the present invention is "4" and m is "4". FIG. 13 is a plan view showing a structure of a sensor portion of the current detecting apparatus according to the third embodiment of the present invention. This sensor portion is comprised of a conductor 10, a first hall device 21, a second hall device 22, a third hall device 23 and a fourth hall device 24. Usually, these components are incorporated in an electric connecting box. In the third embodiment, no magnetism collecting core is used.

The conductor 10 is comprised of the first conductor 11, second conductor 12, third conductor 13 and fourth conductor 14 disposed in four directions from a branch point O on a flat plane containing the branch point O, as shown in FIG. 13. That is, the first conductor 11, second conductor 12, third conductor 13 and fourth conductor 14 are disposed in cross shape on the flat plane including the branch point O. The first conductor 11, second conductor 12, third conductor 13 and fourth conductor 14 correspond to n conductors of the present invention. Ends of the respective conductors are connected at the branch point O.

In the meantime, the conductor 10 may be composed by connecting ends of the four separate conductors, namely, the first conductor 11, second conductor 12, third conductor 13 and fourth conductor 14 at the branch point O and instead by forming integrally the first conductor 11, second conductor 12, third conductor 13 and fourth conductor 14. Further, it is also permissible to compose this conductor 10 by forming a wiring pattern having four branch routes including the first conductor 11, second conductor 12, third conductor 13 and fourth conductor 14 on a substrate.

A first hall device 21, second hall device 22, third hall device 23 and fourth hall device 24 correspond to m electromagnetic transducers of the present invention. Each hall device generates a voltage (hall voltage) signal corresponding to a density of magnetic flux entering its magnetism sensitive surface. A predetermined current is supplied to each hall device through a lead (not shown) and the voltage signal generated in each hall device is fetched out through a lead (not shown).

Positions where the respective hall devices are disposed are determined as follows. That is, the first hall device 21 is disposed between the first conductor 11 and the second conductor 12 and at the same distance from these conductors. The second hall device 22 is disposed between the second conductor 12 and the third conductor 13 and at the same distance from these conductors. The third hall device 23 is disposed between the third conductor 13 and the fourth conductor 14 and at the same distance from these conductors. The fourth hall device 24 is disposed between the fourth conductor 14 and the first conductor 11 and at the same distance from these conductors. The respective hall devices are disposed at the same distance from the branch point and near the branch point. The magnetism sensitive surfaces of the respective hall devices substantially coincide with the plane including the branch point O and are disposed such that they are directed in the same direction.

Next, an operation of the current detecting apparatus according to the third embodiment of the present invention having such a structure will be described.

Assume that the magnetism sensitive surface of each hall device is directed from a paper face toward yourself. Further assume that a current $I_1$ flows from the branch point O to its end in the first conductor 11, a current $I_2$ flows from the end to the branch point O in the second conductor 12, and a third current $I_3$ flows from the branch point O to the end in the third conductor $I_3$. The direction of current flows mentioned here is just an example and it is not limited to the above described one but any direction. Because the respective hall devices are disposed near each other and the magnetism sensitive surfaces of the respective hall devices are directed to the same direction, it is assumed that the respective magnetism sensitive surfaces receive disturbing magnetic flux n equally.

If magnetic flux entering a magnetism sensitive surface of each of hall devices disposed on both sides of a conductor i when a current $I_i$ flows to the conductor i (i=1, 2, 3, 4) is $f(I_i)$ and magnetic flux going out of the magnetism sensitive surface is $-f(I_i)$, total magnetic flux $B_1$ received by a magnetism sensitive plane of the first hall device 21 is "$B_1=f(I_1)-f(I_2)+n$". Total magnetic flux $B_2$ received by the magnetism sensitive surface of the second hall device 22 is "$B_2=f(I_2)-f(I_3)+n$". Total magnetic flux received $B_3$ by the magnetism sensitive surface of the third hall device 23 is "$B_3=f(I_3)-f(I_4)+n$". Total magnetic flux $B_4$ received by the magnetism sensitive surface of the fourth hall device 24 is "$B_4=f(I_4)-f(I_1)+n$".

Now, if "$B_2-B_1$" is calculated, it comes that "$B_2-B_1=f(I_2)-f(I_3)+n-\{f(I_1)-f(I_2)+n\}=2*f(I_2)-f(I_3)-f(I_1)$". Because "$I_1+I_3=-(I_2+I_4)$" for the reason of Kirchhoff formula, "$f(I_1)+f(I_3)=-\{f(I_2)+f(I_4)\}$" is established, "$B_2-B_1=3*f(I_2)+f(I_4)$" is obtained.

Next, if "$B_3-B_2$" is calculated, it comes that "$B_3-B_2=f(I_3)-f(I_4)+n-\{f(I_2)-f(I_3)+n\}=2*f(I_3)-f(I_4)-f(I_2)$". Because "$f(I_1)+f(I_3)=-\{f(I_2)+f(I_4)\}$" is established for the reason of Kirchhoff formula, "$B_3-B_2=3*f(I_3)+f(I_1)$" is obtained.

Next, if "$B_4-B_3$" is calculated, it comes that "$B_4-B_3=f(I_4)-f(I_1)+n-\{f(I_3)-f(I_4)+n\}=2*f(I_4)-f(I_1)-f(I_3)$". Because "$f(I_1)+f(I_3)=-\{f(I_2)+f(I_4)\}$" is established for the reason of Kirchhoff formula, "$B_4-B_3=3*f(I_4)+f(I_2)$" is obtained.

Further, if "$B_1-B_4$" is calculated, it comes that "$B_1-B_4=f(I_1)-f(I_2)+n-\{f(I_4)-f(I_1)+n\}=2*f(I_1)-f(I_2)-f(I_4)$". Because "$f(I_1)+f(I_3)=-\{f(I_2)+f(I_4)\}$" is established for the reason of Kirchhoff formula, "$B_1-B_4=3*f(I_1)+f(I_3)$" is obtained.

Next, using the above described computation result, "$3*(B_1-B_4)-(B_3-B_2)$" is calculated, "$3*(B_1-B_4)-(B_3-B_2)=3*\{3*f(I_1)+f(I_3)\}-\{3*f(I_3)+f(I_1)\}=8*f(I_1)$" is obtained. Further, if "$3*(B_2-B_1)-(B_4-B_3)$" is calculated, "$3*(B_2-B_1)-(B_4-B_3)=3*\{3**f(I_2)+f(I_4)\}-\{3*f(I_4)+f(I_2)\}=8*f(I_2)$" is obtained.

Further, if "$3*(B_3-B_2)-(B_1-B_4)$ is calculated, "$3*(B_3-B_2)-(B_1-B_4)=3*\{3*f(I_3)+f(I_1)\}-\{3*f(I_1)+f(I_3)\}=8*f(I_3)$" is obtained.

Further, if "$3*(B_4-B_3)-(B_2-B_1)$ is calculated, "$3*(B_4-B_3)-(B_2-B_1)=3*\{3*f(I_4)+f(I_2)\}-\{3*f(I_2)+f(I_4)\}=8*f(I_4)$" is obtained.

When current $I_1$ flowing through the first conductor 11, the current $I_2$ flowing through the second conductor 12, current $I_3$ flowing through the third conductor 13 and current $I_4$ flowing through the fourth conductor 14 are detected, results of computation of "$3*(B_1-B_4)-(B_3-B_2)$", "$3*(B_2-B_1)-(B_4-B_3)$", "$3*(B_3-B_2)-(B_1-B_4)$", and "$3*(B_4-B_3)-(B_2-B_1)$" becomes equal to generating of a magnetic flux eight times a magnetic flux generated when a current flows through each conductor. Further, because the disturbing magnetic flux can be canceled, a current can be detected highly accurately. Further, because all the hall devices are disposed near the branch point O, error factors such as temperature drift are canceled also.

Figure 14:
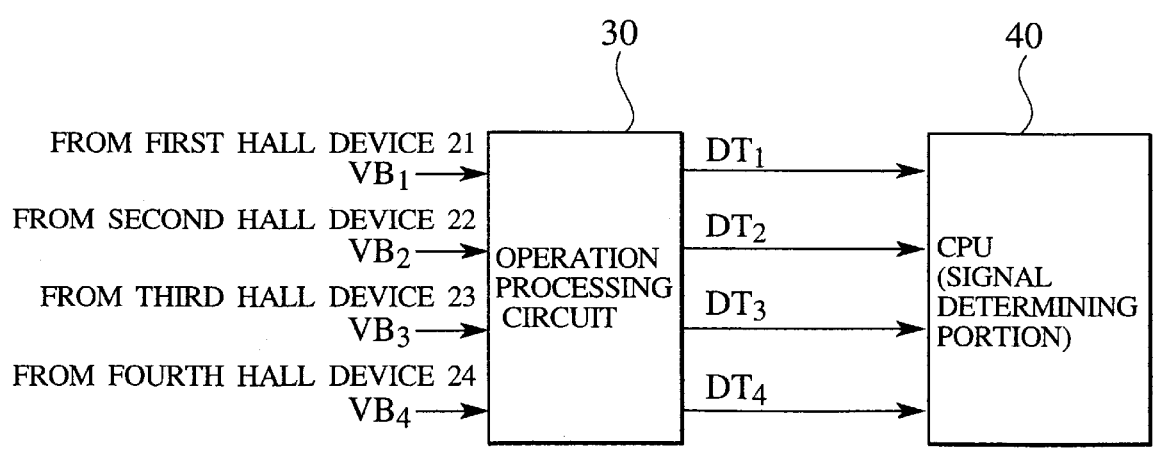
FIG. 14 is a block diagram showing a structure of the computation control circuit in the current detecting apparatus shown in FIG. 13.

FIG. 14 is a block diagram showing a structure of the operation processing circuit 30 of this current detecting apparatus. An output of this operation processing circuit 30 is supplied to the CPU 40, for example. The operation processing circuit 30 receives inputs of the voltage signal $VB_1$ supplied from the first hall device 21 corresponding to the magnetic flux $B_1$, voltage signal $VB_2$ supplied from the second hall device 22 corresponding to the magnetic flux $B_2$, voltage signal $VB_3$ supplied from the third hall device 23 corresponding to the magnetic flux $B_3$ and voltage signal $VB_4$ supplied from the fourth hall device 24 corresponding to the magnetic flux $B_4$.

This operation processing circuit 30 is comprised of, for example, a plurality of operation amplifiers. Then, these operation amplifiers carry out computation similar to "$3*(B_1-B_4)-(B_3-B_2)$" and supply its computation result to the CPU 40 as a first detection signal $DT_1$ indicating the magnitude of the current $I_1$. Because this first detection signal $DT_1$ is similar to a signal obtained by electromagnetically converting a magnetic flux $8*f(I_1)$ eight times a magnetic flux $f(I_1)$ generated by only the current $I_1$, the current $I_1$ flowing through the first conductor 11 can be detected.

An operation amplifier contained in the operation processing circuit 30 carries out computation corresponding to "$3*(B_2-B_1)-(B_4-B_3)$" and supplies its computation result to the CPU 40 as the second detection signal $DT_2$ indicating the magnitude of the current $I_2$. Because this second detection signal $DT_2$ is similar to a signal obtained by electromagnetically converting a magnetic flux $8*f(I_2)$ eight times a magnetic flux $f(I_2)$ generated by only the current $I_2$, the current $I_2$ flowing through the second conductor 12 can be detected at a high sensitivity.

An operation amplifier contained in the operation processing circuit 30 carries out computation corresponding to "$3*(B_3-B_2)-(B_1-B_4)$" and supplies its computation result to the CPU 40 as the third detection signal $DT_3$ indicating the magnitude of the current $I_3$. Because this third detection signal $DT_3$ is similar to a signal obtained by electromagnetically converting a magnetic flux $8*f(I_3)$ eight times a magnetic flux $f(I_3)$ generated by only the current $I_3$, the current $I_3$ flowing through the second conductor 13 can be detected at a high sensitivity.

An operation amplifier contained in the operation processing circuit 30 carries out computation corresponding to "$3*(B_4-B_3)-(B_2-B_1)$" and supplies its computation result to the CPU 40 as the fourth detection signal $DT_4$ indicating the magnitude of the current $I_4$. Because this fourth detection signal $DT_4$ is similar to a signal obtained by electrogmagnetically converting a magnetic flux $8*f(I_4)$ eight times a magnetic flux $f(I_4)$ generated by only the current $I_4$, the current $I_4$ flowing through the second conductor 14 can be detected at a high sensitivity.

The CPU 40 receives the first detection signal $DT_1$, the second detection signal $DT_2$, the third detection signal $DT_3$ and the fourth detection signal $DT_4$ from the operation processing circuit 30, and determines the magnitudes of currents flowing through the first conductor 11, second conductor 12, third conductor 13 and fourth conductor 14 and if necessary, drives a current circuit breaker or the like.

As described above, in the current detecting apparatus according to the third embodiment, using four conductors disposed in cross shape and four hall devices, currents flowing through the respective conductors are detected each by obtaining a difference of voltage between two hall devices which sandwich the conductor. Thus, as a current flowing through each conductor, eight times outputs can be obtained without being affected by the disturbing magnetic field, so that a highly accurate measurement of current is possible.

Further, because the current detecting apparatus according to the third embodiment does not use the magnetic core, the weight and occupied volume can be reduced as compared to a case where the magnetic core is attached to each conductor thereby totally four magnetic cores being attached, and further, production cost can be reduced largely. Further, frequency characteristic is improved and there is no magnetic saturation.

Fourth Embodiment

Figure 15:
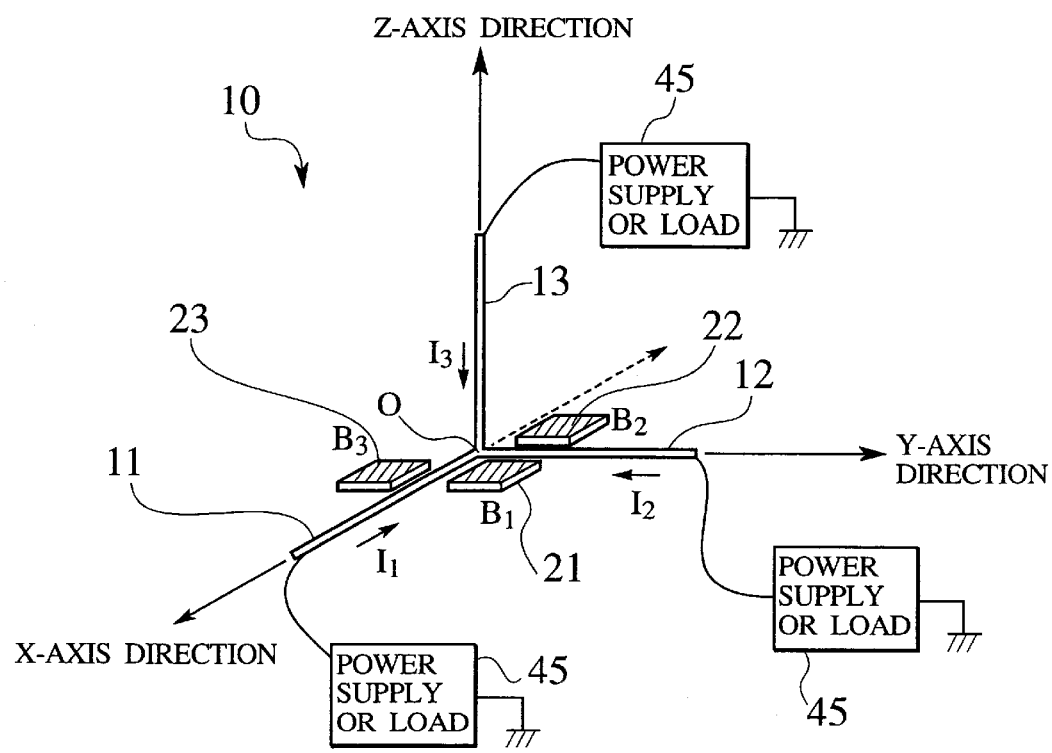
FIG. 15 is a perspective view showing a structure of the sensor portion of the current detecting apparatus according to a fourth embodiment of the present invention.

The fourth embodiment is an example in which n of the present invention is "3" and m is "3". FIG. 15 is a perspective view showing a structure of the current detecting apparatus according to the fourth embodiment of the present invention. This sensor portion is comprised of a conductor 10, a first hall device 21, a second hall device 22 and a third hall device 23. Usually, these components are incorporated in an electric connecting box. In the first embodiment, no magnetism collecting core is used.

As shown in FIG. 15, the conductor 10 is comprised of a first conductor 11, second, conductor 12 and third conductor 13 disposed radially on three-dimensional axes perpendicular to each other with the branch point O as a home position. That is, the first conductor 11 is disposed in the X-axis direction, the second conductor 12 is disposed in the y-axis direction and the third conductor 13 is disposed in the z-axis direction. The first conductor 11, second conductor 12 and third conductor 13 correspond to n conductors of the present invention. An end of each of the conductors is connected to the branch point O. The other end of each of the conductors is connected to a power supply or a load 45.

In the meantime, the conductor 10 may be composed by connecting ends of the three separate conductors, namely, the first conductor 11, second conductor 12 and third conductor 13 at the branch point O and instead by forming integrally the first conductor 11, second conductor 12 and third conductor 13. Further, it is also permissible to compose this conductor 10 by forming a wiring pattern having three branch routes including the first conductor 11, second conductor 12 and third conductor 13 on a substrate.

The first hall device 21, second hall device 22 and third hall device 23 correspond to m electromagnetic transducers of the present invention. The respective hall devices are disposed on a plane formed by the first conductor 11 and the second conductor 12, that is, x-y plane. The respective hall devices generate a voltage (hall voltage) corresponding to magnetic density entering its magnetism sensitive surface (magnetic flux detecting plane). A predetermined current is supplied to each hall device through a lead (not shown) and a voltage signal generated in each hall device is fetched out through a lead (not shown).

Positions where the respective hall devices are disposed are determined as follows. That is, the first hall device 21 is disposed between the first conductor 11 and the second conductor 12 and at the same distance from these conductors. The second hall device 22 is disposed symmetrically with the first hall device 21 with respect to the second conductor 12. The third hall device 23 is disposed symmetrically with the first hall device 21 with respect to the first conductor 11. The respective hall devices are disposed at the same distance from the branch point O and near the branch point. The magnetism sensitive surfaces of the respective hall devices substantially coincide with the x-y plane and are disposed such that they are directed in the same direction.

Next, an operation of the sensor portion of the current detecting apparatus according to the fourth embodiment of the present invention having such a structure will be described.

Assume that the magnetism sensitive surface of each hall device is directed in the z-axis direction. Further assume that a current $I_1$ flows from its end to the branch point O in the first conductor 11, a current $I_2$ flows from its end to the branch point O in the second conductor 12 and a third current $I_3$ flows from its end to the branch point O in the third conductor $I_3$. The direction of current flow mentioned here is just an example and it is not limited to the above described one but any direction. Because the respective hall devices are disposed near each other and the magnetism sensitive surfaces of the respective hall devices are directed to the same direction, it is assumed that the respective magnetism sensitive surfaces receive disturbing magnetic flux $-nz$ in the z-axis direction equally.

If magnetic flux entering a magnetism sensitive surface of each of hall devices disposed on both sides of a conductor i when a current $I_i$ flows to the conductor i (i=1, 2, 3) is $f(I_i)$ and magnetic flux going out of the magnetism sensitive surface is $-f(I_i)$, total magnetic flux $B_1$ received by a magnetism sensitive surface of the first hall device 21 is "$B_1 = f(I_1) - f(I_2) - nz$". Total magnetic flux $B_2$ received by the magnetism sensitive surface of the second hall device 22 is "$B_2 = f(I_2) - nz$". Total magnetic flux $B_3$ received by the magnetism sensitive surface of the third hall device 23 is "$B_3 = -f(I_1) - nz$".

Now, if "$B_2 - B_3$" is calculated, it comes that "$B_2 - B_3 = f(I_2) - nz - \{-f(I_1) - nz\} = f(I_1) + f(I_2)$". Because "$f(I_1) + f(I_2) = -f(I_3)$" is established for the reason of Kirchhoff formula, "$B_2 - B_3 = -f(I_3)$" is obtained.

Further, if "$B_1 + B_2$" is calculated, it comes that "$B_1 + B_2 = f(I_1) - f(I_2) - nz + \{f(I_2) - nz\} = f(I_1) - 2*nz$". Further, if "$B_1 + B_2 - 2*B_3$" is calculated, it comes that "$B_1 + B_2 - 2*B_3 = f(I_1) - 2*nz - 2*\{-f(I_1) - nz\} = 3*f(I_1)$".

Further, if "$B_1 + B_3$" is calculated, it comes that "$B_1 + B_3 = f(I_1) - f(I_2) - nz + \{-f(I_1) - nz\} = -f(I_2) - 2*nz$". Further, if "$B_1 + B_3 - 2*B_2$" is calculated, it comes that "$B_1 + B_3 - 2*B_2 = -f(I_2) - 2*nz - 2*\{f(I_2) - nz\} = -3*f(I_2)$".

That is, by calculating "$B_1 + B_2 - 2*B_3$" and "$B_1 + B_3 - 2*B_2$", its result becomes equal to obtaining of a magnetic flux three times a magnetic flux generated when the current $I_1$ flows through the first conductor 11 or obtaining of a magnetic flux three times a magnetic flux generated when the current $I_2$ flows through the second conductor 12. Consequently, the first conductor 11 and the second conductor 12 existing on the same plane as the hall devices are capable of securing an output three times a current flowing through the first conductor 11 and the second conductor 12 respectively.

Because the disturbing magnetic flux $nz$ can be canceled by carrying out the above described operation, the current can be detected very accurately. Because all the hall devices are disposed near the branch point O, error factors such as temperature drift are canceled also.

Because the magnetic core is not used, the weight and occupied volume can be reduced as compared to a case where a magnetic core is attached to each conductor thereby totally three cores being attached and the production cost can be reduced largely. Further, the frequency characteristic is improved and there is no magnetic saturation.

Figure 16:
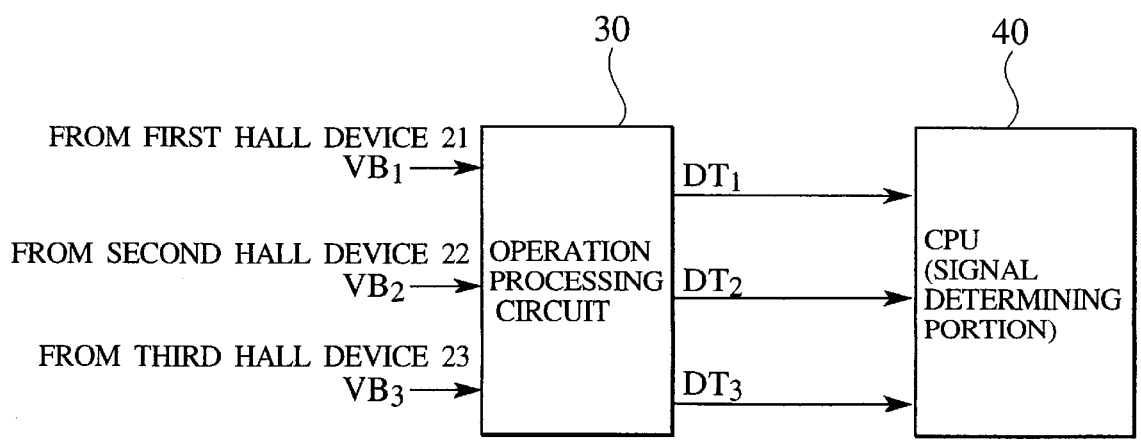
FIG. 16 is a block diagram showing a structure of the computation control circuit of the current detecting apparatus shown in FIG. 15.

FIG. 16 is a block diagram showing the structure of the current detecting apparatus containing the above described sensor portion. In this current detecting apparatus, the sensor portion is comprised of the conductor 10, first hall device 21, second hall device 22 and third hall device 23 and further, an operation processing circuit 30 is added thereto. An output from the operation processing circuit 30 is supplied to, for example, the CPU 40.

The operation processing circuit 30 receives inputs of the voltage signal $VB_1$ from the first hall device 21 corresponding to the magnetic flux $B_1$, voltage signal $VB_2$ from the second hall device 22 corresponding to the magnetic flux $B_2$ and voltage signal $VB_3$ from the third hall device 23 corresponding to the magnetic flux $B_3$.

This operation processing circuit 30 is comprised of, for example, a plurality of operation amplifiers. Then, these operation amplifiers carry out computation similar to "$B_1 + B_2 - 2*B_3$" and supply its computation result to the CPU 40 as a first detection signal $DT_1$ indicating the magnitude of the current $I_1$. Because this first detection signal $DT_1$ is similar to a signal obtained by electromagnetically converting a magnetic flux $3*f(I_1)$ three times a magnetic flux $f(I_1)$ generated by only the current $I_1$, the current $I_1$ flowing through the first conductor 11 can be detected.

An operation amplifier contained in the operation processing circuit 30 carries out computation corresponding to "$B_1 + B_3 - 2*B_2$" and supplies its computation result to the CPU 40 as the second detection signal $DT_2$ indicating the magnitude of the current $I_2$. Because this second detection signal $DT_2$ is similar to a signal obtained by electrogmagnetically converting a magnetic flux $3 *f(I_2)$ three times a magnetic flux $f(I_2)$ generated by only the current $I_2$, the current $I_2$ flowing through the second conductor 12 can be detected at a high sensitivity.

Further, the operation amplifier contained in the operation processing circuit 30 carries out computation corresponding to "$B_2 - B_3$" and supplies its computation result to the CPU 40 as the third detection signal $DT_3$ indicating the magnitude of the current $I_3$. Because this third detection signal $DT_3$ corresponds to a signal obtained by electromagnetically converting a magnetic flux $f(I_3)$ generated by only the current $I_3$, the current $I_3$ flowing through the third conductor 13 can be detected at a high sensitivity.

The CPU 40 receives the first detection signal $DT_1$, the second detection signal $DT_2$ and the third detection signal $DT_3$ from the operation processing circuit 30, and determines the magnitudes of currents flowing through the first conductor 11, second conductor 12 and third conductor 13 and if necessary, drives a current circuit breaker or the like.

According to the current detecting apparatus of the fourth embodiment, three conductors disposed on the respective axes of three-dimensional axes and three hall devices are used. A current flowing through each conductor is detected by obtaining a difference between voltage signals from two hall devices which sandwich the first conductor and the second conductor on the xy plane. Three times, three times and one time outputs can be obtained as currents flowing through the first conductor, second conductor and third conductor respectively without being affected by disturbing magnetic field, thereby achieving a highly accurate measurement of current.

Further, because the current detecting apparatus according to the fourth embodiment does not use the magnetic core, the weight and occupied volume can be reduced as compared to a case where the magnetic core is attached to each conductor thereby totally three magnetic cores being attached, and further, production cost can be reduced largely. Further, frequency characteristic is improved and there is no magnetic saturation.

Fifth Embodiment

Figure 17:
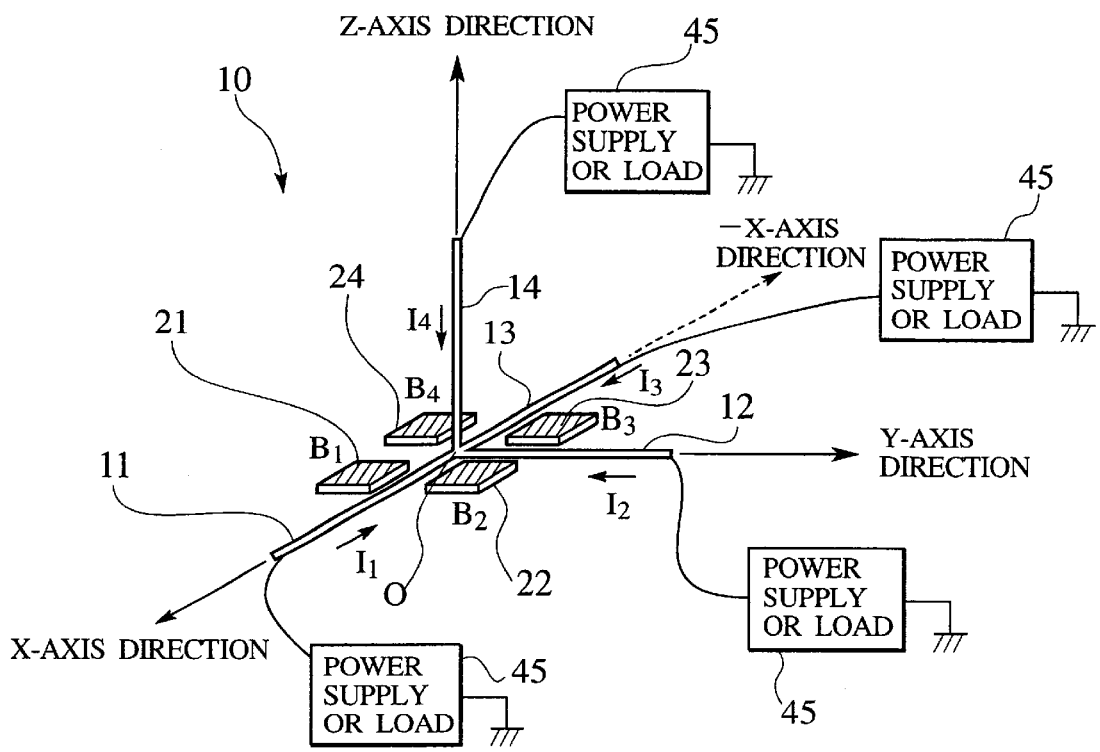
FIG. 17 is a perspective view showing a structure of the sensor portion of the current detecting apparatus according to a fifth embodiment of the present invention.

The fifth embodiment is an example in which n of the present invention is "4" and m is "4". FIG. 17 is a perspective view showing a structure of a sensor portion of the current detecting apparatus according to the fifth embodiment of the present invention. This sensor portion is comprised of a conductor 10, a first hall device 21, a second hall device 22, a third hall device 23 and a fourth hall device 24. Usually, these components are incorporated in an electric connecting box. In the fifth embodiment, no magnetism collecting core is used.

As shown in FIG. 17, the conductor 10 is comprised of a first conductor 11, second conductor 13, third conductor 13 and fourth conductor 14 disposed radially on three-dimensional axes each perpendicular to other axes with the branch point O as a home position. That is, the first conductor 11 is disposed in the x-axis direction, the second conductor 12 is disposed in the y-axis direction, the third conductor 13 is disposed in the x-axis direction and the fourth conductor is disposed in the z-axis direction. The first conductor 11, second conductor 12, third conductor 13 and fourth conductor 14 correspond to n conductors of the present invention. An end of each conductor is connected to the branch point O and the other end thereof is connected to a power supply or load 45.

In the meantime, the conductor 10 may be composed by connecting ends of the four separate conductors, namely, the first conductor 11, second conductor 12, third conductor 13 and fourth conductor 14 at the branch point O and instead by forming integrally the first conductor 11, second conductor 12, third conductor 13 and fourth conductor 14. Further, it is also permissible to compose this conductor 10 by forming a wiring pattern having four branch routes including the first conductor 11, second conductor 12, third conductor 13 and fourth conductor 14 on a substrate.

A first hall device 21, second hall device 22, third hall device 23 and fourth hall device 24 correspond to m electromagnetic transducers of the present invention. The respective hall devices are disposed on a plane formed by the first conductor 11, second conductor 12 and third conductor 13, that is, the xy plane. Each hall device generates a voltage (hall voltage) signal corresponding to a density of magnetic flux entering its magnetism sensitive surface. A predetermined current is supplied to each hall device through a lead (not shown) and the voltage signal generated in each hall device is fetched out through a lead (not shown).

Positions where the respective hall devices are disposed are determined as follows. The first hall device 21 and second hall device 22 are disposed at positions at the same distance from the first conductor 11 of the first conductor 11-third conductor 13 which exist on the xy plane. The third hall device 23 is disposed symmetrically with the second hall device 22 with respect to the second conductor 12 as a symmetrical line. The fourth hall device 24 is disposed symmetrically with the third hall device 23 with respect to the third conductor 13 as a symmetrical line. The respective hall devices are disposed at the same distance from the branch point O and near the branch point O. Further, the magnetism sensitive surfaces of the respective hall devices are disposed such that they substantially coincide with the xy plane and are directed in the same direction.

Next, an operation of the sensor portion of the current detecting apparatus according to the fifth embodiment of the present invention having such a structure will be described below.

Assume that the magnetism sensitive surface of each hall device is directed in the z-axis direction. Further assume that a current $I_1$ flows from an end of the first conductor 11 to the branch point O, a current $I_2$ flows from the end of the second conductor 12 to the branch point O, a current $I_3$ flows from the end of the third conductor 13 to the branch point O and a current $I_4$ flows from the end of the fourth conductor 14 to the branch point O. The direction of current flows mentioned here is just an example and it is not limited to the above described one but any direction. Because the respective hall devices are disposed near each other and the magnetism sensitive surfaces of the respective hall devices are directed in the same direction, it is assumed that the respective magnetism sensitive surfaces receive z-axis direction component −nz of the disturbing magnetic flux equally.

If magnetic flux entering a magnetism sensitive surface of each of hall devices disposed on both sides of a conductor i when a current $I_i$ flows to the conductor i (i=1, 2, 3) is $f(I_i)$ and magnetic flux going out of the magnetism sensitive surface is $-f(I_i)$, total magnetic flux $B_1$ received by a magnetism sensitive surface of the first hall device 21 is "$B_1=-f(I_1)-nz$". Total magnetic flux $B_2$ received by the magnetism sensitive surface of the second hall device 22 is "$B_2=f(I_1)-f(I_2)-nz$". Total magnetic flux received $B_3$ by the magnetism sensitive surface of the third hall device 23 is "$B_3=f(I_2)-f(I_3)-nz$". Total magnetic flux $B_4$ received by the magnetism sensitive surface of the fourth hall device 24 is "$B_4=f(I_3)-nz$".

Now, if "$B_1+B_2$" is calculated, "$B_1+B_2=-f(I_1)-nz+\{f(I_1)-f(I_2)-nz\}=-f(I_2)-2*nz$" is obtained. If "$B_3+B_4$" is calculated, "$B_3+B_4=f(I_2)-f(I_3)-nz+\{f(I_3)-nz\}=f(I_2)-2*nz$" is obtained. Further, if "$B_1+B_2-B_3-B_4$" is calculated, "$B_1+B_2-B_3-B_4=-f(I_2)-2*nz-f(I_2)+2*nz=-2*f(I_2)$" is obtained.

If "$B_2+B_3+B_4$" is calculated, "$B_2+B_3+B_4=f(I_1)-f(I_2)-nz+f(I_2)-f(I_3)-nz+f(I_3)-nz=f(I_1)-3*nz$" is obtained. Further, if "$B_2+B_3+B_4-3*B_1$" is calculated, "$B_2+B_3+B_4-3*B_1=f(I_1)-3*nz-3*\{-f(I_1)-nz\}=4*f(I_1)$" is obtained.

Next, if "$-B-B_2-B_3$" is calculated, "$-B_1-B_2-B_3=f(I_1)+nz-f(I_1)+f(I_2)+nz-f(I_2)+f(I_3)+nz=f(I_3)+3*nz$" is obtained. If "$-B_1-B_2-B_3+3*B_4$" is calculated, "$-B_1-B_2-B_3+3*B_4=f(I_3)+3*nz+3*\{f(I_3)-nz\}=4*f(I_3)$" is obtained.

Next, if "$2*B_2-2*B_3$" is calculated, "$2*B_2-2*B_3=2*\{f(I_1)-f(I_2)-nz\}-2*\{f(I_2)-f(I_3)-nz\}=2*f(I_1)-2*f(I_2)+2*f(I_3)$" is obtained. If "$2*B_2-2*B_3+6*B_1-6*B_4$" is calculated, "$2*B_2-2*B_3+6*B_1-6*B_4=2*f(I_1)-4*f(I_2)+2*f(I_3)+6*-\{f(I_3)-nz\}-6*\{f(I_3)-nz\}=-4*\{f(I_1)+f(I_2)+f(I_3)\}$" is obtained. Here, because "$f(I_1)+f(I_2)+f(I_3)=-f(I_4)$" is established because of Kirchhoff formula, "$2*B_2-2*B_3+6*B_1-6*B_4=4*f(I_4)$" is obtained.

That is, by calculating "$B_2+B_3+B_4-3*B_1$", a result of the calculation becomes equal to obtaining of a magnetic flux four times a magnetic flux generated when the current $I_1$ flows through the first conductor 11. By calculating "$-B_1-B_2-B_3+3*B_4$", a result of calculation becomes equal to obtaining of a magnetic flux four times a magnetic flux generated when the current $I_3$ flows through the third conductor 13. Further, by calculating "$2*B_2-2*B_3+6*B_1-6*B_4$", a result of calculation becomes equal to obtaining of a magnetic flux four times a magnetic flux generated when the current $I_4$ flows through the fourth conductor 14. Then, by calculating "$B_1+B_2-B_3-B_4$", a result of calculation becomes equal to obtaining of a magnetic flux two times a magnetic flux generated when the current $I_2$ flows through the second conductor 12.

Further, by the above described operation, the disturbing magnetic flux nz can be canceled, so that a highly accurate current detection is possible. Additionally, because all the hall devices are disposed near the branch point O, error factors such as temperature drift are canceled in the same way.

Further, because the current detecting apparatus according to the fifth embodiment does not use the magnetic core, the weight and occupied volume can be reduced as compared to a case where the magnetic core is attached to each conductor thereby totally four magnetic cores being attached, and further, production cost can be reduced largely. Further, frequency characteristic is improved and there is no magnetic saturation.

Figure 18:
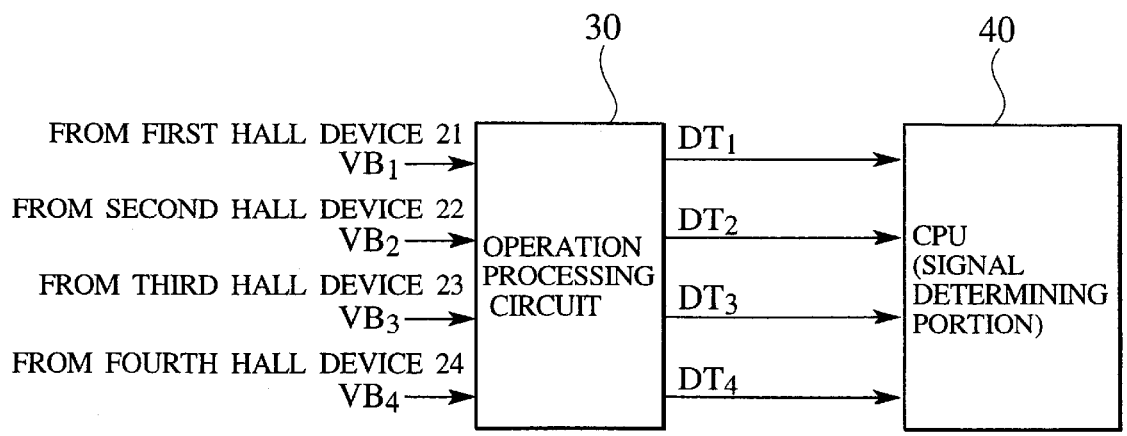
FIG. 18 is a block diagram showing a structure of the computation control circuit of the current detecting apparatus shown in FIG. 17.

FIG. 18 is a block diagram showing a structure of the current detecting apparatus containing the sensor portion. This current detecting apparatus is composed by adding an operation processing circuit 30 to the sensor portion comprised of the conductor 10, first hall device 21, second hall device 22, third hall device 23 and fourth hall device 24. An output of this operation processing circuit 30 is supplied to the CPU 40, for example.

The operation processing circuit 30 receives inputs of the voltage signal VB corresponding to the magnetic flux $B_1$ from the first hall device 21, voltage signal $VB_2$ corresponding to the magnetic flux $B_2$ from the second hall device 22, voltage signal $VB_3$ corresponding to the magnetic flux $B_3$ from the third hall device 23 and voltage signal $VB_4$ corresponding to the magnetic flux $B_4$ from the fourth hall device 24.

This operation processing circuit 30 can be comprised of a plurality of operation amplifiers. Then, these operation amplifiers carry out operation corresponding to "$B_2+B_3+B_4-3*B^1$". Its operation result is supplied to the CPU 40 as a first detection signal $DT_1$ indicating the magnitude of the current $I_1$. Because this first detection signal $DT_1$ is similar to a signal obtained by electromagnetically converting a magnetic flux $4*f(I_1)$ four times a magnetic flux $f(I_1)$ generated by only the current $I_1$, the current $I_1$ flowing through the first conductor 11 can be detected with a high sensitivity.

Further, the operation amplifier contained in the operation processing circuit 30 carries out operation corresponding to "$B_1+B_2-B_3-B_4$" and supplies its operation result to the CPU 40 as a second detection signal $DT_2$ indicating the magnitude of the current $I_2$. Because this second detection signal $DT_2$ is similar to a signal obtained by electromagnetically converting a magnetic flux $2*f(I_2)$ twice a magnetic flux $f(I_2)$ generated by only the current $I_2$, the current $I_2$ flowing through the second conductor 12 can be detected with a high sensitivity.

Further, the operation amplifier contained in the operation processing circuit 30 carries out operation corresponding to and supplies its operation result to the CPU 40 as a third detection signal $DT_3$ indicating the magnitude of the current $I_3$. Because this third detection signal $DT_3$ is similar to a signal obtained by electromagnetically converting a magnetic flux $4*f(I_3)$ which is four times a magnetic flux $f(I_3)$ generated by only the current $I_3$, the current $I_3$ flowing through the second conductor 13 can be detected with a high sensitivity.

Further, the operation amplifier contained in the operation processing circuit 30 carries out operation corresponding to "$2*B_2-2*B_3+6*B_1-6*B_4$" and supplies its operation result to the CPU 40 as a fourth detection signal $DT_4$ indicating the magnitude of the current $I_4$. Because this fourth detection signal $DT_4$ is similar to a signal obtained by electromagnetically converting a magnetic flux $4*f(I_4)$ which is four times a magnetic flux $f(I_4)$ generated by only the current $I_4$, the current I4 flowing through the second conductor 14 can be detected with a high sensitivity.

The CPU 40 receives inputs of the first detection signal $DT_1$ from the operation processing circuit 30, second detection signal $DT_2$, third detection signal $DT_3$ and fourth detection signal $DT_4$. Then it judges the magnitude of current flowing through each of the first conductor 11, second conductor 12, third conductor 13 and fourth conductor 14, and then drives the current circuit breaker or the like as required.

According to the current detecting apparatus of the fifth embodiment, four conductors disposed on the respective axes of three-dimensional axes and –x axis and four hall devices are used. A current flowing through each conductor is detected by obtaining a difference between voltage signals from two hall devices which sandwich each of the first conductor-third conductor on the xy plane without being affected by disturbing magnetic field. Further, outputs four times, two times, four times and four times can be obtained as the current flowing through the first conductor-fourth conductor, respectively. As a result, a highly accurate current measurement is enabled and the disturbing magnetic flux existing near the current detecting apparatus is canceled.

Because the current detecting apparatus according to the fifth embodiment does not use the magnetic core, the weight and occupied volume can be reduced as compared to a case where the magnetic core is attached to each conductor thereby totally four magnetic cores being attached, and further, production cost can be reduced largely. Further, frequency characteristic is improved and there is no magnetic saturation.

Sixth Embodiment

The sixth embodiment has a feature that it is capable of obtaining a current at a better accuracy than the current detecting apparatus of the second embodiment. Because the current detecting apparatus of the sixth embodiment is of the same structure as the current detecting apparatus of the second embodiment shown in FIGS. 11, 12, an operation thereof will be described.

First, an equation shown in Expression 1 is established about variables, currents $I_1$–$I_3$ and magnetic fluxes $B_1$–$B_4$ because of Biot-Savart's law.

[Expression 1]

$$B_1 = \frac{1}{4\pi r}\left[-\left(1+\frac{1}{\sqrt{2}}\right)I_1 + \left(1+\frac{1}{\sqrt{2}}\right)I_2 + \left(1-\frac{1}{\sqrt{2}}\right)I_3\right] \quad (1)$$

$$B_2 = \frac{1}{4\pi r}\left[-\left(1-\frac{1}{\sqrt{2}}\right)I_1 - \left(1+\frac{1}{\sqrt{2}}\right)I_2 + \left(1+\frac{1}{\sqrt{2}}\right)I_3\right] \quad (2)$$

$$B_3 = \frac{1}{4\pi r}\left[\left(1-\frac{1}{\sqrt{2}}\right)I_1 - \left(1-\frac{1}{\sqrt{2}}\right)I_2 - \left(1+\frac{1}{\sqrt{2}}\right)I_3\right] \quad (3)$$

$$B_4 = \frac{1}{4\pi r}\left[\left(1+\frac{1}{\sqrt{2}}\right)I_1 + \left(1-\frac{1}{\sqrt{2}}\right)I_2 - \left(1-\frac{1}{\sqrt{2}}\right)I_3\right] \quad (4)$$

$$0 = I_1 + I_2 + I_3 \quad (5)$$

If equation (1) is subtracted from equation (2) in Expression 1, Expression 2 is obtained. [Expression 2]

$$4\sqrt{2}\pi r(B_2-B_1)=2I_1-2(\sqrt{2}+1)I_2+2I_3 \quad (6)$$

Further, Expression 3 is obtained from equation (5) of Expression 1 and current $I_2$ is obtained from this Expression 3.

$$I_2 = -\frac{2\sqrt{2}}{\sqrt{2}+2}\cdot \pi r(B_2 - B_1) \quad (7) \qquad \text{[Expression 3]}$$

If equation (1) is subtracted from equation (4) of Expression 1, Expression 4 is obtained.
[Expression 4]

$$4\sqrt{2}\pi r(B_4-B_1)=2(\sqrt{2}+1)I_1-2I_2-2(\sqrt{2}-1)I_3 \quad (8)$$

If equation (2) is subtracted from equation (3) of Expression 1, Expression 5 is obtained.
[Expression 5]

$$4\sqrt{2}\pi r(B_3-B_2)=2(\sqrt{2}-1)I_1\ 30\ 2I_2-2(\sqrt{2}+1)I_3 \quad (9)$$

If equation (8) is added to equation (9), Expression 6 is obtained.
[Expression 6]

$$4\sqrt{2}\pi r(-B_1-B_2+B_3+B_4)=4\sqrt{2}I_1-4\sqrt{2}I_3 \quad (10)$$

If equation (5) is substituted into equation (10), Expression 7 is obtained.
[Expression 7]

$$4\sqrt{2}\pi r(-B_1-B_2+B_3+B_4)=8\sqrt{2}I_1+4\sqrt{2}I_2 \quad (11)$$

Further, Expression 8 is obtained from equation (7).

$$8\sqrt{2}\,I_1 = 4\sqrt{2}\,\pi r(-B_1-B_2+B_3+B_4) - \qquad \text{[Expression 8]}$$
$$\frac{4\sqrt{2}\cdot 2\sqrt{2}}{\sqrt{2}+2}\cdot \pi r(B_2-B_1) \quad (12)$$

$$I_1 = \frac{1}{2}\pi r(-B_1-B_2+B_3+B_4) -$$
$$2(\sqrt{2}-1)\pi r(B_2-B_1) \quad (13)$$

Current $I_1$ is obtained from equation (13). For $I_3$, if equation (5) is substituted into equation (10), Expression 9 is obtained.
[Expression 9]

$$4\sqrt{2}\pi r(-B_1-B_2+B_3+B_4)=-4\sqrt{2}I_2-8\sqrt{2}I_3 \quad (14)$$

Further, Expression 10 is obtained from equation (7).

$$8\sqrt{2}\,I_3 = 4\sqrt{2}\,\pi r(-B_1-B_2+B_3+B_4) + \qquad \text{[Expression 10]}$$
$$\frac{4\sqrt{2}\cdot 2\sqrt{2}}{\sqrt{2}+2}\cdot \pi r(B_2-B_1) \quad (15)$$

$$I_3 = \frac{1}{2}\pi r(-B_1-B_2+B_3+B_4) +$$
$$2(\sqrt{2}-1)\pi r(B_2-B_1) \quad (16)$$

$I_1$ will be obtained from the equation (16). In this way, each of $I_1$, $I_2$, $I_3$ can be calculated by multiplying a difference between magnetic fields received by two hall devices 21 and 22 with a coefficient. Thus, even if each hall device contains a magnetic flux disturbance, this disturbance can be canceled. Therefore, highly accurate output detection is enabled. Meanwhile, calculation on the above described currents $I_1$, $I_2$, $I_3$ is carried out by the operation processing circuit 30.

Next, a current amplification factor will be obtained. Magnetic field $B_1$ received by the first hall device 21 near $I_1$ from the conductor current $I_1$ is expressed by Expression 11.

$$B_1 = -\frac{1}{4\pi r}\left(1+\frac{1}{\sqrt{2}}\right)I_1 = -f(I_1) \qquad \text{[Expression 11]}$$

Current $I_1$ is expressed by Expression 12 from equation (13).

$$I_1 = \frac{1}{2}\pi r(-B_1-B_2+B_3+B_4) - 2(\sqrt{2}-1)\pi r(B_2-B_1) \qquad \text{[Expression 12]}$$

$$= \frac{1}{2\cdot\frac{1}{\pi r}}(-B_1-B_2+B_3+B_4) -$$

$$\frac{1}{\frac{1}{\sqrt{2}-1}\cdot\frac{1}{2\pi r}}(B_2-B_1)$$

$$= \frac{1}{4\cdot\frac{2\sqrt{2}}{\sqrt{2}+1}\cdot\frac{1}{4\pi r}\left(1+\frac{1}{\sqrt{2}}\right)}(-B_1-B_2+B_3+B_4) -$$

$$\frac{1}{\frac{1}{\sqrt{2}-1}\cdot\frac{2\sqrt{2}}{\sqrt{2}+1}\cdot\frac{1}{4\pi r}\left(1+\frac{1}{\sqrt{2}}\right)}(B_2-B_1)$$

Therefore, Expression 13 is established about current $I_1$.
[Expression 13]

$$1/4(-B_1-B_2+B_3+B_4)-(\sqrt{2}-1)(B_2-B_1)=-2(\sqrt{2}-2)f(I_1)$$

If current $I_3$ is obtained like current $I_1$, Expression 14 is established about current $I_3$.

[Expression 14]

$$1/4(-B_1-B_2+B_3+B_4)+(\sqrt{2}-1)(B_2-B_1)=-2(\sqrt{2}-2)f(I_3)$$

Further, current $I_2$ is expressed by Expression 15 from equation (7).

$$I_2 = -\frac{2\sqrt{2}}{\sqrt{2}+2}\cdot\pi r(B_2-B_1) \quad\text{[Expression 15]}$$

$$= -\frac{1}{(\sqrt{2}+2)\cdot\frac{1}{2\pi r}\cdot\frac{1}{\sqrt{2}}}(B_2-B_1)$$

$$= -\frac{1}{\frac{2(\sqrt{2}+2)}{\sqrt{2}+1}\cdot\frac{1}{4\pi r}\cdot\left(1+\frac{1}{\sqrt{2}}\right)}(B_2-B_1)$$

Therefore, Expression 16 is established about current $I_2$.

$$B_2 - B_1 = -\frac{2(\sqrt{2}+2)}{\sqrt{2}+1}f(I_2) = -2\sqrt{2}\,f(I_2) \quad\text{[Expression 16]}$$

Consequently, it is possible to obtain a sensitivity 1.2 times or 1.4 times a sensitivity received by a single hall device located nearest a single measuring object conductor. Thus, a high sensitivity current measurement is enabled.

Seventh Embodiment

The seventh embodiment has a feature that it is capable of obtaining a current at a better accuracy than the current detecting apparatus of the third embodiment. Because the current detecting apparatus of the seventh embodiment is of the same structure as the current detecting apparatus shown in FIGS. 12, 13, an operation thereof will be described.

Here, the magnetism sensitive surface is disposed such that a magnetic field penetrating vertically beyond a paper face to the other side is positive. The four hall devices 21–24 are disposed at the same distance to the conductors which sandwich each of the hall devices. The distance is r.

Four variables, currents $I_1$–$I_4$ flowing through the four conductors 11–14 are obtained according to an equation obtained from four hall devices 21–24 and Kirchhoff formula.

First, magnetic flux $B_1$ received by the first hall device 21 is expressed by Expression 17.

$$B_1 = \frac{1}{4\pi r}\left[\left(1+\cos\frac{\pi}{4}\right)I_1 - \left(1+\cos\frac{\pi}{4}\right)I_2 - \right. \quad\text{[Expression 17]}$$
$$\left.\left(1+\cos\frac{3\pi}{4}\right)I_3 + \left(1+\cos\frac{3\pi}{4}\right)I_4\right] =$$
$$\frac{1}{4\sqrt{2}\,\pi r}\left[(1+\sqrt{2})I_1 - (1+\sqrt{2})I_2 - \right.$$
$$\left.(\sqrt{2}-1)I_3 + (\sqrt{2}-1)I_4\right]$$

A first term of Expression 17 indicates a magnetic flux received from current $I_1$ and a second term indicates a magnetic flux received from current $I_2$ and a third term indicates a magnetic flux received from current $I_3$ and a fourth term indicates a magnetic flux received from current $I_4$.

If a magnetic flux $B_2$ received by the second hall device 22 is obtained in the same manner as a magnetic flux received by the first hall device 21, magnetic flux $B_2$ is expressed by Expression 18.

$$B_2 = \frac{1}{4\pi r}\left[\left(1+\cos\frac{3\pi}{4}\right)I_1 + \left(1+\cos\frac{\pi}{4}\right)I_2 - \right. \quad\text{[Expression 18]}$$
$$\left.\left(1+\cos\frac{\pi}{4}\right)I_3 - \left(1+\cos\frac{3\pi}{4}\right)I_4\right] =$$
$$\frac{1}{4\sqrt{2}\,\pi r}\left[(\sqrt{2}-1)I_1 + (\sqrt{2}+1)I_2 - \right.$$
$$\left.(\sqrt{2}+1)I_3 - (\sqrt{2}-1)I_4\right]$$

A magnetic field $B_3$ received by the third hall device is expressed by Expression 19.

$$B_3 = \frac{1}{4\pi r}\left[-\left(1+\cos\frac{3\pi}{4}\right)I_1 + \left(1+\cos\frac{3\pi}{4}\right)I_2 + \right. \quad\text{[Expression 19]}$$
$$\left.\left(1+\cos\frac{\pi}{4}\right)I_3 - \left(1+\cos\frac{\pi}{4}\right)I_4\right] =$$
$$\frac{1}{4\sqrt{2}\,\pi r}\left[(-\sqrt{2}+1)I_1 + (\sqrt{2}-1)I_2 + \right.$$
$$\left.(\sqrt{2}+1)I_3 - (\sqrt{2}+1)I_4\right]$$

A magnetic field $B_4$ received by the fourth hall device 24 is expressed by Expression 20.

$$B_4 = \frac{1}{4\pi r}\left[-\left(1+\cos\frac{\pi}{4}\right)I_1 - \left(1+\cos\frac{3\pi}{4}\right)I_2 + \right. \quad\text{[Expression 20]}$$
$$\left.\left(1+\cos\frac{3\pi}{4}\right)I_3 + \left(1+\cos\frac{\pi}{4}\right)I_4\right] =$$
$$\frac{1}{4\sqrt{2}\,\pi r}\left[(-\sqrt{2}-1)I_1 + (-\sqrt{2}+1)I_2 + \right.$$
$$\left.(\sqrt{2}-1)I_3 + (\sqrt{2}+1)I_4\right]$$

Expression 21 is established from the above equations.

$$4\sqrt{2}\,\pi r\begin{pmatrix}B_1\\B_2\\B_3\\B_4\end{pmatrix} = \quad\text{[Expression 21]}$$

$$\begin{pmatrix}\sqrt{2}+1 & -\sqrt{2}-1 & -\sqrt{2}+1 & \sqrt{2}-1\\ \sqrt{2}-1 & \sqrt{2}+1 & -\sqrt{2}-1 & -\sqrt{2}+1\\ -\sqrt{2}+1 & \sqrt{2}-1 & \sqrt{2}+1 & -\sqrt{2}-1\\ -\sqrt{2}-1 & -\sqrt{2}+1 & \sqrt{2}-1 & \sqrt{2}+1\end{pmatrix}\begin{pmatrix}I_1\\I_2\\I_3\\I_4\end{pmatrix}$$

$$A = \begin{pmatrix}\sqrt{2}+1 & -\sqrt{2}-1 & -\sqrt{2}+1 & \sqrt{2}-1\\ \sqrt{2}-1 & \sqrt{2}+1 & -\sqrt{2}-1 & -\sqrt{2}+1\\ -\sqrt{2}+1 & \sqrt{2}-1 & \sqrt{2}+1 & -\sqrt{2}-1\\ -\sqrt{2}-1 & -\sqrt{2}+1 & \sqrt{2}-1 & \sqrt{2}+1\end{pmatrix}$$

$$\det(A) = (\sqrt{2}+1)^4 + (-\sqrt{2}-1)^4 + (-\sqrt{2}+1)^4 +$$
$$(\sqrt{2}-1)^4 - 2(\sqrt{2}+1)^2(-\sqrt{2}+1)^2 -$$
$$2(-\sqrt{2}-1)^2(\sqrt{2}-1)^2 = 64$$

$A_1$–$A_4$ are defined by Expression 22.

$$A_1 = \begin{pmatrix} 4\sqrt{2}\pi r B_1 & -\sqrt{2}-1 & -\sqrt{2}+1 & \sqrt{2}-1 \\ 4\sqrt{2}\pi r B_2 & \sqrt{2}+1 & -\sqrt{2}-1 & -\sqrt{2}+1 \\ 4\sqrt{2}\pi r B_3 & \sqrt{2}-1 & \sqrt{2}+1 & -\sqrt{2}-1 \\ 4\sqrt{2}\pi r B_4 & -\sqrt{2}+1 & \sqrt{2}-1 & \sqrt{2}+1 \end{pmatrix}$$ [Expression 22]

$$A_2 = \begin{pmatrix} \sqrt{2}+1 & 4\sqrt{2}\pi r B_1 & -\sqrt{2}+1 & \sqrt{2}-1 \\ \sqrt{2}-1 & 4\sqrt{2}\pi r B_2 & -\sqrt{2}-1 & -\sqrt{2}+1 \\ -\sqrt{2}+1 & 4\sqrt{2}\pi r B_3 & \sqrt{2}+1 & -\sqrt{2}-1 \\ -\sqrt{2}-1 & 4\sqrt{2}\pi r B_4 & \sqrt{2}-1 & \sqrt{2}+1 \end{pmatrix}$$

$$A_3 = \begin{pmatrix} \sqrt{2}+1 & -\sqrt{2}-1 & 4\sqrt{2}\pi r B_1 & \sqrt{2}-1 \\ \sqrt{2}-1 & \sqrt{2}+1 & 4\sqrt{2}\pi r B_2 & -\sqrt{2}+1 \\ -\sqrt{2}+1 & \sqrt{2}-1 & 4\sqrt{2}\pi r B_3 & -\sqrt{2}-1 \\ -\sqrt{2}-1 & -\sqrt{2}+1 & 4\sqrt{2}\pi r B_4 & \sqrt{2}+1 \end{pmatrix}$$

$$A_4 = \begin{pmatrix} \sqrt{2}+1 & -\sqrt{2}-1 & -\sqrt{2}+1 & 4\sqrt{2}\pi r B_1 \\ \sqrt{2}-1 & \sqrt{2}+1 & -\sqrt{2}-1 & 4\sqrt{2}\pi r B_2 \\ -\sqrt{2}+1 & \sqrt{2}-1 & \sqrt{2}+1 & 4\sqrt{2}\pi r B_3 \\ -\sqrt{2}-1 & -\sqrt{2}+1 & \sqrt{2}-1 & 4\sqrt{2}\pi r B_4 \end{pmatrix}$$

Expression 21 is solved using Cramer's rule to obtain respective currents. Current $I_1$ is obtained according to Expression 23.

$$I_1 = \frac{\det(A_1)}{\det(A)}$$ [Expression 23]

$$= \frac{4\sqrt{2}\pi r}{64}\{[(\sqrt{2}+1)^3 - (-\sqrt{2}+1)^2(\sqrt{2}+1)]B_1 +$$

$$[(\sqrt{2}-1)^3 - (-\sqrt{2}-1)^2(\sqrt{2}-1)]B_2 +$$

$$[(-\sqrt{2}+1)^3 - (\sqrt{2}+1)^2(-\sqrt{2}+1)]B_3 +$$

$$[(-\sqrt{2}-1)^3 - (\sqrt{2}-1)^2(-\sqrt{2}-1)]B_4\}$$

$$= \frac{\pi r}{2}[(\sqrt{2}+1)B_1 + (-\sqrt{2}+1)B_2 +$$

$$(\sqrt{2}-1)B_3 + (-\sqrt{2}-1)B_4]$$

$$= \frac{\pi r}{2}[(\sqrt{2}-1)(B_3 - B_2) + (\sqrt{2}+1)(B_1 - B_4)]$$

Likewise, current $I_2$ is obtained by Expression 24.

$$I_2 = \frac{\pi r}{2}[(-\sqrt{2}-1)B_1 + (\sqrt{2}+1)B_2 +$$ [Expression 24]

$$(-\sqrt{2}+1)B_3 + (\sqrt{2}-1)B_4]$$

$$= \frac{\pi r}{2}[(\sqrt{2}-1)(B_4 - B_3) + (\sqrt{2}+1)(B_2 - B_1)]$$

Likewise, both currents 13 and 14 are obtained by Expression 25.

$$I_3 = \frac{\pi r}{2}[(\sqrt{2}-1)B_1 + (-\sqrt{2}-1)B_2 +$$ [Expression 25]

$$(\sqrt{2}+1)B_3 + (-\sqrt{2}+1)B_4]$$

$$= \frac{\pi r}{2}[(\sqrt{2}-1)(B_1 - B_4) + (\sqrt{2}+1)(B_3 - B_2)]$$

$$I_4 = \frac{\pi r}{2}[(-\sqrt{2}+1)B_1 + (\sqrt{2}-1)B_2 +$$

$$(-\sqrt{2}-1)B_3 + (\sqrt{2}+1)B_4]$$

$$= \frac{\pi r}{2}[(\sqrt{2}-1)(B_2 - B_1) + (\sqrt{2}+1)(B_4 - B_3)]$$

As described above, currents $I_1$–$I_4$ can be calculated by multiplying a difference between magnetic fields received by two hall devices with a coefficient. Thus, even if the respective hall devices contain magnetic flux disturbance; this disturbance can be canceled, so that a highly accurate output detection is enabled. The above described currents $I_1$–$I_4$ are calculated by the operation processing circuit 30.

Next, a current amplification factor will be obtained. Current $I_1$ is expressed by Expression 26.

$$I_1 = \frac{\pi r}{2}[(\sqrt{2}-1)(B_3 - B_2) + (\sqrt{2}+1)(B_1 - B_4)]$$ [Expression 26]

$$I_1 = \frac{1}{\frac{2}{\pi r} \cdot \frac{1}{\sqrt{2}-1}}(B_3 - B_2) + \frac{1}{\frac{2}{\pi r} \cdot \frac{1}{\sqrt{2}+1}}(B_1 - B_4)$$

$$= \frac{1}{\frac{8}{4\pi r} \cdot (\sqrt{2}+1)}(B_3 - B_2) + \frac{1}{\frac{8}{4\pi r} \cdot (\sqrt{2}-1)}(B_1 - B_4)$$

$$= \frac{1}{8\sqrt{2} \cdot \frac{1}{4\pi r} \cdot \left(1 + \frac{1}{\sqrt{2}}\right)}(B_3 - B_2) +$$

$$\frac{1}{8\sqrt{2} \cdot \frac{\sqrt{2}-1}{\sqrt{2}+1} \cdot \frac{1}{4\pi r} \cdot \left(1 + \frac{1}{\sqrt{2}}\right)}(B_1 - B_4)$$

A magnetic flux $B_1$ is defined by Expression 27.

$$B_1 = \frac{1}{4\pi r}\left(1 + \frac{1}{\sqrt{2}}\right)I_1 = f(I_1)$$ [Expression 27]

If Expression 26 is transformed by using Expression 27, Expression 28 is obtained.

$$B_3 - B_2 + \frac{\sqrt{2}+1}{\sqrt{2}-1}(B_1 - B_4) = 8\sqrt{2}f(I_1)$$ [Expression 28]

As a result of operation based on Expression 28, a sensitivity about 11.3 times a sensitivity received by a single hall device located nearest a single measuring object conductor is obtained from that measuring object conductor. Thus, a highly accurate current measurement is enabled.

Eighth Embodiment

The eighth embodiment has a feature that it is capable of obtaining a current at a better accuracy than the current detecting apparatus of the fourth embodiment. Because the current detecting apparatus of the eighth embodiment is of the same structure as the current detecting apparatus shown in FIGS. 14, 15, an operation thereof will be described.

An equation based on expression 29 is established about variables, currents $I_1$–$I_3$ and magnetic fields $B_1$–$B_3$ according to Biot—Savart's law.

[Expression 29]

$$B_1 = \frac{1}{4\pi r}\left[-\left(1+\frac{1}{\sqrt{2}}\right)I_1 + \left(1+\frac{1}{\sqrt{2}}\right)I_2\right] \quad (1)$$

$$B_2 = \frac{1}{4\pi r}\left[-\left(1-\frac{1}{\sqrt{2}}\right)I_1 - \left(1+\frac{1}{\sqrt{2}}\right)I_2\right] \quad (2)$$

$$B_3 = \frac{1}{4\pi r}\left[\left(1+\frac{1}{\sqrt{2}}\right)I_1 + \left(1-\frac{1}{\sqrt{2}}\right)I_2\right] \quad (3)$$

$$0 = I_1 + I_2 + I_3 \quad (4)$$

If equation (1) is subtracted from equation (3) of Expression 29, Expression 30 is obtained.
[Expression 30]

$$4\sqrt{2}\pi r(B_3-B_1)=2(\sqrt{2}+1)I_1-2I_2 \quad (5)$$

Further, if equation (1) is subtracted from equation (2) of Expression 29, Expression 31 is obtained.
[Expression 31]

$$4\sqrt{2}\pi r(B_2-B_1)=2I_1-2(\sqrt{2}+1)I_2 \quad (6)$$

If both sides of equation (6) of Expression 31 are multiplied by $(2^{1/2}+1)$ times, Expression 32 is obtained.
[Expression 32]

$$4(\sqrt{2}+2)\pi r(B_2-B_1)=2(\sqrt{2}+1)I_1-2(\sqrt{2}+1)^2 I_2 \quad (7)$$

If equation (5) is subtracted from equation (7) of Expression 32, Expression 33 is obtained.
[Expression 33]

$$\pi r[-8S_1+(4\sqrt{2}+8)B_2-4\sqrt{2}B_3]=-(4+4\sqrt{2})I_2$$

Thus, current $I_2$ is expressed by Expression 34.

[Expression 34]

$$I_2 = -\frac{\pi r[-2B_1+(\sqrt{2}+2)B_2-\sqrt{2}B_3]}{\sqrt{2}+1}$$

$$= \pi r[(2\sqrt{2}-2)B_1+\sqrt{2}B_2+(\sqrt{2}-2)B_3]$$

$$= \pi r[\sqrt{2}(B_2-B_1)+(\sqrt{2}-2)(B_3-B_1)] \quad (8)$$

Further, if equation (8) is substituted into equation (6), Expression 35 is obtained to obtain current $I_1$.
[Expression 35]

$$I_1=\pi r[(2-2\sqrt{2})B_1+(\sqrt{2}-2)B_2+\sqrt{2}B_3]=\pi r[\sqrt{2}(B_3-B_1)+(\sqrt{2}-2)(B_2-B_1)] \quad (9)$$

Further, if equation (2) is added to equation (1), Expression 36 is obtained.
[Expression 36]

$$4\sqrt{2}\pi r(B_1+B_2)=-2\sqrt{2}I_1 \quad (10)$$

$$4\sqrt{2}\pi r(B_1+B_3)=2\sqrt{2}I_2 \quad (11)$$

Further, if equations (10), (11) are substituted into equation (4), Expression 37 is obtained to obtain current I3.
[Expression 37]

$$I_3=-I_1-I_2=2\pi r(B_2-B_3)$$

As described above, currents $I_1$, $I_2$, $I_3$ can be calculated by multiplying a difference between magnetic fields received by two hall devices with a coefficient. Thus, because even if the respective hall devices contain the magnetic flux disturbance, this disturbance can be canceled, a highly accurate output detection is enabled. Meanwhile, the above described currents $I_1$, $I_2$, $I_3$ are calculated by the operation processing circuit 30.

Ninth Embodiment

This ninth embodiment has a feature that it is capable of obtaining a current at a better accuracy than the current detecting apparatus of the fifth embodiment. Because the current detecting apparatus of the ninth embodiment is of the same configuration as the current detecting apparatus shown in FIGS. 16, 17, an operation thereof will be described.

An equation based on Expression 38 is established about variables, currents $I_i$–$I_4$ and magnetic fields $B_i$–$B_4$ because of Biot—Savart's law.

[Expression 38]

$$B_1 = \frac{1}{4\pi r}\left[\left(1+\frac{1}{\sqrt{2}}\right)I_2 - \left(1+\frac{1}{\sqrt{2}}\right)I_1 + \left(1-\frac{1}{\sqrt{2}}\right)I_3\right] \quad (1)$$

$$B_2 = \frac{1}{4\pi r}\left[-\left(1+\frac{1}{\sqrt{2}}\right)I_2 - \left(1-\frac{1}{\sqrt{2}}\right)I_1 + \left(1+\frac{1}{\sqrt{2}}\right)I_3\right] \quad (2)$$

$$B_3 = \frac{1}{4\pi r}\left[-\left(1-\frac{1}{\sqrt{2}}\right)I_2 + \left(1-\frac{1}{\sqrt{2}}\right)I_1 - \left(1+\frac{1}{\sqrt{2}}\right)I_3\right] \quad (3)$$

$$B_4 = \frac{1}{4\pi r}\left[\left(1-\frac{1}{\sqrt{2}}\right)I_2 + \left(1+\frac{1}{\sqrt{2}}\right)I_1 - \left(1-\frac{1}{\sqrt{2}}\right)I_3\right] \quad (4)$$

$$0 = I_1 + I_2 + I_3 + I_4 \quad (5)$$

Because Expression 38 has five equations for four variables, its solution is not single. It is necessary to obtain a solution capable of canceling disturbance noise. First, currents $I_i$–$I_3$ are obtained according to equations (1)–(4) of Expression 38 and then the obtained current $I_i$ is substituted into the equation (5) to obtain current $I_4$.

First, equation (1)–equation (2)–equation (3)+equation (4) is operated to obtain Expression 39. Then, current $I_2$ is obtained.

[Expression 39]

$$B_2 - B_3 - B_4 + B_1 = \frac{1}{\pi r}I_2$$

$$I_2 = \pi r(B_2 - B_3 - B_4 + B_1)$$

Next, equation (4) is subtracted from equation (1) to obtain Expression 40.
[Expression 40]

$$4\sqrt{2}\pi r(B_2-B_1)=2\sqrt{2}I_2-2(\sqrt{2}+1)I_1=2\sqrt{2}\pi r(B_2-B_3-B_4+B_1)-2(\sqrt{2}+1)I_1$$

Therefore, current $I_1$ is expressed by Expression 41.

$$I_1 = \frac{\sqrt{2}\,\pi r(-B_2 - B_3 - B_4 + 3B_1)}{\sqrt{2}+1} \qquad \text{[Expression 41]}$$

Likewise, current $I_3$ and current $I_4$ are expressed by expression 42.

$$I_3 = \frac{\sqrt{2}\,\pi r(B_2 + B_3 - 3B_4 + B_1)}{\sqrt{2}+1} \qquad \text{[Expression 42]}$$

$$I_4 = -(I_1 + I_2 + I_3) =$$

$$-\pi r B_2 + \pi r B_3 + \left(1 + \frac{\sqrt{2}}{\sqrt{2}+1} + \frac{3\sqrt{2}}{\sqrt{2}+1}\right)\pi r B_4 -$$

$$\left(1 + \frac{3\sqrt{2}}{\sqrt{2}+1} + \frac{\sqrt{2}}{\sqrt{2}+1}\right)\pi r B_1 =$$

$$\pi r\left[B_3 - B_2 + \frac{5\sqrt{2}+1}{\sqrt{2}+1}(B_4 - B_1)\right]$$

As shown above, currents $I_1$–$I_4$ can be calculated by multiplying a difference between magnetic fields received by two hall devices with a coefficient. Thus, even if the respective hall devices include magnetic flux disturbance, this disturbance can be canceled. Thus, a highly accurate output detection is enabled. Meanwhile, the above calculations on the currents $I_1$–$I_4$ are carried out by the operation processing circuit 30.

Tenth Embodiment

Figure 19:
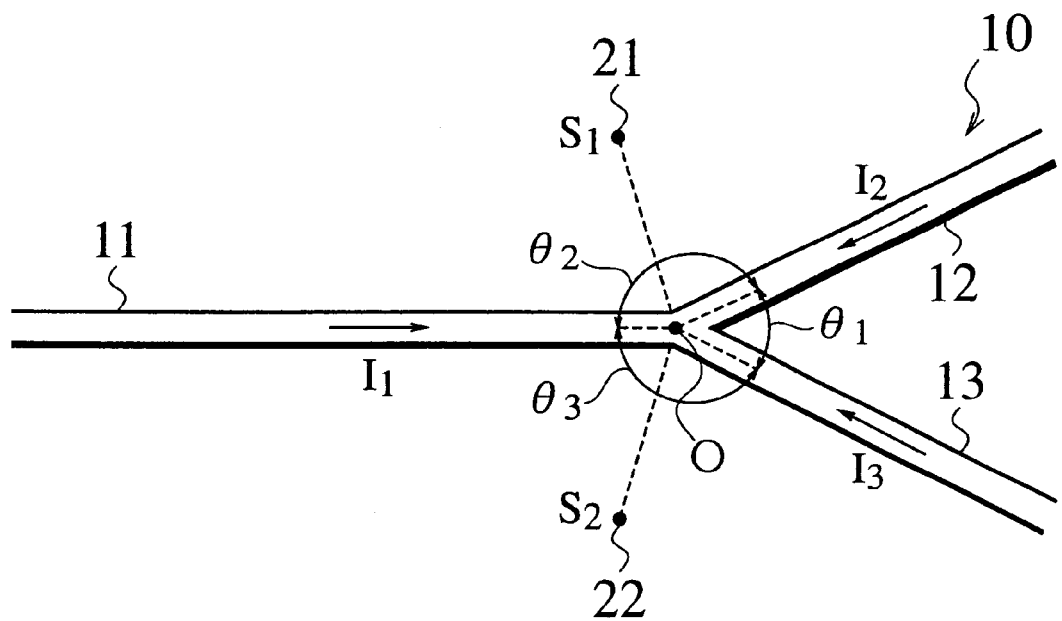
FIG. 19 is a plan view showing a structure of the sensor portion of the current detecting apparatus according to a tenth embodiment of the present invention.

According to the tenth embodiment, n of the present invention is "3" and m is "2". Tow angles of three angles formed by the first-third conductors are equal while the remaining one is different from the aforementioned two angles. FIG. 19 is a perspective view showing a structure of a sensor portion of the current detecting apparatus according to the tenth embodiment. This sensor portion is comprised of the conductor 10, first hall device 21, and second hall device 22. Usually, these components are incorporated in an electric connection box (not shown). In this first embodiment, no magnetism collecting core is used.

As shown in FIG. 19, the conductor 10 is comprised of the first conductor 11, second conductor 12 and third conductor 13 disposed in three directions from the branch point O on a flat plane including the branch point O. The first conductor 11, second conductor 12 and the third conductor 12 correspond to n conductors of the present invention. Ends of the respective conductors are connected to the branch point O.

In the meantime, the conductor 10 may be composed by connecting ends of the three separate conductors, namely, the first conductor 11, second conductor 12 and third conductor 13 at the branch point O and instead by forming integrally the first conductor 11, second conductor 12 and third conductor 13. Further, it is also permissible to compose this conductor 10 by forming a wiring pattern having three branch routes including the first conductor 11, second conductor 12 and third conductor 13 on a substrate.

The first hall device 21 and second hall device 22 correspond to m electromagnetic transducers of the present invention. Each hall device generates a voltage (hall voltage) signal corresponding to a density of magnetic flux entering its magnetism sensitive surface. A predetermined current is supplied to each hall device through a lead (not shown) and the voltage signal generated in each hall device is fetched out through a lead (not shown).

Positions where the respective hall devices are disposed are determined as follows. That is, the first hall device 21 is disposed between the first conductor 11 and the second conductor 12 and at the same distance from these conductors. The second hall device 22 is disposed between the first conductor 11 and the third conductor 13 and at the same distance from these conductors. The magnetism sensitive surfaces of the respective hall devices substantially coincide with the plane including the branch point O and are disposed such that they are directed in the same direction.

Next, an operation of the sensor portion of the current detecting apparatus according to the tenth embodiment of the present invention having such a structure will be described.

Assume that a current flowing through the first conductor 11 which is a measuring object conductor is $I_1$, a current flowing through the second conductor 12 after branch is $I_2$ and a current flowing through the third conductor 13 is $I_3$. Then, assume that an angle between the second conductor 12 and the third conductor 13 is $74_1$, an angle between the first conductor 11 and the second conductor 12 is $\theta_2$, and an angle between the first conductor 11 and the third conductor 13 is $74_3$. At this time, Expression 43 is established.

$$\theta_2 = \theta_3 = \frac{1}{2}(2\pi - \theta_1) = \pi - \frac{1}{2}\theta_1 \quad (1) \qquad \text{[Expression 43]}$$

At this time, Expression 44 is established because of Kirchhoff formula.

[Expression 44]

$$I_1 + I_2 + I_3 = 0 \qquad (2)$$

Next, calculation of magnetic fields received by the hall devices 21; 22 will be described. First, calculation of the magnetic field received by the first hall device 21 will be described with reference to FIG. 19. The magnetic field received by the first hall device is calculated for every current. A magnetic field which the first hall device 21 receives from the current $I_1$ is expressed by Expression 45.

$$\frac{I_1}{4\pi r}\left(\cos\frac{\theta_2}{2} + \cos\theta'\right) \qquad \text{[Expression 45]}$$

Where $\theta'$ is an angle formed by the first conductor 11 and a line formed by the left end portion of the first conductor 11 and the first hall device 21, and r is a length of a vertical line from the first hall device 21 to the first conductor 11. When r is small enough as compared to the length of the first conductor 11, $\theta'=0$, therefore $\cos\theta'=1$.

Thus, the aforementioned magnetic field is expressed by Expression 46.

$$\frac{I_1}{4\pi r}\left(1 + \cos\frac{\theta_2}{2}\right) \qquad \text{[Expression 46]}$$

Further, Expression 47 is established by equation (1) of Expression 43 so that a magnetic field which the first hall device 21 receives from the current $I_1$ is obtained.

$$\frac{I_1}{4\pi r}\left\{1 + \cos\left(\frac{1}{2}\left(\pi - \frac{1}{2}\theta_1\right)\right)\right\} = \qquad \text{[Expression 47]}$$

$$\frac{I_1}{4\pi r}\left\{1 + \cos\left(\frac{1}{2}\pi - \frac{1}{4}\theta_1\right)\right\} =$$

-continued
$$\frac{I_1}{4\pi r}\left(1+\cos\frac{1}{2}\pi\cdot\cos\frac{1}{4}\theta_1+\sin\frac{1}{2}\pi\cdot\sin\frac{1}{4}\theta_1\right)=$$
$$\frac{I_1}{4\pi r}\left(1+\sin\frac{1}{4}\theta_1\right)$$

Like calculation of magnetic field which the first hall device receives from the current $I_1$, a magnetic field which the first hall device 21 receives from the current 12 is calculated. That magnetic field is expressed by Expression 48.

$$-\frac{I_2}{4\pi r}\left(1+\sin\frac{1}{4}\theta_1\right) \qquad [\text{Expression 48}]$$

Figure 20:
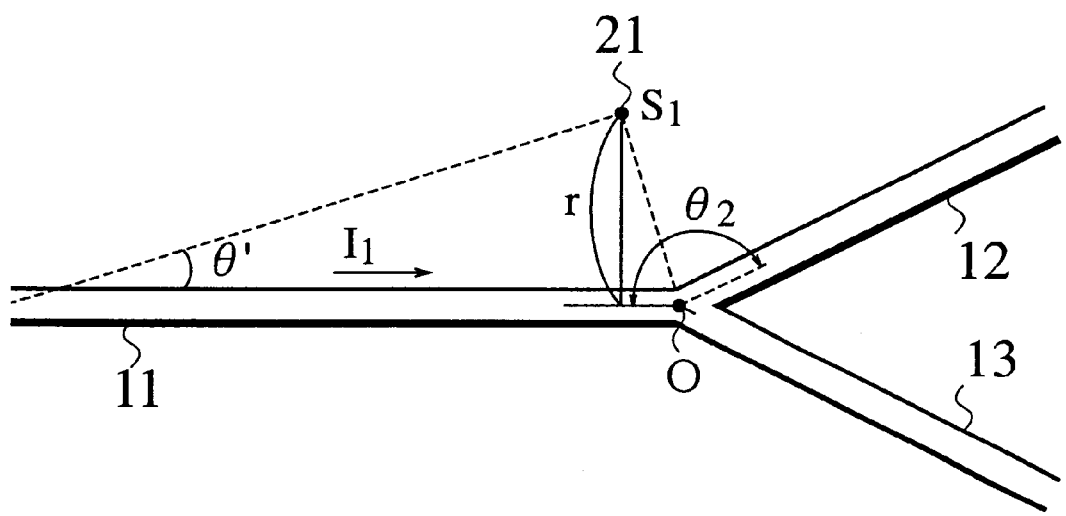
FIG. 20 is a diagram for explaining a magnetic field received by a first hall device of the current detecting apparatus shown in FIG. 19 from a current flowing through the first conductor.

Next, calculation of the magnetic field which the first hall device 21 receives from the current $I_3$ will be described with reference to FIG. 20. At this time, the magnetic field is expressed by Expression 49.

$$\frac{I_3}{4\pi r}\left[\cos\left(\theta_1+\frac{1}{2}\theta_2\right)+\cos\theta'\right] \qquad [\text{Expression 49}]$$

Here, Expression 50 is obtained from equation (1) and $\cos\theta'=1$. As a result, a magnetic field which the first hall device 21 receives from the current $I_2$ is obtained.

$$-\frac{I_3}{4\pi r}\left\{1+\cos\left[\theta_1+\frac{1}{2}\left(\pi-\frac{1}{2}\theta_1\right)\right]\right\}= \qquad [\text{Expression 50}]$$
$$-\frac{I_3}{4\pi r}\left[1+\cos\left(\frac{1}{2}\pi+\frac{3}{4}\theta_1\right)\right]=$$
$$-\frac{I_3}{4\pi r}\left(1+\cos\frac{1}{2}\pi\cdot\cos\frac{3}{4}\theta_1-\sin\frac{1}{2}\pi\cdot\sin\frac{3}{4}\theta_1\right)=$$
$$-\frac{I_3}{4\pi r}\left(1-\sin\frac{3}{4}\theta_1\right)$$

Next, the obtained three magnetic fields are overlapped with each other so as to obtain the magnitude of a magnetic field which the first hall device 21 receives. Here, if $\theta_1>2\pi/3$, because $\theta_1+\theta_2/2>\pi$ and a direction of a magnetic field received from $I_3$ is inverse, operations are carried out about two cases of $0<\theta_1\leq 2\pi/3$ and $2\pi/3\leq\theta_1 23\ 2\pi$ separately, then synthetic magnetic field is obtained.

First, in case of $0<\theta_1<2\pi/3$, the synthetic magnetic field is expressed by Expression 51.

$$\frac{1}{4\pi r}\left(1+\sin\frac{1}{4}\theta_1\right)I_1- \qquad [\text{Expression 51}]$$
$$\frac{1}{4\pi r}\left(1+\sin\frac{1}{4}\theta_1\right)I_2-\frac{1}{4\pi r}\left(1-\sin\frac{3}{4}\theta_1\right)I_3=$$
$$\frac{1}{4\pi r}\left[I_1-I_2-I_3+\sin\frac{1}{4}\theta_1\cdot(I_1-I_2)+\sin\frac{3}{4}\theta_1\cdot I_3\right]$$

In case of $2\pi/3\leq\theta_1\leq 2\pi$ the synthetic magnetic field is expressed by Expression 52.

$$\frac{1}{4\pi r}\left(1+\sin\frac{1}{4}\theta_1\right)I_1- \qquad [\text{Expression 52}]$$
$$\frac{1}{4\pi r}\left(1+\sin\frac{1}{4}\theta_1\right)I_2+\frac{1}{4\pi r}\left(1-\sin\frac{3}{4}\theta_1\right)I_3=$$

-continued
$$\frac{1}{4\pi r}\left[I_1-I_2+I_3+\sin\frac{1}{4}\theta_1\cdot(I_1-I_2)-\sin\frac{3}{4}\theta_1\cdot I_3\right]$$

A synthetic magnetic field which the second hall device receives is obtained like calculation of the synthetic magnetic field which the first hall device 21 receives. In case of $0<\theta_1\leq 2\pi/3$, the synthetic magnetic field is expressed by Expression 53.

$$-\frac{1}{4\pi r}\left(1+\sin\frac{1}{4}\theta_1\right)I_1+ \qquad [\text{Expression 53}]$$
$$\frac{1}{4\pi r}\left(1+\sin\frac{1}{4}\theta_1\right)I_3+\frac{1}{4\pi r}\left(1-\sin\frac{3}{4}\theta_1\right)I_2=$$
$$\frac{1}{4\pi r}\left[-I_1+I_2+I_3+\sin\frac{1}{4}\theta_1\cdot(-I_1+I_3)-\sin\frac{3}{4}\theta_1\cdot I_2\right]$$

In case of $2\theta/3\leq\theta_1\leq 2\theta$, the synthetic magnetic field is expressed by Expression 54.

$$-\frac{1}{4\pi r}\left(1+\sin\frac{1}{4}\theta_1\right)I_1+ \qquad [\text{Expression 54}]$$
$$\frac{1}{4\pi r}\left(1+\sin\frac{1}{4}\theta_1\right)I_3-\frac{1}{4\pi r}\left(1-\sin\frac{3}{4}\theta_1\right)I_2=$$
$$\frac{1}{4\pi r}\left[-I_1-I_2+I_3+\sin\frac{1}{4}\theta_1\cdot(-I_1+I_3)+\sin\frac{3}{4}\theta_1\cdot I_2\right]$$

Further, a difference of magnetic field between the synthetic magnetic field of the first hall device 21 and the synthetic magnetic field of the second hall device 22 will be obtained. In case of $0<\theta_1\leq 2\pi/3$, the difference of the magnetic field is expressed by Expression 55.

$$\frac{1}{4\pi r}\left(4+3\cdot\sin\frac{1}{4}\theta_1-\sin\frac{3}{4}\theta_1\right)I_1 \qquad [\text{Expression 55}]$$
2) $2/3\pi\leq\theta_1\leq 2\pi$ In case of $2\pi/3\geq\theta_1\leq 2\pi$, the difference of the magnetic field is expressed by Expression 56.

$$\frac{1}{4\pi r}\left(2+3\cdot\sin\frac{1}{4}\theta_1+\sin\frac{3}{4}\theta_1\right)I_1 \qquad [\text{Expression 56}]$$

Figure 21:
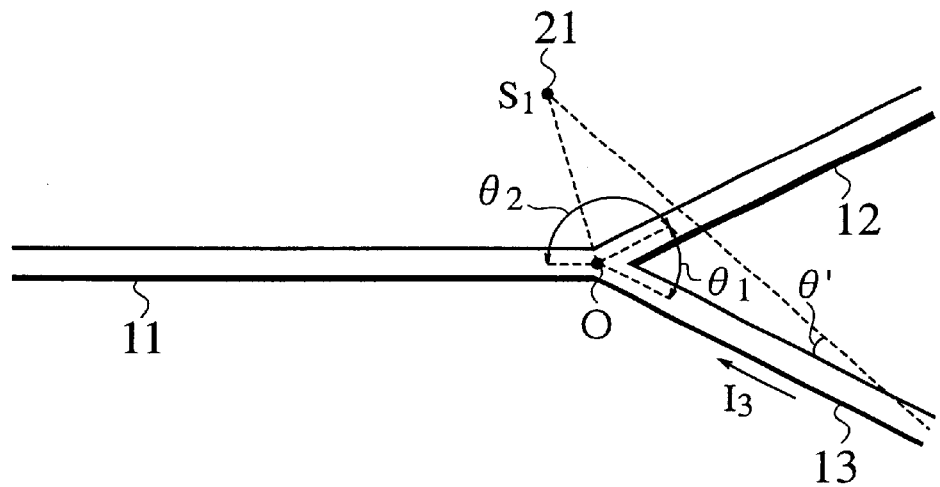
FIG. 21 is a diagram for explaining a magnetic field received by the first hall device of the current detecting apparatus shown in FIG. 19 from a current flowing through the third conductor.

If $I_1/(4*\pi*r)$ is normalized to 1 and a value of the difference of the magnetic field is a function of $\theta_1$, the difference of the magnetic field changes corresponding to changes of $\theta_1$ as shown in FIG. 21. This difference of the magnetic field becomes maximum when $\theta_1=\pi$.

Next, dividing ratio of the currents $I_1, I_2, I_3$ are calculated. Assuming $I_2/I_1=k$, it comes that $I_2=kI_1, I_3=-(1+k)I_1$ and this k only has to be obtained. First, in case of $0<\theta_1\leq 2\pi/3$, a magnetic field $S_1$ which the hall device 21 receives is expressed by Expression 57.

$$S_1=\frac{1}{4\pi r}\left[2+\sin\frac{1}{4}\theta_1-\sin\frac{3}{4}\theta_1+\left(\sin\frac{1}{4}\theta_1+\sin\frac{3}{4}\theta_1\right)\kappa\right]I_1 \qquad [\text{Expression 57}]$$

If it is intended to obtain k by this Expression 57, k is expressed by Expression 58.

$$\kappa=-\frac{1}{\sin\frac{1}{4}\theta_1+\sin\frac{3}{4}\theta_1}\left[\frac{4\pi rS_1}{I_1}-\left(2+\sin\frac{1}{4}\theta_1-\sin\frac{3}{4}\theta_1\right)\right] \qquad [\text{Expression 58}]$$

If magnetic field $S_2$ received by the hall device 22 is subtracted from magnetic field $S_1$ received by the hall device 21, Expression 59 is obtained.

$$S_1 - S_2 = \frac{1}{4\pi r}\left(4 + 3\cdot\sin\frac{1}{4}\theta_1 - \sin\frac{3}{4}\theta_1\right)I_1 \qquad \text{[Expression 59]}$$

As a result, the current $I_1$ is expressed by Expression 60.

$$I_1 = \frac{4\pi r(S_1 - S_2)}{4 + 3\sin\frac{1}{4}\theta_1 - \sin\frac{3}{4}\theta_1} \qquad \text{[Expression 60]}$$

If the current $I_1$ obtained by this Expression 60 is substituted into Expression 58, k is expressed by Expression 61.

$$\kappa = \qquad \text{[Expression 61]}$$

$$-\frac{4 + 3\sin\frac{1}{4}\theta_1 - \sin\frac{3}{4}\theta_1}{\sin\frac{1}{4}\theta_1 + \sin\frac{3}{4}\theta_1}\cdot\frac{S_1}{S_1 - S_2} + \frac{2 + \sin\frac{1}{4}\theta_1 - \sin\frac{3}{4}\theta_1}{\sin\frac{1}{4}\theta_1 + \sin\frac{3}{4}\theta_1}$$

If the branching angle $\theta_1$ is predetermined, the currents $I_1$, k can be obtained by the magnetic fields S1, S2 which the two hall devices 21, 22 receive. By using the obtained k, the currents $I_2$, $I_3$ can be obtained. Here, if $\theta_1=2/3\pi(\theta_1=\theta_2=\theta_3)$, k is expressed by Expression 62.

$$\kappa = -3\frac{S_1}{S_1 - S_2} + 1 \qquad \text{[Expression 62]}$$

By this operation, the currents $I_1$, $I_2$, $I_3$ flowing through three conductors from magnetic fields received by the two hall devices 21, 22 can be obtained.

Next, in case of $2\pi/3 \leq \theta_1 \leq 2\pi$, the magnetic field $S_1$ and k are expressed by Expression 63.

$$S_1 = \qquad \text{[Expression 63]}$$

$$-\frac{1}{4\pi r}\left[\sin\frac{1}{4}\theta_1 + \sin\frac{3}{4}\theta_1 + \left(-2 - \sin\frac{1}{4}\theta_1 + \sin\frac{3}{4}\theta_1\right)\kappa\right]I_1$$

$$\kappa = -\frac{1}{2 + \sin\frac{1}{4}\theta_1 - \sin\frac{3}{4}\theta_1}\left(\frac{4\pi r}{I_1} - \sin\frac{1}{4}\theta_1 - \sin\frac{3}{4}\theta_1\right)$$

If the magnetic field S2 is subtracted from the magnetic field $S_1$, Expression 64 is obtained.

$$S_1 - S_2 = \frac{1}{4\pi r}\left(2 + 3\sin\frac{1}{4}\theta_1 + \sin\frac{3}{4}\theta_1\right)I_1 \qquad \text{[Expression 64]}$$

The current $I_1$ is expressed by Expression 65 because of Expression 64.

$$I_1 = \frac{4\pi r(S_1 - S_2)}{2 + 3\sin\frac{1}{4}\theta_1 + \sin\frac{3}{4}\theta_1} \qquad \text{[Expression 65]}$$

If the current $I_1$ of this Expression 65 is substituted into k of Expression 63, k is expressed by Expression 66.

$$\kappa = \qquad \text{[Expression 66]}$$

$$-\frac{2 + 3\sin\frac{1}{4}\theta_1 + \sin\frac{3}{4}\theta_1}{2 + \sin\frac{1}{4}\theta_1 - \sin\frac{3}{4}\theta_1}\cdot\frac{S_1}{S_1 - S_2} + \frac{\sin\frac{1}{4}\theta_1 + \sin\frac{3}{4}\theta_1}{2 + \sin\frac{1}{4}\theta_1 - \sin\frac{3}{4}\theta_1}$$

At angle $\theta_1=\pi$ which maximizes the sensitivity, k is expressed by Expression 67.

$$\kappa = -(1 + 2\sqrt{2})\cdot\frac{S_1}{S_1 - S_2} + \frac{1}{\sqrt{2}} \qquad \text{[Expression 67]}$$

By this operation, the currents $I_1$, $I_2$, $I_3$ flowing through three conductors from magnetic fields which the two hall devices 21, 22 receive can be obtained.

Eleventh Embodiment

Figure 22:
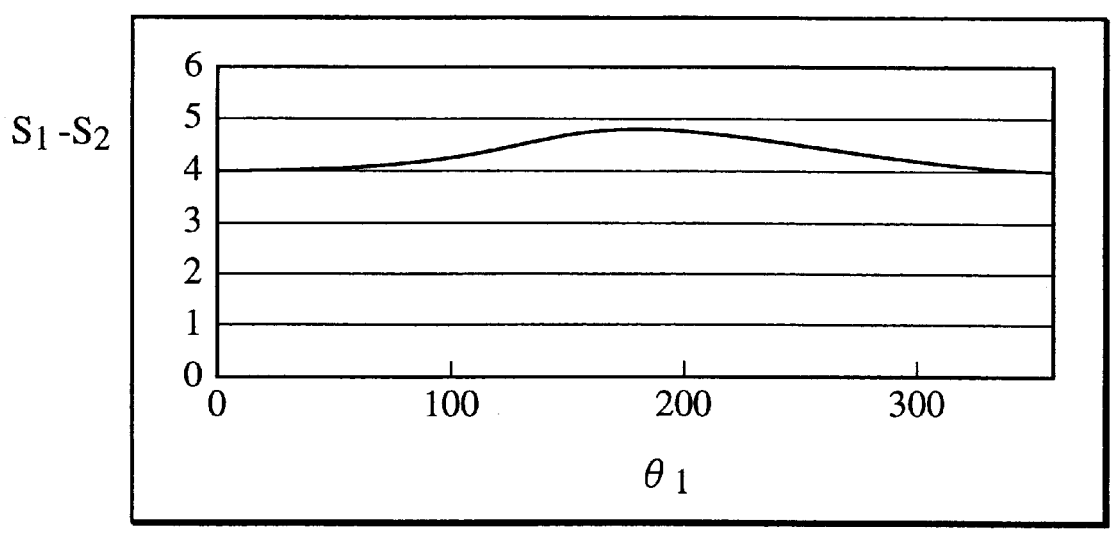
FIG. 22 is a diagram showing changes of sensitivity with respect to changes of angle formed between the second conductor and the third conductor in the current detecting apparatus shown in FIG. 19.

According to the eleventh embodiment n of the present invention is "3" and m is "2". In this example, three angles formed by the branched first-third conductors are different from each other. FIG. 22 is a perspective view showing a structure of the sensor portion of the current detecting apparatus according to the eleventh embodiment of the present invention. This sensor portion is comprised of the conductor 10, first hall device 21 and second hall device 22. Usually, these components are incorporated in an electric connecting box (not shown). In this eleventh embodiment, no magnetism collecting core is employed.

As shown in FIG. 22, the conductor 10 is comprised of the first conductor 11, second conductor 12 and third conductor 13 disposed in three directions from the branch point O on a flat plane including the branch point O. The first conductor 11, second conductor 12 and the third conductor 13 correspond to n conductors of the present invention. Ends of the respective conductors are connected to the branch point O.

In the meantime, the conductor 10 may be composed by connecting ends of the three separate conductors, namely, the first conductor 11, second conductor 12 and third conductor 13 at the branch point O and instead by forming integrally the first conductor 11, second conductor 12 and third conductor 13. Further, it is also permissible to compose this conductor 10 by forming a wiring pattern having three branch routes including the first conductor 11, second conductor 12 and third conductor 13 on a substrate.

The first hall device 21 and second hall device 22 correspond to m electromagnetic transducers of the present invention. Each hall device generates a voltage (hall voltage) signal corresponding to a density of magnetic flux entering its magnetism sensitive surface (magnetic flux detecting surface). A predetermined current is supplied to each hall device through a lead (not shown) and the voltage signal generated in each hall device is fetched out through a lead (not shown).

Positions where the respective hall devices are disposed are determined as follows. That is, the first hall device 21 is disposed between the second conductor 12 and the third conductor 13 and at the same distance from these conductors. That is, the first hall device 21 is disposed at an angle which divides an angle $\theta_1$ formed by the second conductor 12, branch point O and third conductor 13 to two sections. The second hall device 22 is disposed between the first conductor 11 and second conductor 12 and at the same distance from these conductors. That is, the second hall device 22 is disposed at an angle which divides an angle $\theta_2$ formed by the first conductor 11, branch point O and second conductor 12 to two sections. For both the hall devices 21, 22, a distance r from each of the conductors which sandwich a hall device to the hall device is assumed to be equal. Further, the magnetism sensitive surfaces of the respective hall devices substantially coincide with a flat plane including the branch point O and are directed in the same direction.

Next, an operation of the sensor portion of the current detecting apparatus according to the eleventh embodiment of the present invention having such a structure will be described.

First, due to Kirchhoff formula, $I_1+I_2+I_3=0$ and $\theta_1+\theta_2+\theta_3=2\pi$. If r is considered to be a constant determined upon design, the variables are three current values $I_1$–$I_3$. Because there are three equations, that is, magnetic fields $S_1$, $S_2$ which the hall devices 21, 22 receive and Kirchhoff formula, the three variables $I_1$–$I_3$ can be determined by two hall devices 21, 22.

Figure 23:
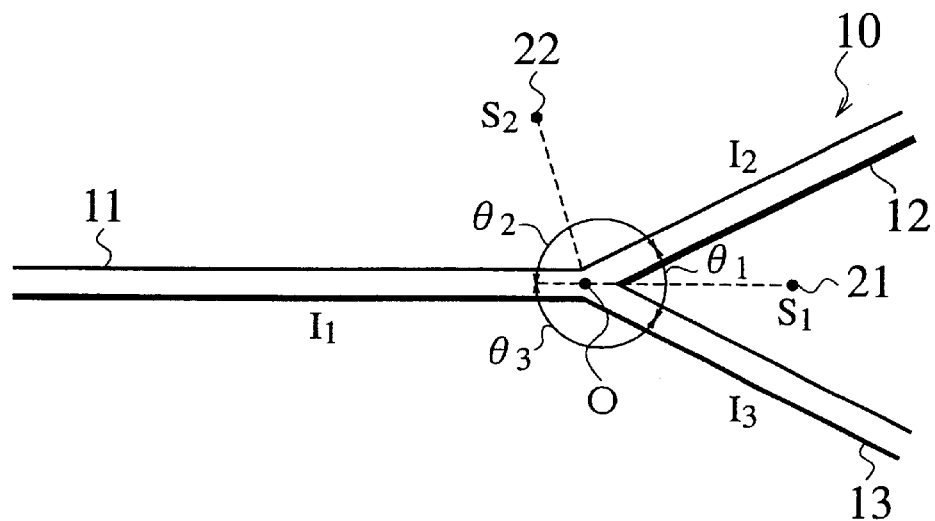
FIG. 23 is a plan view showing a structure of the sensor portion of the current detecting apparatus according to an eleventh embodiment of the present invention.

Calculation of three variables $I_1$–$I_3$ will be described about each case depending on setting of the angles $\theta_1$, $\theta_2$. First, FIG. 23 shows a structure of the sensor portion in case of $0 \leq \theta_1 < 2\pi + \theta_2 \leq \pi$ and $0 \leq \theta_1 + \theta_2/2 \leq \pi$. A magnetic field which the first hall device 21 receives at this time will be obtained. First, the magnetic field which the first hall device 21 receives from the current $I_1$ is expressed by Expression 68.

$$-\frac{1}{4\pi r}\left[1+\cos\left(\theta_2+\frac{1}{2}\theta_1\right)\right]I_1 = -\frac{1}{4\pi r}\left(1+\cos\theta_2\cdot\cos\frac{1}{2}\theta_1-\sin\theta_2\cdot\sin\frac{1}{2}\theta_1\right)I_1 = \quad \text{[Expression 68]}$$

$$-\frac{1}{4\pi r}\left[1+\cos\frac{1}{2}\theta_1\cdot\left(2\cos^2\frac{1}{2}\theta_2-1\right)-2\sin\frac{1}{2}\theta_1\cdot\sin\frac{1}{2}\theta_2\cdot\cos\frac{1}{2}\theta_2\right]I_1 =$$

$$-\frac{1}{4\pi r}\left[1-\cos\frac{1}{2}\theta_1+2\cos\frac{1}{2}\theta_2\cdot\left(\cos\frac{1}{2}\theta_1\cdot\cos\frac{1}{2}\theta_2-\sin\frac{1}{2}\theta_1\cdot\sin\frac{1}{2}\theta_2\right)\right]I_1 =$$

$$-\frac{1}{4\pi r}\left[1-\cos\frac{1}{2}\theta_1+2\cos\frac{1}{2}\theta_2\cdot\cos\left(\frac{1}{2}\theta_1+\frac{1}{2}\theta_2\right)\right]I_1 =$$

$$-\frac{1}{4\pi r}\left[1-\cos\frac{1}{2}\theta_1+2\cos\frac{1}{2}\theta_2\cdot\cos\left(\pi-\frac{1}{2}\theta_3\right)\right]I_1 =$$

$$-\frac{1}{4\pi r}\left(1-\cos\frac{1}{2}\theta_1-2\cos\frac{1}{2}\theta_2\cdot\cos\frac{1}{2}\theta_3\right)I_1$$

The magnetic field which the first hall device 21 receives from the current $I_2$ is expressed by Expression 69.

$$-\frac{1}{4\pi r}\left(1+\cos\frac{1}{2}\theta_1\right)I_2 \qquad \text{[Expression 69]}$$

The magnetic field which the first hall device 21 receives from the current $I_3$ is expressed by Expression 70.

$$-\frac{1}{4\pi r}\left(1+\cos\frac{1}{2}\theta_1\right)I_3 \qquad \text{[Expression 70]}$$

Thus, the magnetic field which the first hall device 21 receives from the currents $I_1$–$I_3$ is expressed by Expression 71.

$$S_1 = \frac{1}{4\pi r}\left[-\left(1-\cos\frac{1}{2}\theta_1-2\cos\frac{1}{2}\theta_2\cdot\cos\frac{1}{2}\theta_3\right)I_1 - \right. \qquad \text{[Expression 71]}$$

$$\left(1+\cos\frac{1}{2}\theta_1\right)I_2 + \left(1+\cos\frac{1}{2}\theta_1\right)I_3\right] =$$

$$\frac{1}{4\pi r}\left[-I_1-I_2+I_3+\cos\frac{1}{2}\theta_1\cdot(I_1-I_2+I_3) + 2\cos\frac{1}{2}\theta_2\cdot\cos\frac{1}{2}\theta_3\cdot I_1\right] =$$

$$\frac{1}{2\pi r}\left[\left(\cos\frac{1}{2}\theta_2\cdot\cos\frac{1}{2}\theta_3-1\right)I_1-\left(1+\cos\frac{1}{2}\theta_1\right)I_2\right]$$

Next, the magnetic field which the second hall device 22 receives from the current $I_1$ is expressed by Expression 72.

$$-\frac{1}{4\pi r}\left(1+\cos\frac{1}{2}\theta_2\right)I_1 \qquad \text{[Expression 72]}$$

The magnetic field which the second hall device 22 receives from the current $I_2$ is expressed by Expression 73.

$$\frac{1}{4\pi r}\left(1+\cos\frac{1}{2}\theta_2\right)I_2 \qquad \text{[Expression 73]}$$

The magnetic field which the second hall device 22 receives from the current $I_3$ is expressed by Expression 74.

$$\frac{1}{4\pi r}\left[1+\cos\left(\theta_1+\frac{1}{2}\theta_2\right)\right]I_3 = \qquad \text{[Expression 74]}$$

$$\frac{1}{4\pi r}\left[1-\cos\frac{1}{2}\theta_2-2\cos\frac{1}{2}\theta_1\cdot\cos\frac{1}{2}\theta_3\right]I_3$$

Therefore, the magnetic field which the second hall device 22 receives from the currents $I_1$–$I_3$ is expressed by Expression 75.

$$S_2 = \frac{1}{4\pi r}\left[-\left(1+\cos\frac{1}{2}\theta_2\right)I_1+\left(1+\cos\frac{1}{2}\theta_2\right)I_2 + \right. \qquad \text{[Expression 75]}$$

$$\left(1-\cos\frac{1}{2}\theta_2-2\cos\frac{1}{2}\theta_1\cdot\cos\frac{1}{2}\theta_3\right)I_3\right] =$$

$$\frac{1}{4\pi r}\left(-2I_1+2\cos\frac{1}{2}\theta_2\cdot I_2-2\cos\frac{1}{2}\theta_1\cdot\cos\frac{1}{2}\theta_3\cdot I_3\right) =$$

$$\frac{1}{2\pi r}\left[\left(\cos\frac{1}{2}\theta_1\cdot\cos\frac{1}{2}\theta_3-1\right)I_1 + \right.$$

$$\left(\cos\frac{1}{2}\theta_1\cdot\cos\frac{1}{2}\theta_3+\cos\frac{1}{2}\theta_2\right)I_2\right]$$

Thus, the magnetic fields $S_1$, $S_2$ are expressed by Expression 76.

$$S_1 = \frac{1}{2\pi r}\left[\left(\cos\frac{1}{2}\theta_2\cdot\cos\frac{1}{2}\theta_3-1\right)I_1-\left(1+\cos\frac{1}{2}\theta_1\right)I_2\right] \quad (1-3-1) \qquad \text{[Expression 76]}$$

$$S_2 = \frac{1}{2\pi r}\left[\left(\cos\frac{1}{2}\theta_1\cdot\cos\frac{1}{2}\theta_3-1\right)I_1 + \right.$$

$$\left(\cos\frac{1}{2}\theta_1\cdot\cos\frac{1}{2}\theta_3+\cos\frac{1}{2}\theta_2\right)I_2\right] \quad (1-3-2)$$

The current $I_1$ is expressed by Expression 77 because of (1-3-1) of equation 76.

$$I_1 = \frac{1}{\cos\frac{1}{2}\theta_2 \cdot \cos\frac{1}{2}\theta_3 - 1} \left[2\pi r S_1 + \left(1 + \cos\frac{1}{2}\theta_1\right)I_2\right] \quad (1-3-3)$$ [Expression 77]

If this current $I_1$ is substituted into equation (1-3-2) of Expression 76, Expression 78 is obtained.

$$S_2 = \frac{1}{2\pi r}\left[\frac{\cos\frac{1}{2}\theta_1 \cdot \cos\frac{1}{2}\theta_3 - 1}{\cos\frac{1}{2}\theta_2 \cdot \cos\frac{1}{2}\theta_3 - 1} \cdot \left[2\pi r S_1 + \left(1 + \cos\frac{1}{2}\theta_1\right)I_2\right] + \left(\cos\frac{1}{2}\theta_1 \cdot \cos\frac{1}{2}\theta_3 + \cos\frac{1}{2}\theta_2\right)I_2\right]$$ [Expression 78]

If this Expression 78 is solved with respect to the current $I_2$, Expression 79 is obtained, so that the current $I_2$ is obtained.

$$I_2 = \frac{2\pi r\left[-\left(\cos\frac{1}{2}\theta_1 \cdot \cos\frac{1}{2}\theta_3 - 1\right)S_1 + \left(\cos\frac{1}{2}\theta_2 \cdot \cos\frac{1}{2}\theta_3 - 1\right)S_2\right]}{\left(\cos\frac{1}{2}\theta_2 \cdot \cos\frac{1}{2}\theta_3 - 1\right)\left(\cos\frac{1}{2}\theta_1 \cdot \cos\frac{1}{2}\theta_3 + \cos\frac{1}{2}\theta_2\right) + \left(\cos\frac{1}{2}\theta_1 \cdot \cos\frac{1}{2}\theta_3 - 1\right)\left(1 + \cos\frac{1}{2}\theta_1\right)} \quad (1-3-4)$$ [Expression 79]

Meanwhile, if $\theta_1 = \theta_2$ is set in the equation (1-3-3), the current $I_2$ is expressed by Expression 80.

$$I_2 = \frac{2\pi r(S_2 - S_1)}{\frac{1}{2}\sin\frac{3}{4}\theta_3 + \frac{3}{4}\sin\frac{1}{4}\theta_3 + 1}$$ [Expression 80]

In case where $\theta_1$ is unequal to $\theta_2$ like equation (1-3-4), if two hall devices receive noise having the same level and direction, this noise cannot be canceled by the aforementioned operation. If the equation (1-3-4) is substituted into the equation (1-3-3), the current $I_1$ is expressed by Expression 81.

$$I_1 = \frac{1}{\cos\frac{1}{2}\theta_2 \cdot \cos\frac{1}{2}\theta_3 - 1}$$

$$\left[2\pi r S_1 + \left(1 + \cos\frac{1}{2}\theta_1\right)\frac{2\pi r\left[\left(\cos\frac{1}{2}\theta_2 \cdot \cos\frac{1}{2}\theta_3 - 1\right)S_2 - \left(\cos\frac{1}{2}\theta_1 \cdot \cos\frac{1}{2}\theta_3 - 1\right)S_1\right]}{\left(\cos\frac{1}{2}\theta_2 \cdot \cos\frac{1}{2}\theta_3 - 1\right)\left(\cos\frac{1}{2}\theta_1 \cdot \cos\frac{1}{2}\theta_3 + \cos\frac{1}{2}\theta_2\right) + \left(\cos\frac{1}{2}\theta_1 \cdot \cos\frac{1}{2}\theta_3 - 1\right)\left(1 + \cos\frac{1}{2}\theta_1\right)}\right]$$ [Expression 81]

$$= \frac{2\pi r\left[\left(\cos\frac{1}{2}\theta_1 \cdot \cos\frac{1}{2}\theta_3 + \cos\frac{1}{2}\theta_2\right)S_1 + \left(1 + \cos\frac{1}{2}\theta_1\right)S_2\right]}{\left(\cos\frac{1}{2}\theta_2 \cdot \cos\frac{1}{2}\theta_3 - 1\right)\left(\cos\frac{1}{2}\theta_1 \cdot \cos\frac{1}{2}\theta_3 + \cos\frac{1}{2}\theta_2\right) + \left(\cos\frac{1}{2}\theta_1 \cdot \cos\frac{1}{2}\theta_3 - 1\right)\left(1 + \cos\frac{1}{2}\theta_1\right)} \quad (1-3-5)$$

Further, the current $I_3$ is obtained due to Kirchhoff formula and this current $I_3$ is expressed by Expression 82.

$$I_3 = -I_1 - I_2$$ [Expression 82]

$$= \frac{-2\pi r\left[\left(\cos\frac{1}{2}\theta_2 \cdot \cos\frac{1}{2}\theta_3 - 1\right)S_2 - \left(\cos\frac{1}{2}\theta_1 \cdot \cos\frac{1}{2}\theta_3 - 1\right)S_1\right] - 2\pi r\left[\left(\cos\frac{1}{2}\theta_1 \cdot \cos\frac{1}{2}\theta_3 + \cos\frac{1}{2}\theta_2\right)S_1 + \left(1 + \cos\frac{1}{2}\theta_1\right)S_2\right]}{\left(\cos\frac{1}{2}\theta_2 \cdot \cos\frac{1}{2}\theta_3 - 1\right)\left(\cos\frac{1}{2}\theta_1 \cdot \cos\frac{1}{2}\theta_3 + \cos\frac{1}{2}\theta_2\right) + \left(\cos\frac{1}{2}\theta_1 \cdot \cos\frac{1}{2}\theta_3 - 1\right)\left(1 + \cos\frac{1}{2}\theta_1\right)}$$

$$= \frac{-2\pi r\left[\left(1 + \cos\frac{1}{2}\theta_2\right)S_1 + \left(\cos\frac{1}{2}\theta_2 \cdot \cos\frac{1}{2}\theta_3 + \cos\frac{1}{2}\theta_1\right)S_2\right]}{\left(\cos\frac{1}{2}\theta_2 \cdot \cos\frac{1}{2}\theta_3 - 1\right)\left(\cos\frac{1}{2}\theta_1 \cdot \cos\frac{1}{2}\theta_3 + \cos\frac{1}{2}\theta_2\right) + \left(\cos\frac{1}{2}\theta_1 \cdot \cos\frac{1}{2}\theta_3 - 1\right)\left(1 + \cos\frac{1}{2}\theta_1\right)} \quad (1-3-6)$$

Figure 24:
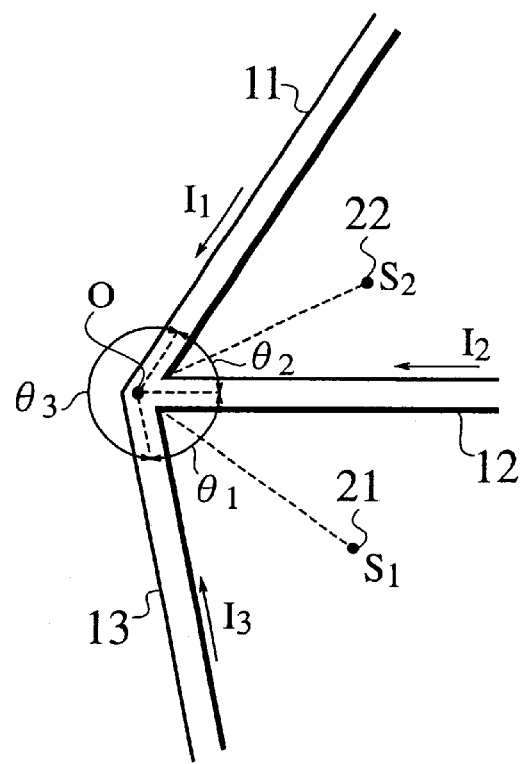
FIG. 24 is a diagram showing a first setting example for an angle formed between two conductors of the first-third conductors in the current detecting apparatus shown in FIG. 23.

Next, FIG. 24 shows a structure of the sensor portion in case of $\pi \leq \theta_1/2 + \theta_2 \leq 2\pi$ and $0 \leq \theta_1 + \theta_2/2 \leq \pi$. A magnetic field which the first hall device 21 receives in this case is obtain. First, the magnetic field which the first hall device 21 from the current $I_1$ is expressed by Expression 83.

$$-\frac{1}{4\pi r}\left[1 + \cos\left(\theta_2 + \frac{1}{2}\theta_1\right)\right]I_1 =$$ [Expression 83]

$$\frac{1}{4\pi r}\left(1 - \cos\frac{1}{2}\theta_1 - 2\cos\frac{1}{2}\theta_2 \cdot \cos\frac{1}{2}\theta_3\right)I_1$$

The magnetic field which the first hall device 21 receives from the current $I_2$ is expressed by Expression 84.

$$-\frac{1}{4\pi r}\left(1 + \cos\frac{1}{2}\theta_1\right)I_2$$ [Expression 84]

The magnetic field which the first hall device 21 receives from the current $I_3$ is expressed by Expression 85.

$$\frac{1}{4\pi r}\left(1 + \cos\frac{1}{2}\theta_1\right)I_3$$ [Expression 85]

Thus, a magnetic field which the first hall device 21 from the currents $I_1$–$I_3$ is expressed by Expression 86.

$$S_1 = \frac{1}{4\pi r}\left[\left(1 - \cos\frac{1}{2}\theta_1 - 2\cos\frac{1}{2}\theta_2 \cdot \cos\frac{1}{2}\theta_3\right)I_1 - \right.$$

[Expression 86]

$$\left.\left(1 + \cos\frac{1}{2}\theta_1\right)I_2 + \left(1 + \cos\frac{1}{2}\theta_1\right)I_3\right] =$$

$$\frac{1}{2\pi r}\left[\left(-\cos\frac{1}{2}\theta_1 - \cos\frac{1}{2}\theta_2 \cdot \cos\frac{1}{2}\theta_3\right)I_1 + \left(-1 - \cos\frac{1}{2}\theta_1\right)I_2\right]$$

Next, the magnetic field which the second hall device 22 receives from the current $I_1$ is expressed by Expression 87.

$$-\frac{1}{4\pi r}\left(1 + \cos\frac{1}{2}\theta_2\right)I_1 \quad \text{[Expression 87]}$$

The magnetic field which the second hall device 22 receives from the current $I_2$ is expressed by Expression 88.

$$\frac{1}{4\pi r}\left(1 + \cos\frac{1}{2}\theta_2\right)I_2 \quad \text{[Expression 88]}$$

The magnetic field which the second hall device 22 receives from the current $I_3$ is expressed by Expression 89.

$$\frac{1}{4\pi r}\left[1 + \cos\left(\theta_1 + \frac{1}{2}\theta_2\right)\right]I_3 = \quad \text{[Expression 89]}$$

$$\frac{1}{4\pi r}\left(1 - \cos\frac{1}{2}\theta_2 - 2\cos\frac{1}{2}\theta_1 \cdot \cos\frac{1}{2}\theta_3\right)I_3$$

Therefore, the magnetic field which the second hall device receives from e currents $I_1$–$I_3$ is expressed by Expression 90.

$$S_2 = \frac{1}{4\pi r}\left[-\left(1 + \cos\frac{1}{2}\theta_2\right)I_1 + \right. \quad \text{[Expression 90]}$$

$$\left.\left(1 + \cos\frac{1}{2}\theta_2\right)I_2 + \left(1 - \cos\frac{1}{2}\theta_2 - 2\cos\frac{1}{2}\theta_1 \cdot \cos\frac{1}{2}\theta_3\right)I_3\right] =$$

$$\frac{1}{2\pi r}\left[\left(-1 - \cos\frac{1}{2}\theta_2 + \cos\frac{1}{2}\theta_1 \cdot \cos\frac{1}{2}\theta_3\right)I_1 + \cos\frac{1}{2}\theta_1 \cdot \cos\frac{1}{2}\theta_3 \cdot I_2\right]$$

Therefore, the magnetic fields $S_1$, $S_2$ are expressed by Expression 91.

$$S_1 = \frac{1}{2\pi r}\left[\left(-\cos\frac{1}{2}\theta_1 - \cos\frac{1}{2}\theta_2 \cdot \cos\frac{1}{2}\theta_3\right)I_1 + \left(1 - \cos\frac{1}{2}\theta_1\right)I_2\right] \quad (2\text{-}3\text{-}1) \quad \text{[Expression 91]}$$

$$S_2 =$$

$$\frac{1}{2\pi r}\left[\left(-1 - \cos\frac{1}{2}\theta_2 + \cos\frac{1}{2}\theta_1 \cdot \cos\frac{1}{2}\theta_3\right)I_1 + \cos\frac{1}{2}\theta_1 \cdot \cos\frac{1}{2}\theta_3 \cdot I_2\right] \quad (2\text{-}3\text{-}2)$$

The current $I_2$ is expressed by Expression 92 because of the equation (2-3-2) of Expression 91.

$$I_2 = \frac{1}{\cos\frac{1}{2}\theta_1 \cdot \cos\frac{1}{2}\theta_3}\left[2\pi r S_2 + \left(1 + \cos\frac{1}{2}\theta_2 - \cos\frac{1}{2}\theta_1 \cdot \cos\frac{1}{2}\theta_3\right)I_1\right] \quad (2\text{-}3\text{-}3) \quad \text{[Expression 92]}$$

If the current $I_2$ is substituted into the equation (2-3-1) of Expression 91, Expression 93 is obtained, and thus, the current $I_1$ is obtained.

[Expression 93]

$$I_1 = \frac{2\pi r\left[\cos\frac{1}{2}\theta_1 \cdot \cos\frac{1}{2}\theta_3 \cdot S_1 + \left(\cos\frac{1}{2}\theta_1 + 1\right)S_2\right]}{\cos\frac{1}{2}\theta_1 \cdot \cos\frac{1}{2}\theta_3 \cdot \left(-\cos\frac{1}{2}\theta_1 - \cos\frac{1}{2}\theta_2 \cdot \cos\frac{1}{2}\theta_3\right) + \left(-1 - \cos\frac{1}{2}\theta_1\right)\left(\cos\frac{1}{2}\theta_2 - \cos\frac{1}{2}\theta_1 \cdot \cos\frac{1}{2}\theta_3 + 1\right)} \quad (2\text{-}3\text{-}4)$$

If this expression 93 is substituted into the equation (2-3-3), Expression 94 is obtained, and thus the current $I_2$ and current $I_3$ are obtained.

[Expression 94]

$$I_2 = \frac{2\pi r\left[\left(\cos\frac{1}{2}\theta_2 - \cos\frac{1}{2}\theta_1 \cdot \cos\frac{1}{2}\theta_3 + 1\right)S_1 + \left(-\cos\frac{1}{2}\theta_1 - \cos\frac{1}{2}\theta_2 \cdot \cos\frac{1}{2}\theta_3\right)S_2\right]}{\cos\frac{1}{2}\theta_1 \cdot \cos\frac{1}{2}\theta_3 \cdot \left(-\cos\frac{1}{2}\theta_1 - \cos\frac{1}{2}\theta_2 \cdot \cos\frac{1}{2}\theta_3\right) + \left(-1 - \cos\frac{1}{2}\theta_1\right)\left(\cos\frac{1}{2}\theta_2 - \cos\frac{1}{2}\theta_1 \cdot \cos\frac{1}{2}\theta_3 + 1\right)} \quad (2\text{-}3\text{-}5)$$

$$I_3 = -I_1 - I_2$$

$$= \frac{2\pi r\left[\left(-\cos\frac{1}{2}\theta_2 - 1\right)S_1 + \left(\cos\frac{1}{2}\theta_2 \cdot \cos\frac{1}{2}\theta_3 + 1\right)S_2\right]}{\cos\frac{1}{2}\theta_1 \cdot \cos\frac{1}{2}\theta_3 \cdot \left(-\cos\frac{1}{2}\theta_1 - \cos\frac{1}{2}\theta_2 \cdot \cos\frac{1}{2}\theta_3\right) + \left(-1 - \cos\frac{1}{2}\theta_1\right)\left(\cos\frac{1}{2}\theta_2 - \cos\frac{1}{2}\theta_1 \cdot \cos\frac{1}{2}\theta_3 + 1\right)} \quad (2\text{-}3\text{-}6)$$

Figure 25:
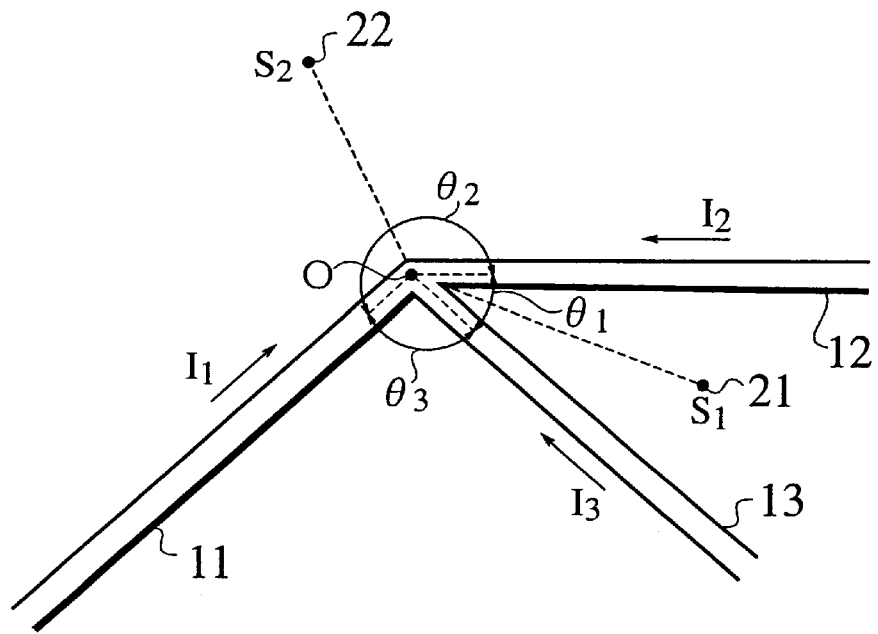
FIG. 25 is a diagram showing a second setting example for an angle formed between two conductors of the first-third conductors in the current detecting apparatus shown in FIG. 23.

Next, FIG. 25 shows a structure of the sensor portion in case of $\pi \leq \theta_1/2 + \theta_2 \leq 2\pi$ and $\pi \leq \theta_1 + \theta_2/2 \leq 2\pi$. A magnetic field which the first hall device 21 receives in this case is obtained. First, the magnetic field which the first hall device 21 from the current $I_1$ is expressed by Expression 95.

[Expression 95]

$$\frac{1}{4\pi r}\left[1 + \cos\left(\theta_2 + \frac{1}{2}\theta_1\right)\right]I_1 = \frac{1}{4\pi r}\left(1 - \cos\frac{1}{2}\theta_1 - 2\cos\frac{1}{2}\theta_2 \cdot \cos\frac{1}{2}\theta_3\right)I_1$$

The magnetic field which the first hall device 21 receives from the current $I_2$ is expressed by Expression 96.

[Expression 96]

$$-\frac{1}{4\pi r}\left(1 + \cos\frac{1}{2}\theta_1\right)I_2$$

The magnetic field which the first hall device 21 receives from the current $I_3$ is expressed by Expression 97.

[Expression 97]

$$\frac{1}{4\pi r}\left(1 + \cos\frac{1}{2}\theta_1\right)I_3$$

Therefore, the magnetic field which the first hall device 21 receives from the currents $I_1$–$I_3$ is expressed by Expression 98.

[Expression 98]

$$S_1 = \frac{1}{4\pi r}\left[\left(1 - \cos\frac{1}{2}\theta_1 - 2\cos\frac{1}{2}\theta_2 \cdot \cos\frac{1}{2}\theta_3\right)I_1 - \right.$$

$$\left.\left(1 + \cos\frac{1}{2}\theta_1\right)I_2 + \left(1 + \cos\frac{1}{2}\theta_1\right)I_3\right] =$$

$$\frac{1}{2\pi r}\left[\left(-\cos\frac{1}{2}\theta_1 - \cos\frac{1}{2}\theta_2 \cdot \cos\frac{1}{2}\theta_3\right)I_1 + \left(-1 - \cos\frac{1}{2}\theta_1\right)I_2\right]$$

Next, the magnetic field which the second hall device 22 receives from the current $I_1$ is expressed by Expression 99.

[Expression 99]

$$-\frac{1}{4\pi r}\left(1 + \cos\frac{1}{2}\theta_2\right)I_1$$

The magnetic field which the second hall device receives from the current $I_2$ is expressed by Expression 100.

[Expression 100]

$$\frac{1}{4\pi r}\left(1 + \cos\frac{1}{2}\theta_2\right)I_2$$

The magnetic field which the second hall device 22 receives from the current $I_3$ is expressed by Expression 101.

[Expression 101]

$$-\frac{1}{4\pi r}\left[1 + \cos\left(\theta_1 + \frac{1}{2}\theta_2\right)\right]I_3 =$$

$$-\frac{1}{4\pi r}\left(1 - \cos\frac{1}{2}\theta_2 - 2\cos\frac{1}{2}\theta_1 \cdot \cos\frac{1}{2}\theta_3\right)I_3$$

Therefore, the magnetic field which the second hall device 22 receives from the currents $I_1$–$I_3$ is expressed by Expression 102.

$$S_2 = \frac{1}{4\pi r}\left[-\left(1+\cos\frac{1}{2}\theta_2\right)I_1 + \left(1+\cos\frac{1}{2}\theta_2\right)I_2 - \left(1-\cos\frac{1}{2}\theta_2 - 2\cos\frac{1}{2}\theta_1\cdot\cos\frac{1}{2}\theta_3\right)I_3\right] =$$
$$\frac{1}{2\pi r}\left[\left(-\cos\frac{1}{2}\theta_1\cdot\cos\frac{1}{2}\theta_3 - \cos\frac{1}{2}\theta_2\right)I_1 + \left(1-\cos\frac{1}{2}\theta_1\cdot\cos\frac{1}{2}\theta_3\right)I_2\right]$$

[Expression 102]

Thus, the magnetic fields $S_1$, $S_2$ are expressed by Expression 103.

$$S_1 = \frac{1}{2\pi r}\left[\left(-\cos\frac{1}{2}\theta_1 - \cos\frac{1}{2}\theta_2\cdot\cos\frac{1}{2}\theta_3\right)I_1 + \left(-1-\cos\frac{1}{2}\theta_1\right)I_2\right] \quad (3\text{-}3\text{-}1)$$

[Expression 103]

$$S_2 = \frac{1}{2\pi r}\left[\left(-\cos\frac{1}{2}\theta_1\cdot\cos\frac{1}{2}\theta_3 - \cos\frac{1}{2}\theta_2\right)I_1 + \left(1-\cos\frac{1}{2}\theta_1\cdot\cos\frac{1}{2}\theta_3\right)I_2\right] \quad (3\text{-}3\text{-}2)$$

Due to the equation (3-3-2) of Expression 103, the current $I_2$ is expressed by Expression 104.

$$I_2 = \frac{1}{1-\cos\frac{1}{2}\theta_1\cdot\cos\frac{1}{2}\theta_3}\left[2\pi r S_2 + \left(\cos\frac{1}{2}\theta_1\cdot\cos\frac{1}{2}\theta_3 + \cos\frac{1}{2}\theta_2\right)I_1\right] \quad (3\text{-}3\text{-}3)$$

[Expression 104]

If this current $I_2$ is substituted into the equation (3-3-1) of Expression 103, Expression 105 is obtained and thus, the current $I_1$ is obtained.

$$I_1 = \frac{2\pi r\left[\left(1-\cos\frac{1}{2}\theta_1\cdot\cos\frac{1}{2}\theta_3\right)S_1 + \left(\cos\frac{1}{2}\theta_1 + 1\right)S_2\right]}{\left(1-\cos\frac{1}{2}\theta_1\cdot\cos\frac{1}{2}\theta_3\right)\left(-\cos\frac{1}{2}\theta_2\cdot\cos\frac{1}{2}\theta_3 - \cos\frac{1}{2}\theta_1\right) + \left(-1-\cos\frac{1}{2}\theta_1\right)\left(\cos\frac{1}{2}\theta_1\cdot\cos\frac{1}{2}\theta_3 + \cos\frac{1}{2}\theta_2\right)} \quad (3\text{-}3\text{-}4)$$

[Expression 105]

If this expression 105 is substituted into the equation (3-3-3), Expression 106 is obtained and then, the currents $I_2$, $I_3$ are obtained.

$$I_2 = \frac{2\pi r\left[\left(\cos\frac{1}{2}\theta_1\cdot\cos\frac{1}{2}\theta_3 + \cos\frac{1}{2}\theta_2\right)S_1 + \left(-\cos\frac{1}{2}\theta_2\cdot\cos\frac{1}{2}\theta_3 - \cos\frac{1}{2}\theta_1\right)S_2\right]}{\left(1-\cos\frac{1}{2}\theta_1\cdot\cos\frac{1}{2}\theta_3\right)\left(-\cos\frac{1}{2}\theta_2\cdot\cos\frac{1}{2}\theta_3 - \cos\frac{1}{2}\theta_1\right) + \left(-1-\cos\frac{1}{2}\theta_1\right)\left(\cos\frac{1}{2}\theta_1\cdot\cos\frac{1}{2}\theta_3 + \cos\frac{1}{2}\theta_2\right)} \quad (3\text{-}3\text{-}5)$$

[Expression 106]

$$I_3 = -I_1 - I_2$$
$$= \frac{2\pi r\left[\left(-\cos\frac{1}{2}\theta_2 - 1\right)S_1 + \left(-\cos\frac{1}{2}\theta_2\cdot\cos\frac{1}{2}\theta_3 - 1\right)S_2\right]}{\left(1-\cos\frac{1}{2}\theta_1\cdot\cos\frac{1}{2}\theta_3\right)\left(-\cos\frac{1}{2}\theta_2\cdot\cos\frac{1}{2}\theta_3 - \cos\frac{1}{2}\theta_1\right) + \left(-1-\cos\frac{1}{2}\theta_1\right)\left(\cos\frac{1}{2}\theta_1\cdot\cos\frac{1}{2}\theta_3 + \cos\frac{1}{2}\theta_2\right)} \quad (3\text{-}3\text{-}6)$$

Here, $\theta_1 = \theta_2$ is set to the equation (3-3-5) and the current $I_2$ flowing through a conductor sandwiched by the two hall devices 21, 22 is expressed by Expression 107.

$$I_2 = \frac{2\pi r(S_2 - S_1)}{\left(2 + \frac{3}{2}\sin\frac{1}{4}\theta_3 - \frac{1}{2}\sin\frac{3}{4}\theta_3\right)} \quad \text{[Expression 107]}$$

Figure 26:
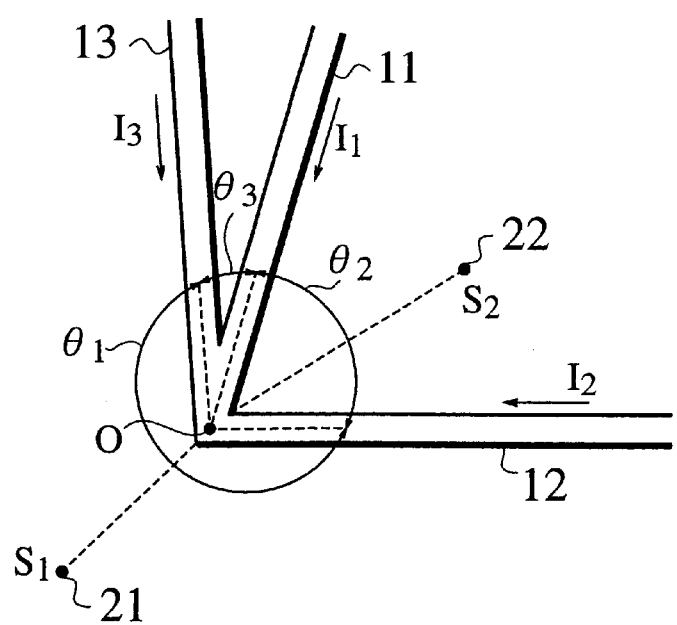
FIG. 26 is a diagram showing a third setting example for an angle formed between two conductors of the first-third conductors in the current detecting apparatus shown in FIG. 23.
Figure 27:
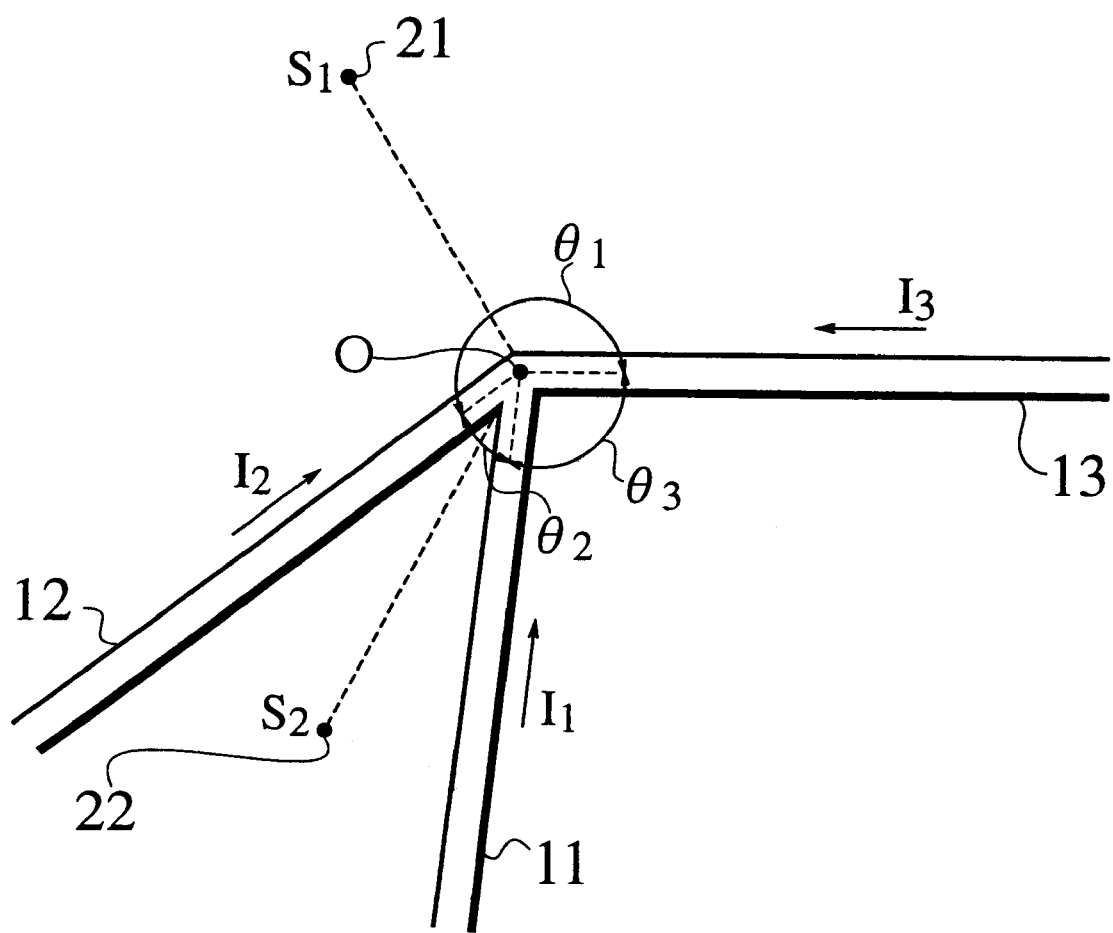
FIG. 27 is a diagram showing a fourth setting example for an angle formed between two conductors of the first-third conductors in the current detecting apparatus shown in FIG. 23.

Next, FIG. 26 shows a structure of the sensor portion in case of $\pi \leq \theta_1/2 + \theta_2 \leq \pi$ and $\pi \leq \theta_1 + \theta_2/2 \leq 2\pi$. A magnetic field which the first hall device 21 receives in this case will be obtained. First, the magnetic field which the first hall device 21 from the current $I_1$ is expressed by Expression 108.

$$-\frac{1}{4\pi r}\left[1+\cos\left(\theta_2+\frac{1}{2}\theta_1\right)\right]I_1 =$$ [Expression 108]

$$-\frac{1}{4\pi r}\left(1-\cos\frac{1}{2}\theta_1 - 2\cos\frac{1}{2}\theta_2 \cdot \cos\frac{1}{2}\theta_3\right)I_1$$

The magnetic field which the first hall device 21 receives from the current $I_2$ is expressed by Expression 109.

$$-\frac{1}{4\pi r}\left(1+\cos\frac{1}{2}\theta_1\right)I_2$$ [Expression 109]

The magnetic field which the first hall device 21 receives from the current $I_3$ is expressed by Expression 110.

$$\frac{1}{4\pi r}\left(1+\cos\frac{1}{2}\theta_1\right)I_3$$ [Expression 110]

Therefore, the magnetic field which the first hall device 21 receives from the currents $I_1$–$I_3$ is expressed by Expression 111.

$$S_1 = \frac{1}{4\pi r}\left[-\left(1-\cos\frac{1}{2}\theta_1 - 2\cos\frac{1}{2}\theta_2 \cdot \cos\frac{1}{2}\theta_3\right)I_1 - \right.$$

$$\left.\left(1+\cos\frac{1}{2}\theta_1\right)I_2 + \left(1+\cos\frac{1}{2}\theta_1\right)I_3\right] =$$

$$\frac{1}{2\pi r}\left[\left(-\cos\frac{1}{2}\theta_2 \cdot \cos\frac{1}{2}\theta_3 - 1\right)I_1 + \left(-\cos\frac{1}{2}\theta_1 - 1\right)I_2\right]$$

[Expression 111]

Next, the magnetic field which the second hall device 22 receives from the current $I_1$ is expressed by Expression 112.

$$-\frac{1}{4\pi r}\left(1+\cos\frac{1}{2}\theta_2\right)I_1$$ [Expression 112]

The magnetic field which the second hall device 22 receives from the current $I_2$ is expressed by Expression 113.

$$\frac{1}{4\pi r}\left(1+\cos\frac{1}{2}\theta_2\right)I_2$$ [Expression 113]

The magnetic field which the second hall device 22 receives from the current $I_3$ is expressed by Expression 114.

$$-\frac{1}{4\pi r}\left[1+\cos\left(\theta_1+\frac{1}{2}\theta_2\right)\right]I_3 =$$ [Expression 114]

$$-\frac{1}{4\pi r}\left[1-\cos\frac{1}{2}\theta_2 - 2\cos\frac{1}{2}\theta_1 \cdot \cos\frac{1}{2}\theta_3\right]I_3$$

Thus, the magnetic field which the second hall device receives from the currents $I_1$–$I_3$ is expressed by Expression 115.

$$S_2 = \frac{1}{4\pi r}\left[-\left(1+\cos\frac{1}{2}\theta_2\right)I_1 + \right.$$

[Expression 115]

$$\left.\left(1+\cos\frac{1}{2}\theta_2\right)I_2 - \left(1-\cos\frac{1}{2}\theta_2 - 2\cos\frac{1}{2}\theta_1 \cdot \cos\frac{1}{2}\theta_3\right)I_3\right] =$$

$$\frac{1}{2\pi r}\left[\left(-\cos\frac{1}{2}\theta_1 \cdot \cos\frac{1}{2}\theta_3 - \cos\frac{1}{2}\theta_2\right)I_1 + \left(1-\cos\frac{1}{2}\theta_1 \cdot \cos\frac{1}{2}\theta_3\right)I_2\right]$$

Thus, the magnetic fields $S_1$, $S_2$ are expressed by Expression 116.

[Expression 116]
$$S_1 = \frac{1}{2\pi r}\left[\left(\cos\frac{1}{2}\theta_2 \cdot \cos\frac{1}{2}\theta_3 - 1\right)I_1 - \left(1 + \cos\frac{1}{2}\theta_1\right)I_2\right] \quad (4\text{-}3\text{-}1)$$

$$S_2 = \frac{1}{2\pi r}\left[\left(-\cos\frac{1}{2}\theta_1 \cdot \cos\frac{1}{2}\theta_3 - \cos\frac{1}{2}\theta_2\right)I_1 + \left(1 - \cos\frac{1}{2}\theta_1 \cdot \cos\frac{1}{2}\theta_3\right)I_2\right] \quad (4\text{-}3\text{-}2)$$

The current $I_1$ is expressed by Expression 117 because of the equation (4-3-1) of Expression 116.

[Expression 117]
$$I_1 = \frac{1}{\cos\frac{1}{2}\theta_2 \cdot \cos\frac{1}{2}\theta_3 - 1}\left[2\pi r S_1 + \left(1 + \cos\frac{1}{2}\theta_1\right)I_2\right] \quad (4\text{-}3\text{-}3)$$

If this current $I_1$ is substituted into the equation (4-3-2) of Expression 116, Expression 118 is obtained and thus the current $I_2$ is obtained.

[Expression 118]
$$I_2 = \frac{2\pi r\left[\left(\cos\frac{1}{2}\theta_1 \cdot \cos\frac{1}{2}\theta_3 + \cos\frac{1}{2}\theta_2\right)S_1 + \left(\cos\frac{1}{2}\theta_2 \cdot \cos\frac{1}{2}\theta_3 - 1\right)S_2\right]}{\left(-\cos\frac{1}{2}\theta_1 \cdot \cos\frac{1}{2}\theta_3 - \cos\frac{1}{2}\theta_2\right)\left(\cos\frac{1}{2}\theta_1 + 1\right) + \left(-\cos\frac{1}{2}\theta_1 \cdot \cos\frac{1}{2}\theta_3 + 1\right)\left(\cos\frac{1}{2}\theta_2 \cdot \cos\frac{1}{2}\theta_3 - 1\right)} \quad (4\text{-}3\text{-}4)$$

If this expression 118 is substituted into the equation (4-3-3), Expression 119 is obtained and thus the current $I_1$ is obtained.

[Expression 119]
$$I_1 = \frac{2\pi r\left[\left(-\cos\frac{1}{2}\theta_1 \cdot \cos\frac{1}{2}\theta_3 + 1\right)S_1 + \left(\cos\frac{1}{2}\theta_1 + 1\right)S_2\right]}{\left(-\cos\frac{1}{2}\theta_1 \cdot \cos\frac{1}{2}\theta_3 - \cos\frac{1}{2}\theta_2\right)\left(\cos\frac{1}{2}\theta_1 + 1\right) + \left(-\cos\frac{1}{2}\theta_1 \cdot \cos\frac{1}{2}\theta_3 + 1\right)\left(\cos\frac{1}{2}\theta_2 \cdot \cos\frac{1}{2}\theta_3 - 1\right)} \quad (4\text{-}3\text{-}5)$$

Further, the current $I_3$ is obtained because of Kirchhoff formula and the current $I_3$ is expressed by Expression 120.

[Expression 120]
$$I_3 = -I_1 - I_2$$

$$= \frac{-2\pi r\left[\left(\cos\frac{1}{2}\theta_2 + 1\right)S_1 + \left(\cos\frac{1}{2}\theta_2 \cdot \cos\frac{1}{2}\theta_3 + \cos\frac{1}{2}\theta_1\right)S_2\right]}{\left(-\cos\frac{1}{2}\theta_1 \cdot \cos\frac{1}{2}\theta_3 - \cos\frac{1}{2}\theta_2\right)\left(\cos\frac{1}{2}\theta_1 + 1\right) + \left(-\cos\frac{1}{2}\theta_1 \cdot \cos\frac{1}{2}\theta_3 + 1\right)\left(\cos\frac{1}{2}\theta_2 \cdot \cos\frac{1}{2}\theta_3 - 1\right)} \quad (4\text{-}3\text{-}6)$$

What is claimed is:

1. A current detecting apparatus comprising:

n conductors disposed so as to be branched radially from a branch point;

m electromagnetic transducers disposed between adjacent conductors of said n conductors; and an operation processing circuit for detecting a current flowing through each of said n conductors based on an operating output obtained from a predetermined operation based on an electric signal from each of said m electromagnetic transducers, wherein n: integer satisfying n≧3 m: integer satisfying m≧2.

2. A current detecting apparatus according to claim 1 wherein said n conductors are disposed on a flat plane including said branch point and said m electromagnetic transducers are disposed such that a magnetism sensitive surface of each thereof exists on said flat plane.

3. A current detecting apparatus according to claim 2 wherein said n is "3" while the three conductors are disposed every 120° from the branch point on said flat plane in three directions;

said m is "3" while the three electromagnetic transducers are disposed at the same distance from adjacent conductors and at the same distance from said branch point; and said operation processing circuit detects a current flowing through the conductor by obtaining a difference of electric signal between the two electromagnetic transducers sandwiching each conductor.

4. A current detecting apparatus according to claim 3 wherein said m electromagnetic transducers are disposed such that the magnetism sensitive surfaces thereof are directed in the same direction.

5. A current detecting apparatus according to claim 2 where said n is "3" while the three conductors are disposed in three directions from the branch point on said flat plane such that an angle between the first conductor and the second conductor is 90°, an angle between the second conductor and the third conductor is 90° and an angle between the third conductor and the first conductor is 180°;

said m is "4" while the first electromagnetic transducer is disposed at the same distance from the first conductor and the second conductor and at the same distance from said branch point, the second electromagnetic transducer is disposed at the same distance from the second conductor and the third conductor and at the same distance from said branch point, the third electromagnetic transducer is disposed symmetrically with the second electromagnetic transducer with respect to the third conductor and at the same distance from said branch point, and the fourth electromagnetic transducer is disposed symmetrically with the first electromagnetic transducer with respect to the first conductor and at the same distance from said branch point;

said operation processing circuit detects a current flowing through said conductor by obtaining a difference of electric signal between the four electromagnetic transducers sandwiching each conductor.

6. A current detecting apparatus according to claim 2 wherein said n is "4" while the four conductors are disposed every 90° from the branch point on said flat plane in four direction;

said m is "4" while the four electromagnetic transducers are disposed at the same distance from adjacent two conductors and at the same distance from said branch point; and said operation processing circuit detects a current flowing through said conductor by obtaining a difference of electric signal among the four electromagnetic transducers sandwiching each conductor.

7. A current detecting apparatus according to claim 1 wherein said n conductors are disposed on three-dimensional axes perpendicular to each other with said branch point as a home position and said m electromagnetic transducers are disposed such that magnetism sensitive surfaces thereof exist on a flat plane including two axes of said three axes.

8. A current detecting apparatus according to claim 7 wherein said n is "3" while the three conductors are disposed in three directions of said three axes;

said m is "3" while the first electromagnetic transducer is disposed at the same distance from the first conductor and the second conductor existing on said flat plane and at the same distance from said branch point, the second electromagnetic transducer is disposed symmetrically with the first electromagnetic transducer with respect to the second conductor and at the same distance from said branch point and the third electromagnetic transducer is disposed symmetrically with the first electromagnetic transducer with respect to the first conductor and at the same distance from said branch point; and said operation processing circuit detects a current flowing through each conductor of the first-third conductor by obtaining a difference of electric signal between three electromagnetic transducers sandwiching each of the first conductor and the second conductor existing on said flat plane.

9. A current detecting apparatus according to claim 7 wherein said n is "4" while the four conductors are disposed on said three axes and a negative direction axis of one of said three axes;

said m is "4" while the first-fourth electromagnetic transducers are disposed on a flat plane including two axes of said three axes and said negative direction axes;

said first electromagnetic transducer and said second electromagnetic transducer are disposed at the same distance from the first conductor which is one of the first-third conductors existing on said flat plane and at the same distance from said branch point, the third electromagnetic transducer is disposed symmetrically with the second electromagnetic transducer with respect to the second conductor and at the same distance from said branch point, and the fourth electromagnetic transducer is disposed symmetrically with the third electromagnetic transducer with respect to the third conductor and at the same distance from said branch point; and said operation processing circuit detects a current flowing through each conductor of the first-fourth conductors by obtaining a difference of electric signal between the four electromagnetic transducers sandwiching each conductor of said first-third conductors existing on said flat plane.

10. A current detecting method comprising:
- disposing n conductors so as to be branched radially from a branch point;
- disposing m electromagnetic transducers between adjacent conductors of said n conductors; and
- detecting a current flowing through each of said n conductors based on an operating output obtained from a predetermined operation based on an electric signal from each of said m electromagnetic transducers, wherein
n: integer satisfying $n \geq 3$
m: integer satisfying $m \geq 2$.

11. A current detecting method according to claim 10 wherein said n conductors are disposed on a flat plane including said branch point and said m electromagnetic transducers are disposed such that a magnetism sensitive surface of each thereof exists on said flat plane.

12. A current detecting method according to claim 11 comprising:
- while said n is "3", disposing the three conductors every 120° from the branch point on said flat plane in three directions;
- while said m is "3", disposing the three electromagnetic transducers at the same distance from adjacent conductors and at the same distance from said branch point; and
- detecting a current flowing through the conductor by obtaining a difference of electric signal between the two electromagnetic transducers sandwiching each conductor.

13. A current detecting method according to claim 12 wherein said m electromagnetic transducers are disposed such that the magnetism sensitive surfaces thereof are directed in the same direction.

14. A current detecting method according to claim 11 comprising:
- while said n is "3", disposing the three conductors in three directions from the branch point on said flat plane such that an angle between the first conductor and the second conductor is 90°, an angle between the second conductor and the third conductor is 90° and an angle between the third conductor and the first conductor is 180°;
- while said m is "4", disposing the first electromagnetic transducer at the same distance from the first conductor and the second conductor and at the same distance from said branch point, disposing the second electromagnetic transducer at the same distance from the second conductor and the third conductor and at the same distance from said branch point, disposing the third electromagnetic transducer symmetrically with the second electromagnetic transducer with respect to the third conductor and at the same distance from said branch point, and disposing the fourth electromagnetic transducer symmetrically with the first electromagnetic transducer with respect to the first conductor and at the same distance from said branch point; and
- detecting a current flowing through said conductor by obtaining a difference of electric signal between the four electromagnetic transducers sandwiching each conductor.

15. A current detecting method according to claim 11 wherein
- said n is "4" while the four conductors are disposed every 90° from the branch point on said flat plane in four direction;
- said m is "4" while the four electromagnetic transducers are disposed at the same distance from adjacent two conductors and at the same distance from said branch point; and
- a current flowing through said conductor is detected by obtaining a difference of electric signal among the four electromagnetic transducers sandwiching each conductor.

16. A current detecting method according to claim 10 wherein said n conductors are disposed on three-dimensional axes perpendicular to each other with said branch point as a home position and said m electromagnetic transducers are disposed such that magnetism sensitive surfaces thereof exist on a flat plane including two axes of said three axes.

17. A current detecting method according to claim 16 wherein
- said n is "3" while the three conductors are disposed in three directions of said three axes;
- said m is "3" while the first electromagnetic transducer is disposed at the same distance from the first conductor and the second conductor existing on said flat plane and at the same distance from said branch point, the second electromagnetic transducer is disposed symmetrically with the first electromagnetic transducer with respect to the second conductor and at the same distance from said branch point and the third electromagnetic transducer is disposed symmetrically with the first electromagnetic transducer with respect to the first conductor and at the same distance from said branch point; and
- a current flowing through each conductor of the first-third conductor is detected by obtaining a difference of electric signal between three electromagnetic transducers sandwiching each of the first conductor and the second conductor existing on said flat plane.

18. A current detecting method according to claim 16 wherein
- said n is "4" while the four conductors are disposed on said three axes and a negative direction axis of one of said three axes;
- said m is "4" while the first-fourth electromagnetic transducers are disposed on a flat plane including two axes of said three axes and said negative direction axes;
- said first electromagnetic transducer and said second electromagnetic transducer are disposed at the same distance from the first conductor which is one of the first-third conductors existing on said flat plane and at the same distance from said branch point, the third electromagnetic transducer is disposed symmetrically with the second electromagnetic transducer with respect to the second conductor and at the same distance from said branch point, and the fourth electromagnetic transducer is disposed symmetrically with the third electromagnetic transducer with respect to the third conductor and at the same distance from said branch point; and
- a current flowing through each conductor of the first-fourth conductors is detected by obtaining a difference of electric signal between the four electromagnetic transducers sandwiching each conductor of said first-third conductors existing on said flat plane.

* * * * *